(12) United States Patent
Kato et al.

(10) Patent No.: US 10,230,147 B2
(45) Date of Patent: Mar. 12, 2019

(54) HIGH-FREQUENCY SIGNAL TRANSMISSION LINE AND ELECTRONIC APPARATUS INCLUDING THE SAME

(71) Applicant: Murata Manufacturing Co., Ltd., Nagaokakyo-shi, Kyoto-fu (JP)

(72) Inventors: Noboru Kato, Nagaokakyo (JP); Satoshi Ishino, Nagaokakyo (JP); Jun Sasaki, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/257,975

(22) Filed: Sep. 7, 2016

(65) Prior Publication Data

US 2016/0380325 A1    Dec. 29, 2016

Related U.S. Application Data

(63) Continuation of application No. 13/748,822, filed on Jan. 24, 2013, now Pat. No. 9,490,514.

(30) Foreign Application Priority Data

Feb. 14, 2012 (JP) ................................. 2012-029690
Apr. 23, 2012 (JP) ................................. 2012-097926

(Continued)

(51) Int. Cl.
*H01P 3/08*      (2006.01)
*H01P 5/02*      (2006.01)
(Continued)

(52) U.S. Cl.
CPC ................ *H01P 3/08* (2013.01); *H01P 3/082* (2013.01); *H01P 5/02* (2013.01); *H01P 5/028* (2013.01);
(Continued)

(58) Field of Classification Search
CPC .............. H01P 3/082; H01P 3/08; H03H 7/46
(Continued)

(56) References Cited

U.S. PATENT DOCUMENTS 6,713,162 B2 * 3/2004 Takaya ................. H03H 7/0115
                                                       333/184
2007/0085108 A1 * 4/2007 White ................... H01L 23/552
                                                       257/173

(Continued)

OTHER PUBLICATIONS

Kato et al., "High-Frequency Signal Transmission Line and Electronic Apparatus Including the Same", U.S. Appl. No. 13/748,822, filed Jan. 24, 2013.

*Primary Examiner* — Stephen E. Jones
*Assistant Examiner* — Samuel S Outten
(74) *Attorney, Agent, or Firm* — Keating & Bennett, LLP

(57) ABSTRACT

A high-frequency signal transmission line includes a body; a signal line including a first line portion provided to a first layer of the body, a second line portion provided to a second layer of the body alternately being connected; and a first ground conductor provided to the first layer or a third layer positioned on an opposite side of the second layer relative to the first layer, and also overlaid with a plurality of second line portions in planar view from a normal direction of a principal surface of the body, and also not overlaid with a plurality of the first line portions. A property impedance of the first line portion and a property impedance of the second line portion are different from each other.

6 Claims, 40 Drawing Sheets

(30) Foreign Application Priority Data

Jul. 27, 2012  (JP) .................................. 2012-167217
Nov. 14, 2012  (JP) .................................. 2012-250096

(51) Int. Cl.
*H03H 7/01* (2006.01)
*H05K 5/00* (2006.01)
*H01Q 13/26* (2006.01)

(52) U.S. Cl.
CPC ........... *H01Q 13/26* (2013.01); *H03H 7/0115* (2013.01); *H05K 5/0026* (2013.01)

(58) Field of Classification Search
USPC .......................................................... 333/33
See application file for complete search history.

(56) References Cited

U.S. PATENT DOCUMENTS

2007/0090894 A1* 4/2007 Phan ...................... H05K 1/148
                                                                  333/33
2008/0042777 A1* 2/2008 Lee ...................... H04B 1/0064
                                                                  333/132

* cited by examiner

FIG. 46
PRIOR ART
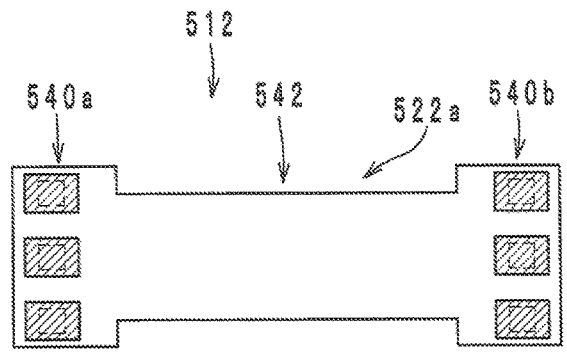
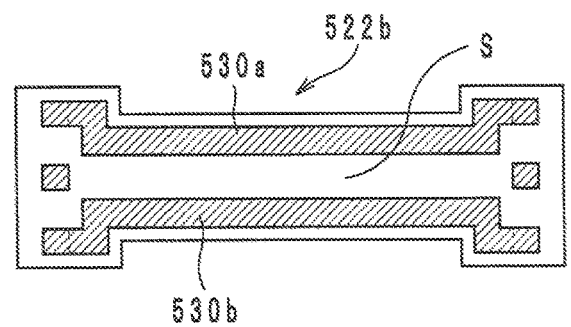
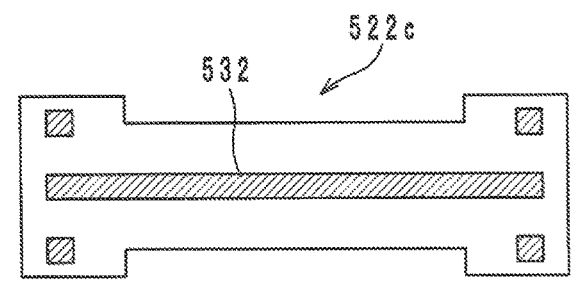
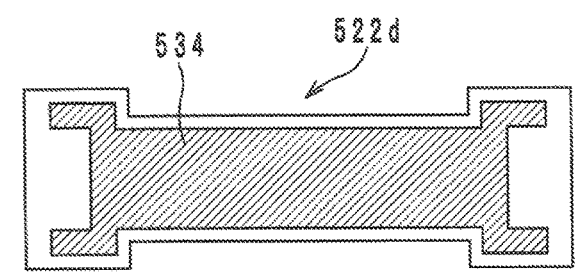
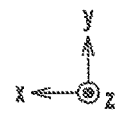

HIGH-FREQUENCY SIGNAL TRANSMISSION LINE AND ELECTRONIC APPARATUS INCLUDING THE SAME

BACKGROUND OF THE INVENTION

1. Field of the Invention

The present invention relates to a high-frequency signal transmission line and an electronic apparatus including the same, and specifically relates to a high-frequency signal transmission line used for transmission of high-frequency signals, and an electronic apparatus including the same.

2. Description of the Related Art

A conventional high-frequency signal transmission line is disclosed in PCT Publication No. 2011/018934, for example. FIG. 46 is an exploded view of a signal line 500 disclosed in PCT Publication No. 2011/018934.

The signal line 500 illustrated in FIG. 46 includes a body 512, ground conductors 530a, 530b, and 534 and a signal line 532. The body 512 is configured of insulating sheets 522a to 522d being laminated in this order.

The signal line 532 is provided on the insulating sheet 522c. The ground conductors 530a and 530b are provided on the insulating sheet 522b. The ground conductors 530a and 530b face each other via a slit S. The slit S is overlaid with the signal line 532 in planar view from the laminating direction. Accordingly, the ground conductors 530a and 530b do not face the signal line 532.

The ground conductor 534 is provided on the insulating sheet 522d, and faces the signal line 532 via the insulating sheet 522c.

With the signal line 500 thus configured, the ground conductors 530a and 530b do not face the signal line 532, and accordingly, less capacitance is generated between the ground conductors 530a and 530b and the signal line 532. Therefore, even when reducing an interval in the laminating direction between the ground conductors 530a and 530b and the signal line 532, capacitance generated between these elements is suppressed greatly, and the property impedance of the signal line 532 is prevented from deviating from desired property impedance. As a result thereof, with the signal line 500, reduction in the thickness of the body 512 may be realized.

However, with the signal line 500 disclosed in PCT Publication No. 2011/018934, as will be described below, relatively low-frequency noise readily occurs. Hereinafter, both ends of the signal line 500 will be taken as end portions 540a and 540b, and a portion between the end portions 540a and 540b of the signal line 500 will be taken as a line portion 542.

The signal line 500 has, as illustrated in FIG. 46, an even cross-sectional configuration at the line portion 542. Therefore, the property impedance of the signal line 532 at the line portion 542 is even. On the other hand, the end portions 540a and 540b are inserted into a socket of a circuit board, for example. At this time, a terminal within the socket and both ends of the signal line 532 are connected, and accordingly, parasitic impedance occurs at a connection portion of these elements. Further, the signal line 532 at the end portions 540a and 540b faces a conductor within the socket, and accordingly, parasitic capacitance is generated between the signal line 532 at the end portions 540a and 540b and the conductor within the socket of the circuit board. As a result thereof, the property impedance of the signal line 532 at the end portions 540a and 540b differs from the property impedance of the signal line 532 at the line portion 542.

Here, in the event that the property impedance of the signal line 532 at the end portions 540a and 540b differs from the property impedance of the signal line 532 at the line portion 542, reflection of a high-frequency signal occurs at the end portions 540a and 540b. Thus, standing waves, which have a lower frequency with a ½ wavelength distance between the end portions 540a and 540b, are generated. As a result thereof, low-frequency noise radiates from the signal line 500.

SUMMARY OF THE INVENTION

It has been discovered to be desirable to provide a high-frequency signal transmission line that is capable of significantly reducing and preventing the occurrence of low-frequency noise, and an electronic apparatus including such a high-frequency signal transmission line.

A high-frequency signal transmission line according to a preferred embodiment of the present invention includes a body; a signal line including a first line portion provided to a first layer of the body and a second line portion provided to a second layer of the body being alternately connected; and a first ground conductor provided to the first layer or a third layer positioned on an opposite side of the second layer with respect to the first layer, and also overlaid with a plurality of second line portions in planar view from a normal direction of a principal surface of the body, and also not overlaid with a plurality of the first line portions; wherein a property impedance of the first line portion and a property impedance of the second line portion are different from each other.

An electronic apparatus according to a preferred embodiment of the present invention includes a casing; and a high-frequency signal transmission line provided within the casing; the high-frequency signal transmission line including a body, a signal line including a first line portion provided to a first layer of the body and a second line portion provided to a second layer of the body being alternately connected, and a first ground conductor provided to the first layer or a third layer positioned on an opposite side of the second layer with respect to the first layer, and also overlaid with a plurality of second line portions in planar view from a normal direction of a principal surface of the body, and also not overlaid with a plurality of the first line portions; wherein a property impedance of the first line portion and a property impedance of the second line portion are different from each other.

According to various preferred embodiments of the present invention, occurrence of low-frequency noise is significantly reduced and prevented.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 46 is an exploded view of a signal line disclosed in PCT Publication No. 2011/018934.

DETAILED DESCRIPTION OF THE PREFERRED EMBODIMENTS

Hereinafter, a high-frequency signal transmission line according to preferred embodiments of the present invention and an electronic apparatus including such a high-frequency signal transmission line will be described with reference to drawings.

First Preferred Embodiment

Figure 1A:
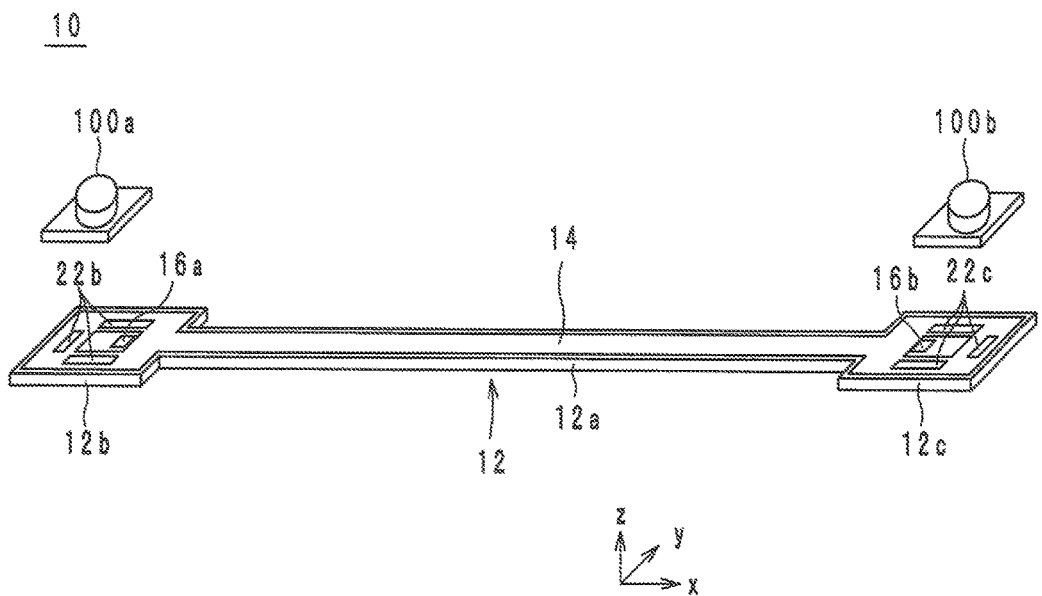
FIGS. 1A and 1B are external perspective views of a high-frequency signal transmission line according to a first preferred embodiment of the present invention.
Figure 1B:
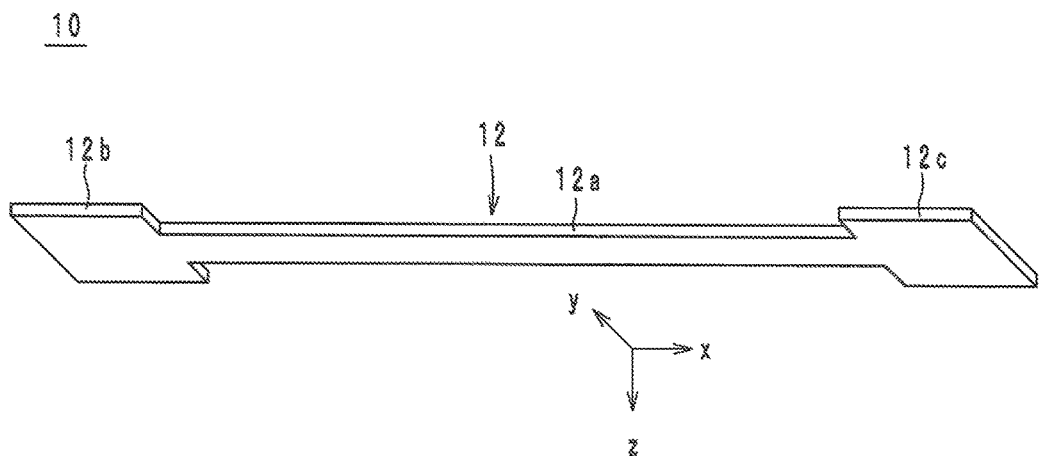
Figure 2:
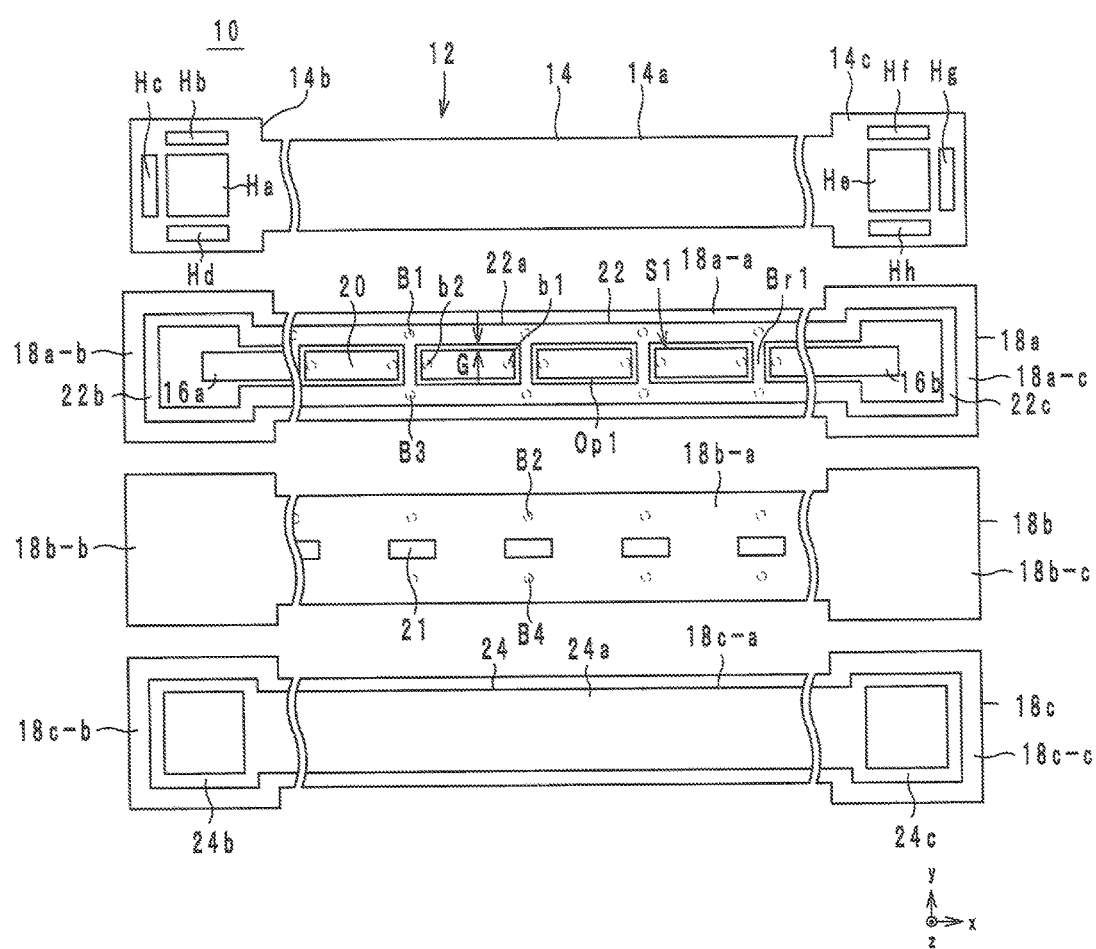
FIG. 2 is an exploded view of the high-frequency signal transmission line according to the first preferred embodiment of the present invention.
Figure 3:
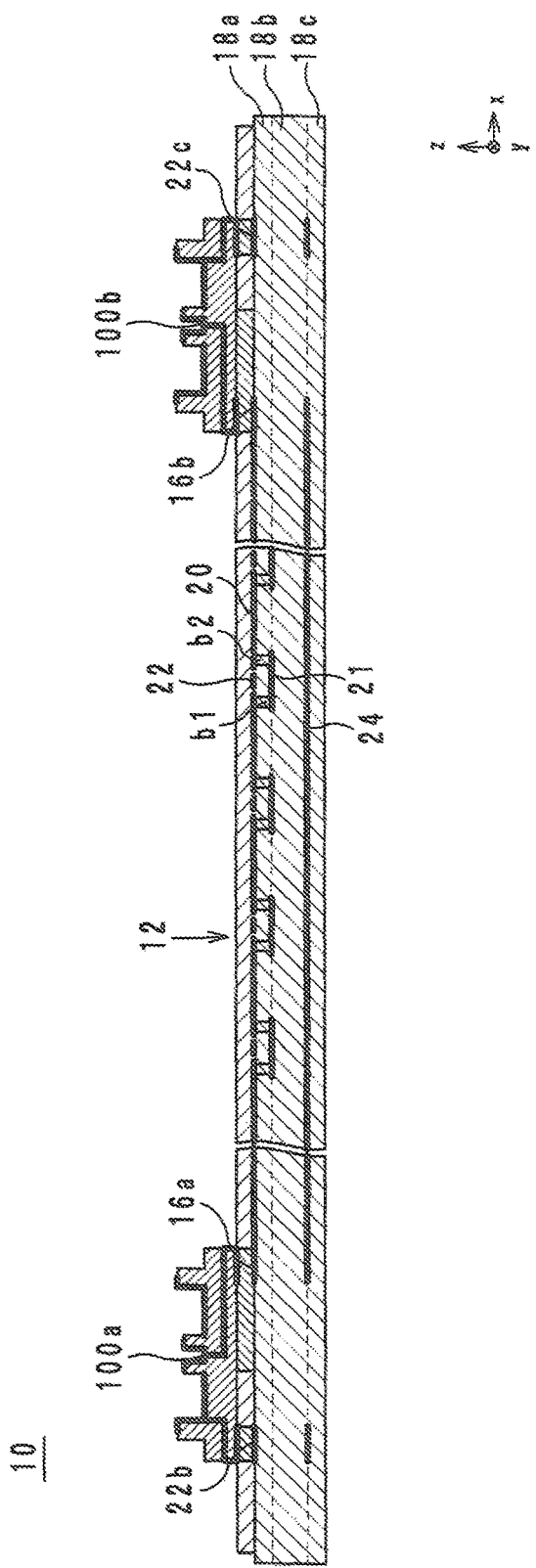
FIG. 3 is a cross-sectional configuration diagram of the high-frequency signal transmission line according to the first preferred embodiment of the present invention.
Figure 4:
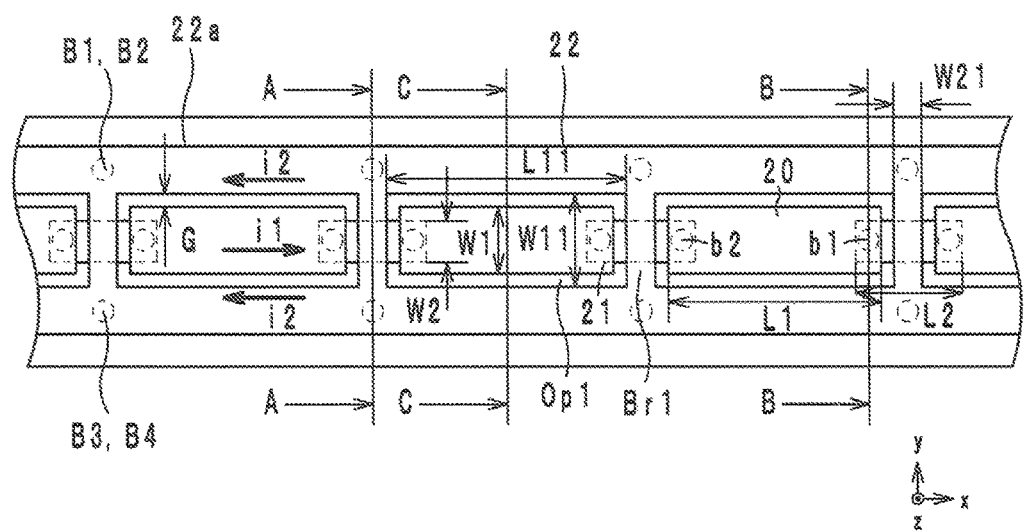
FIG. 4 is a planar view of the high-frequency signal transmission line according to the first preferred embodiment of the present invention.
Figure 5A:
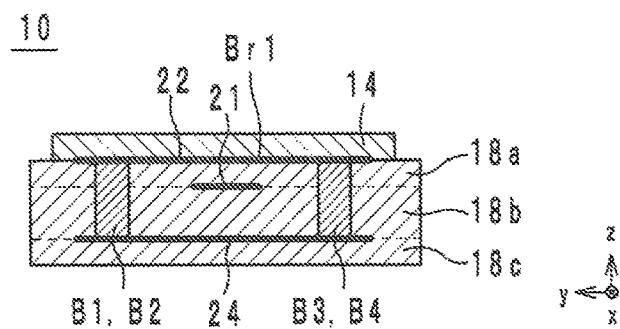
FIGS. 5A to 5C are cross-sectional configuration diagrams of the high-frequency signal transmission line according to the first preferred embodiment of the present invention.
Figure 5B:
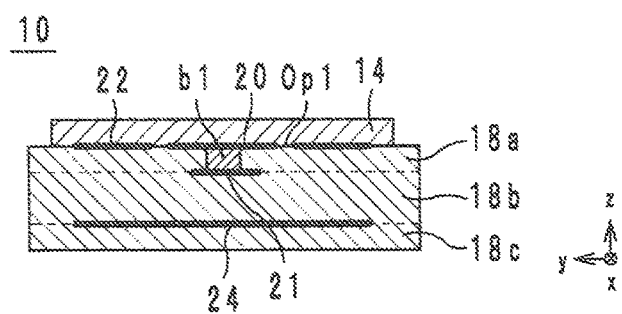
Figure 5C:
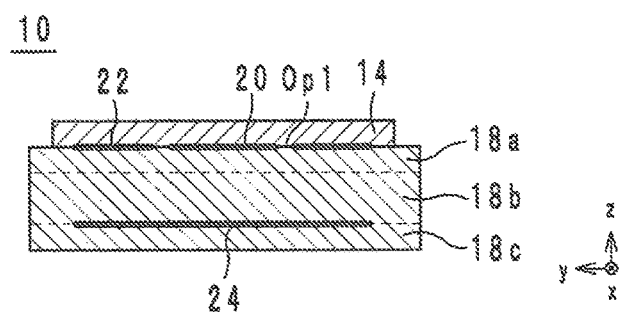

Hereinafter, a configuration of a high-frequency signal transmission line according to a first preferred embodiment of the present invention will be described with reference to drawings. FIGS. 1A and 1B are external perspective views of a high-frequency signal transmission line 10 according to the first preferred embodiment. FIG. 2 is an exploded view of the high-frequency signal transmission line 10 according to the first preferred embodiment. FIG. 3 is a cross-sectional configuration diagram of the high-frequency signal transmission line 10 according to the first preferred embodiment. FIG. 4 is a planar view of the high-frequency signal transmission line 10 according to the first preferred embodiment. FIGS. 5A to 5C are cross-sectional views of the high-frequency signal transmission line 10 according to the first preferred embodiment. FIG. 5A is a cross-sectional configuration diagram at A-A in FIG. 4. FIG. 5B is a cross-sectional configuration diagram at B-B in FIG. 4. FIG. 5C is a cross-sectional configuration diagram at C-C in FIG. 4. In FIGS. 1A to 5C, a laminating direction of the high-frequency signal transmission line 10 is defined as the z axis direction. Also, a longitudinal direction of the high-frequency signal transmission line 10 is defined as the x axis direction, and a direction orthogonal to the x axis direction and z axis direction is defined as the y axis direction.

The high-frequency signal transmission line 10 preferably includes, as illustrated in FIGS. 1A to 3, a dielectric element body (body) 12, a signal line S1, ground conductors 22 and 24, connectors 100a and 100b, and via hole conductors B1 to B4.

In planar view from the z axis direction, the dielectric element body 12 extends in the x axis direction, and includes line portions 12a and connection portions 12b and 12c. The dielectric element body 12 is, as illustrated in FIG. 2, a flexible laminate including a protection layer 14 and dielectric sheets (insulator layers) 18 (18a to 18c) being laminated from the positive direction side to the negative direction side of the z axis direction in this order. Hereinafter, a principal surface on the positive direction side of the z axis direction of the dielectric element body 12 will be referred to as a surface, and a principal surface on the negative direction side of the z axis direction of the dielectric element body 12 will be referred to as a rear surface.

The line portion 12a extends in the x axis direction. The connection portion 12b is connected to the end portion on the negative direction side in the x axis direction of the line portion 12a, and preferably has a rectangular or substantially rectangular shape. The connection portion 12c is connected to the end portion on the positive direction side in the x axis direction of the line portion 12a, and preferably has a rectangular or substantially rectangular shape. The widths in the y axis direction of the connection portions 12b and 12c are greater than the width in the y axis direction of the line portion 12a.

In planar view from the z axis direction, the dielectric sheets 18 extend in the x axis direction, and preferably have the same or substantially the same shape as the dielectric element body 12. The dielectric sheets 18 are preferably made of a thermoplastic resin having flexibility such as polyimide, liquid crystal polymer, or other suitable material, for example. The thicknesses of the dielectric sheets 18a and 18c after laminating preferably are about 50 μm, for example, and the thickness of the dielectric sheet 18b after laminating preferably is about 150 μm, for example. Hereinafter, the principal surfaces on the positive direction side in the z axis direction of the dielectric sheets 18 will be referred to as surfaces, and the principal surfaces on the negative direction side in the z axis direction of the dielectric sheets 18 will be referred to as rear surfaces.

Also, the dielectric sheet 18a preferably includes a line portion 18a-a and connection portions 18a-b and 18a-c. The dielectric sheet 18b preferably includes a line portion 18b-a and connection portions 18b-b and 18b-c. The dielectric sheet 18c preferably includes a line portion 18c-a and connection portions 18c-b and 18c-c. The line portions 18a-a, 18b-a, and 18c-a define the line portion 12a. The connection portions 18a-b, 18b-b, and 18c-b define the connection portion 12b. The connection portions 18a-c, 18b-c, and 18c-c define the connection portion 12c.

The signal line S1 is, as illustrated in FIG. 2, a linear conductor provided within the dielectric element body 12, and extends in the x axis direction. The signal line S1 preferably includes line portions 20 and 21 and via hole conductors (inter-layer connection conductors) b1 and b2.

The line portions 20 and 21 are provided to different layers (the first layer and second layer) of the dielectric element body 12. Specifically, the line portion 20 is provided to the surface (first layer) of the dielectric sheet 18a, and the line portion 21 is provided to the surface (second layer) of the dielectric sheet 18b.

The line portion 20 is, as illustrated in FIGS. 2 to 4, provided to the surface of the line portion 18a-a of the dielectric sheet 18a, and preferably is a rectangular or substantially rectangular conductor aligned in the x axis direction with an equal interval. The line portion 21 is provided to the surface of the line portion 18b-a of the dielectric sheet 18b, and preferably is a rectangular or substantially rectangular conductor aligned in the x axis direction with an equal interval. However, the line portions 20 and 21 are disposed in a manner shifted in the x axis direction. The end portion on the positive direction side in the x axis direction of the line portion 20 is, in planar view from the z axis direction, overlaid with the end portion on the negative direction side in the x axis direction of the line portion 21. The end portion on the negative direction side in the x axis direction of the line portion 20 is, in planar view from the z axis direction, overlaid with the end portion on the positive direction side in the x axis direction of the line portion 21.

Also, the end portion on the negative direction side in the x axis direction of the line portion 20 positioned the farthest on the negative direction side in the x axis direction is positioned in the center of the surface of the connection portion 18a-b. Similarly, the end portion on the positive direction side in the x axis direction of the line portion 20 positioned the farthest on the positive direction side in the x axis direction is positioned in the center of the surface of the connection portion 18a-c. Each of the end portion on the negative direction side in the x axis direction of the line portion 20 positioned the farthest on the negative direction side in the x axis direction, and the end portion on the positive direction side in the x axis direction of the line portion 20 positioned the farthest on the positive direction side in the x axis direction is preferably used as an external terminal. Hereinafter, the end portion on the negative direction side in the x axis direction of the line portion 20 positioned the farthest on the negative direction side in the x axis direction, and the end portion on the positive direction side in the x axis direction of the line portion 20 positioned the farthest on the positive direction side in the x axis direction will be referred to as external terminals 16a and 16b, respectively. The surfaces of the external terminals 16a and 16b preferably have been subjected to gold plating.

Also, width (line width) W1 in the y axis direction of the line portion 20 is, as illustrated in FIG. 4, wider than width (line width) W2 in the y axis direction of the line portion 21. Also, length L1 in the x axis direction of the line portion 20 is longer than length L2 in the x axis direction of the line portion 21. Further, the length L1 of the line portion 20 and the length L2 of the line portion 21 are shorter than ½ wavelength of a high-frequency signal to be transmitted within the signal line S1. The line portions 20 and 21 as described above are preferably manufactured of a metal material having small specific resistance with silver or copper as a principal component, for example.

The via hole conductor b1 connects the surface of the dielectric sheet 18a and the surface of the dielectric sheet 18b by passing through the dielectric sheet 18a in the z axis direction. The end portion on the positive direction side in the z axis direction of the via hole conductor b1 is connected to the end portion on the positive direction side in the x axis direction of the line portion 20. The end portion on the negative direction side in the z axis direction of the via hole conductor b1 is connected to the end portion on the negative direction side in the x axis direction of the line portion 21.

The via hole conductor b2 connects the surface of the dielectric sheet 18a and the surface of the dielectric sheet 18b by passing through the dielectric sheet 18a in the z axis direction. The end portion on the positive direction side in the z axis direction of the via hole conductor b2 is connected to the end portion on the negative direction side in the x axis direction of the line portion 20. The end portion on the negative direction side in the z axis direction of the via hole conductor b2 is connected to the end portion on the positive direction side in the x axis direction of the line portion 21. The via hole conductors b1 and b2 are preferably manufactured of a metal material having small specific resistance with silver or copper as a principal component, for example. Note that through holes, where a conductor layer such as plating or the like is provided in the inner surfaces thereof, may be used instead of the via hole conductors b1 and b2, for example.

As described above, with the signal line S1, the line portions 20 and 21 are alternately connected by the via hole conductors b1 and b2. Thus, the signal line S1 has, as illustrated in FIG. 3, a zigzag shape which advances in the x axis direction while vibrating in the z axis direction in planar view from the y axis direction.

The ground conductor 22 (first ground conductor) is, as illustrated in FIGS. 2 and 3, provided to the surface of the dielectric sheet 18a where the line portion 20 is provided, and in planar view from the z axis direction (the normal direction of the dielectric element body 12), is overlaid with the multiple line portions 21, and also not overlaid with the multiple line portions 20. The ground conductor 22 is preferably manufactured of a metal material having small specific resistance with silver or copper as a principal component. Hereinafter, the ground conductor 22 will be described in more detail.

The ground conductor 22 preferably includes, as illustrated in FIG. 2, a line portion 22a and terminal portions 22b and 22c. The line portion 22a is provided to the surface of the line portion 18a-a, and extends in the x axis direction. Multiple opening portions Op1 aligned in the x axis direction are provided to the line portion 22a. No ground conductor 22 is provided within the opening portions Op1. However, the line portion 20 is provided within the opening portions Op1. Thus, the line portion 20 is surrounded by the ground conductor in a state of being insulated from the ground conductor 22. Accordingly, the ground conductor 22 is not overlaid with the line portion 20 in planar view from the z axis direction. Also, lengths L11 in the x axis direction (direction along the line portion 20) of the opening portions Op1 are, as illustrated in FIG. 4, longer than the widths W11 in the y axis direction of the opening portions Op1.

A bridge portion Br1 which extends in the y axis direction is provided between the opening portions Op1 adjacent to the x axis direction. Thus, with the line portion 22a, the opening portions Op1 and bridge portions Br1 are alternately arrayed in the x axis direction. The bridge portions Br1 are, as illustrated in FIG. 5A, overlaid with the line portion 21 in planar view from the z axis direction. The line portion 22a as described above preferably has a ladder shape as illustrated in FIGS. 2 and 4.

The terminal portion 22b is, as illustrated in FIG. 2, provided to the surface of the connection portion 18a-b, and defines a rectangular or substantially rectangular frame which surrounds an external terminal 16a. The terminal portion 22b is connected to the end portion on the negative direction side in the x axis direction of the line portion 22a. The terminal portion 22c is provided to the surface of the connection portion 18a-c, and defines a rectangular or substantially rectangular frame which surrounds an external terminal 16b. The terminal portion 22c is connected to the end portion on the positive direction side in the x axis direction of the line portion 22a.

The ground conductor 24 (second ground conductor) is, as illustrated in FIGS. 2 and 3, provided to the surface of the dielectric sheet 18c (fourth layer), and in planar view from the z axis direction (the normal direction of the dielectric element body 12), is overlaid with the multiple line portions 20 and 21 as illustrated in FIGS. 5A to 5C. The ground conductor 24 is preferably manufactured of a metal material having small specific resistance with silver or copper as a principal component. Hereinafter, the ground conductor 24 will be described in more detail.

The ground conductor 24 preferably includes, as illustrated in FIG. 2, a line portion 24a and terminal portions 24b and 24c. The line portion 24a is provided to the surface of the line portion 18c-a, and extends in the x axis direction. The line portion 24a is a solid conductor where no opening portion is provided. Thus, the line portion 24a is, in planar view from the z axis direction, overlaid with the line portions 20 and 21.

The terminal portion 24b is provided to the surface of the connection portion 18c-b, and defines a rectangular or substantially rectangular ring which surrounds the center of the connection portion 18c-b. The terminal portion 24b is connected to the end portion on the negative direction side in the x axis direction of the line portion 24a.

The terminal portion 24c is provided to the surface of the connection portion 18c-c, and defines a rectangular or substantially rectangular ring which surrounds the center of the connection portion 18c-c. The terminal portion 24c is connected to the end portion on the positive direction side in the x axis direction of the line portion 24a.

Via hole conductors B1 pass through the line portion 18a-a of the dielectric sheet 18a in the z axis direction, and the multiple via hole conductors B1 are aligned in the x axis direction on the positive direction side in the y axis direction from the signal line S1. The end portions on the positive direction side in the z axis direction of the via hole conductors B1 are connected to a portion on the positive direction side in the y axis direction from the bridge portions Br1 at the line portion 22a.

Via hole conductors B2 pass through the line portion 18b-a of the dielectric sheet 18b in the z axis direction, and the multiple via hole conductors B2 are aligned in the x axis direction on the positive direction side in the y axis direction from the signal line S1. The end portions on the negative direction side in the z axis direction of the via hole conductors B2 are connected to the line portion 24a.

The via hole conductors B1 and B2 as described above make up one via hole conductor by mutually being connected, and connect the ground conductors 22 and 24.

Via hole conductors B3 pass through the line portion 18a-a of the dielectric sheet 18a in the z axis direction, and the multiple via hole conductors B3 are aligned in the x axis direction on the negative direction side in the y axis direction from the signal line S1. The end portions on the positive direction side in the z axis direction of the via hole conductors B3 are connected to a portion on the negative direction side in the y axis direction from the bridge portions Br1 at the line portion 22a.

Via hole conductors B4 pass through the line portion 18b-a of the dielectric sheet 18b in the z axis direction, and the multiple via hole conductors B4 are aligned in the x axis direction on the negative direction side in the y axis direction from the signal line S1. The end portions on the negative direction side in the z axis direction of the via hole conductors B4 are connected to the line portion 24a.

The via hole conductors B3 and B4 as described above make up one via hole conductor by mutually being connected, and connect the ground conductors 22 and 24.

As described above, with the signal line S1 and ground conductors 22 and 24, as illustrated in FIGS. 5A and 5B, an interval between the ground conductor 22 and the line portion 21 is smaller than an interval between the ground conductor 24 and the line portion 21. Specifically, the interval between the ground conductor 22 and the line portion 21 is generally equal to the thickness of the dielectric sheet 18a, and preferably is about 10 μm to about 100 μm, for example. With the present preferred embodiment, the interval between the line portion 21 and the ground conductor 22 preferably is about 50 μm, for example. On the other hand, the interval between the line portion 21 and the ground conductor 24 preferably is generally equal to the thickness of the dielectric sheet 18b, and preferably is about 50 μm to about 300 μm, for example. With the present preferred embodiment, the interval between the line portion and the ground conductor 24 preferably is about 150 μm, for example. That is to say, the thickness of the dielectric sheet 18b is designed so as to be thicker than the thickness of the dielectric sheet 18a. Also, the widths in the y axis direction of the ground conductors 22 and 24 preferably are about 800 μm, for example.

The protection layer 14 covers generally the entire surface of the dielectric sheet 18a. Thus, the protection layer 14 covers the ground conductor 22. The protection layer 14 is preferably made up of a flexible resin such as a resist material or other suitable material, for example.

Also, the protection layer 14 preferably includes, as illustrated in FIG. 2, a line portion 14a and connection portions 14b and 14c. The line portion 14a covers the entire surface of the line portion 18a-a, thereby covering the line portion 22a.

The connection portion 14b is connected to the end portion on the negative direction side in the x axis direction of the line portion 14a, and covers the surface of the connection portion 18a-b. However, openings Ha to Hd are provided to the connection portion 14b. The opening Ha preferably is a rectangular or substantially rectangular opening provided to generally the center of the connection portion 14b. The external terminal 16a is externally exposed via the opening Ha. Also, the opening Hb preferably is a rectangular or substantially rectangular opening provided to the positive direction side in the y axis direction of the opening Ha. The opening Hc preferably is a rectangular or substantially rectangular opening provided to the negative direction side in the x axis direction of the opening Ha. The opening Hd preferably is a rectangular or substantially rectangular opening provided to the negative direction side in the y axis direction of the opening Ha. The terminal portion 22b is externally exposed via the openings Hb to Hd so as to define and function as an external terminal.

The connection portion 14c is connected to the end portion on the positive direction side in the x axis direction of the line portion 14a, and covers the surface of the connection portion 18a-c. However, openings He to Hh are provided to the connection portion 14c. The opening He preferably is a rectangular or substantially rectangular opening provided to generally the center of the connection portion 14c. The external terminal 16b is externally exposed via the opening He. Also, the opening Hf preferably is a rectangular or substantially rectangular opening provided to the positive direction side in the y axis direction of the opening He. The opening Hg preferably is a rectangular or substantially rectangular opening provided to the positive direction side in the x axis direction of the opening He. The opening Hh preferably is a rectangular or substantially rectangular opening provided to the negative direction side in the y axis direction of the opening He. The terminal portion 22c is externally exposed via the openings Hf to Hh so as to define and function as an external terminal.

Figure 6A:
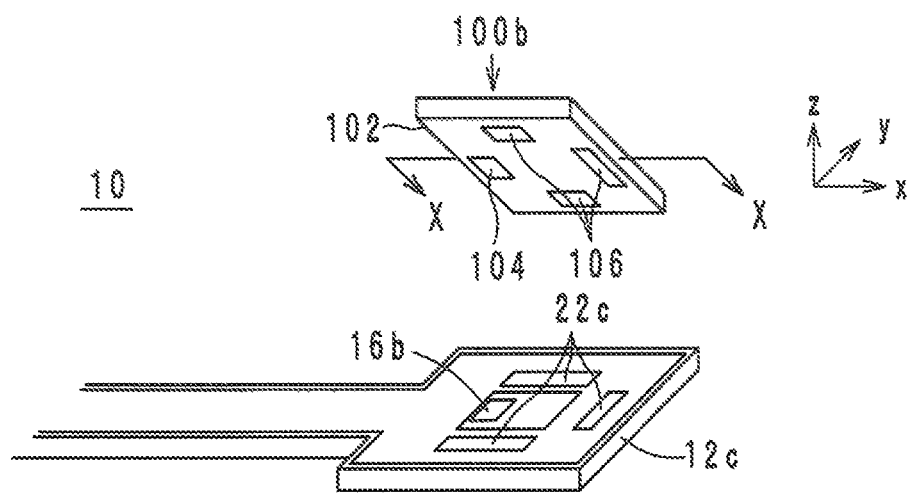
FIGS. 6A and 6B are an external perspective view and a cross-sectional configuration diagram of a connector of a high-frequency signal transmission line.
Figure 6B:
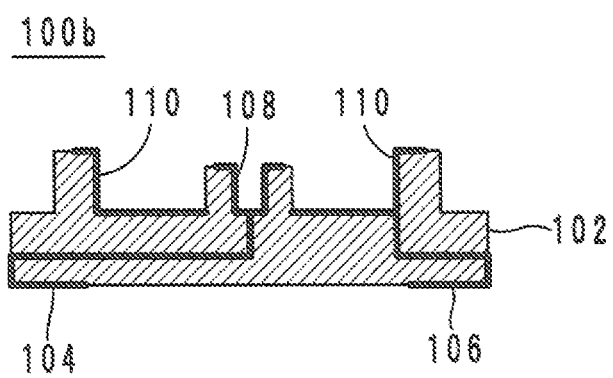

The connectors 100a and 100b are mounted on the surfaces of the connection portions 12b and 12c, respectively, and electrically connected to the signal line S1 and ground conductors 22 and 24. The configurations of the connectors 100a and 100b are preferably the same or substantially the same, and accordingly, description will be made with the configuration of the connector 100b as an example. FIGS. 6A and 6B are an external perspective view and a cross-sectional configuration diagram of the connector 100b of the high-frequency signal transmission line 10.

The connector 100b preferably includes, as illustrated in FIGS. 1A, 1B, 6A, and 6B, a connector body 102, external terminals 104 and 106, a center conductor 108, and an external conductor 110. The connector body 102 has a shape preferably defined by a cylinder connected to a rectangular or substantially rectangular plate, and is preferably made of an insulating material such as a resin or other suitable material, for example.

The external terminal 104 is provided to a position facing the external terminal 16b on a surface on the negative direction side in the z axis direction of the connector body 102. The external terminal 106 is provided to a position corresponding to the terminal portion 22c exposed via the openings Hf to Hh on a surface on the negative direction side in the z axis direction of the connector body 102.

The center conductor 108 is provided to the center of the cylinder of the connector body 102, and is connected to the external terminal 104. The center conductor 108 is a signal terminal where a high-frequency signal is input or output. The external conductor 110 is provided to the inner circumferential surface of the cylinder of the connector body 102, and is connected to the external terminal 106. The external conductor 110 is a ground terminal to be maintained at ground potential.

The connector 100b thus configured is mounted on the surface of the connection portion 12c so that the external terminal 104 is connected to the external terminal 16b, and the external terminal 106 is connected to the terminal portion 22c. Thus, the signal line S1 is electrically connected to the center conductor 108. Also, the ground conductors 22 and 24 are electrically connected to the external conductor 110.

With the high-frequency signal transmission line 10 thus configured, property impedance Z1 of the line portion 20 and property impedance Z2 of the line portion 21 differ. More specifically, the line portion 20 is provided within the opening portions Op1 of the ground conductor 22, and accordingly, capacitance is hardly generated with the ground conductor 22. On the other hand, the line portion 21 is, in planar view from the z axis direction, overlaid with the ground conductor 22, and accordingly, capacitance is generated with the ground conductor 22. Accordingly, capacitance generated between the line portion 21 and the ground conductor 22 is greater than capacitance generated between the line portion 20 and the ground conductor 22.

Also, the line portion 20 is provided to a position farther away from the ground conductor 24 than the line portion 21. Therefore, capacitance generated between the line portion 21 and the ground conductor 24 is greater than capacitance generated between the line portion 20 and the ground conductor 24.

Thus, the magnitude of capacitance generated between the line portion 21 and the ground conductors 22 and 24 is greater than the magnitude of capacitance generated between the line portion 20 and the ground conductors 22 and 24. Therefore, the property impedance Z2 of the line portion 21 is lower than the property impedance Z1 of the line portion 20. The property impedance Z1 preferably is, for example, about 70Ω, and the property impedance Z2 preferably is, for example, about 30Ω. Also, the entire property impedance of the signal line S1 preferably is, for example, about 50Ω.

Also, with the high-frequency signal transmission line 10, property impedance Z3 of both ends (i.e., external terminals 16a and 16b) of the signal line S1 has a magnitude between the property impedance Z1 of the line portion 20 and the property impedance Z2 of the line portion 21.

Figure 7A:
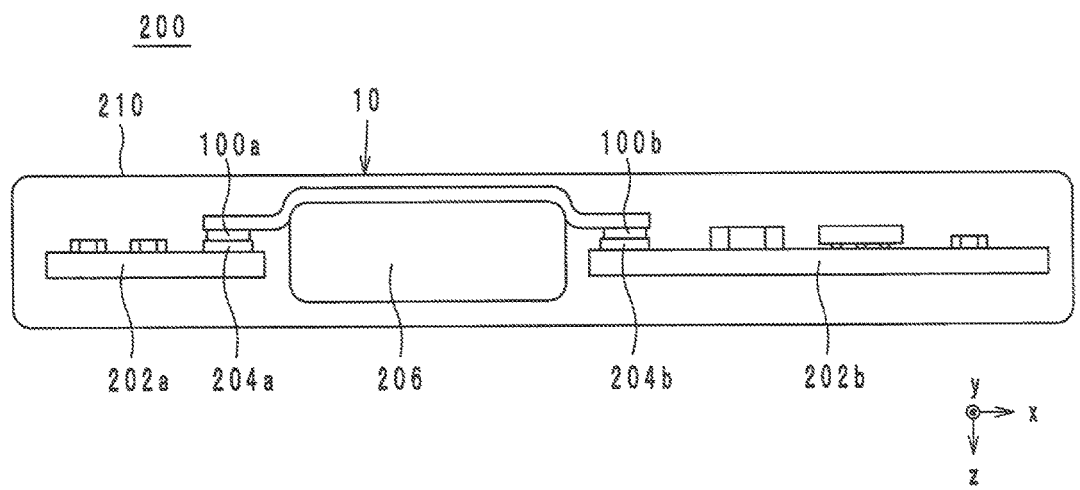
FIGS. 7A and 7B are diagrams of an electronic apparatus including a high-frequency signal transmission line in planar view from the y axis direction and z axis direction.
Figure 7B:
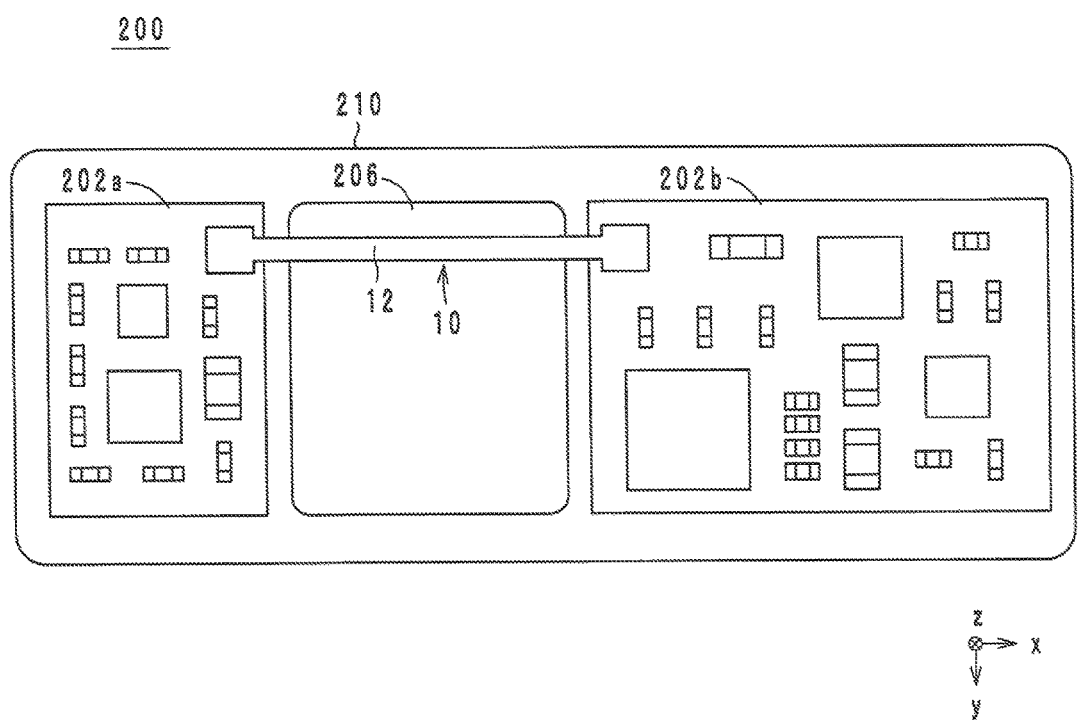

The high-frequency signal transmission line 10 is preferably used as described below. FIGS. 7A and 7B are diagrams of an electronic apparatus 200 including the high-frequency signal transmission line 10 in planar view from the y axis direction and z axis direction.

The electronic apparatus 200 preferably includes the high-frequency signal transmission line 10, circuit boards 202a and 202b, receptacles 204a and 204b, a battery pack (metallic body) 206, and a casing 210.

The casing 210 houses the high-frequency signal transmission line 10, circuit boards 202a and 202b, receptacles 204a and 204b, and battery pack 206. A transmission circuit or reception circuit including an antenna is provided to the circuit board 202a, for example. A power supply circuit is provided to the circuit board 202b, for example. The battery pack 206 is, for example, a lithium ion secondary battery, and has a configuration where the surface thereof is covered with a metal cover. The circuit board 202a, battery pack 206, and circuit board 202b are arrayed from the negative direction side to the positive direction side in the x axis direction in this order.

The receptacles 204a and 204b are provided on the principal surfaces on the negative direction side in the z axis direction of the circuit boards 202a and 202b, respectively. The connectors 100a and 100b are connected to the receptacles 204a and 204b, respectively. Thus, a high-frequency signal having a frequency of 2 GHz to be transmitted between the circuit boards 204a and 204b is applied to the center conductors 108 of the connectors 100a and 100b via the receptacles 204a and 204b, respectively. Also, the external conductors 110 of the connectors 100a and 100b are kept at ground potential via the circuit boards 202a and 202b and receptacles 204a and 204b. Thus, the high-frequency signal transmission line 10 connects between the circuit boards 202a and 202b.

Also, the surface (more accurately, the protection layer 14) of the dielectric element body 12 is, as illustrated in FIGS. 7A and 7B, in contact with the battery pack 206. The dielectric element body 12 and battery pack 206 are fixed preferably by an adhesive agent or other suitable material or element.

Hereinafter, a non-limiting example of a manufacturing method for the high-frequency signal transmission line 10 will be described with reference to FIG. 2. Hereinafter, a case where the single high-frequency signal transmission line 10 is manufactured will be described as an example, but in reality, the multiple high-frequency signal transmission lines 10 are manufactured simultaneously by large-sized dielectric sheets being laminated and cut.

First, a dielectric sheet 18 made up of a thermoplastic resin where copper foil is formed on the entire surface is prepared. The surface of the copper foil of the dielectric sheet 18 is smoothed by being subjected to galvanizing for anticorrosion, for example. The thickness of the copper foil preferably is about 10 μm to about 20 μm, for example.

Next, according to a photolithography process, the line portion 20 and ground conductor 22 illustrated in FIG. 2 are formed on the surface of the dielectric sheet 18a. Specifically, resists having the same shapes as the line portion 20 and ground conductor 22 illustrated in FIG. 2 are printed on the copper foil of the dielectric sheet 18a. Next, the copper foil is subjected to etching, thereby removing copper foil of a portion not covered by the resists. Thereafter, the resists are removed. Thus, as illustrated in FIG. 2, the line portion 20 and ground conductor 22 are formed on the surface of the dielectric sheet 18a.

Next, according to a photolithography process, the line portion 21 illustrated in FIG. 2 is formed on the surface of the dielectric sheet 18b. According to a photolithography process, the ground conductor 24 illustrated in FIG. 2 is formed on the surface of the dielectric sheet 18c. Note that this photolithographic process is the same as the photolithographic process for forming the line portion 20 and ground conductor 22, and accordingly, description will be omitted.

Next, a laser beam is irradiated on positions where the via hole conductors B1 to B4, b1, and b2 of the dielectric sheets 18a and 18b are formed, from the rear surface side to form though holes. Thereafter, the through holes formed in the dielectric sheets 18a and 18b are filled with electro-conductive paste.

Next, the dielectric sheets 18a to 18c are laminated from the positive direction side to the negative direction side in the z axis direction in this order. Next, heat and pressure are applied to the dielectric sheets 18a to 18c from the positive direction side and negative direction side in the z axis direction, thereby softening the dielectric sheets 18a to 18c to be subjected to pressure bonding for integration, and also solidifying the electro-conductive paste filled in the through holes to form the via conductors B1 to B4, b1, and b2 illustrated in FIG. 2. Note that the dielectric sheets 18 may be integrated by using an adhesive agent such as an epoxy resin or the like instead of heat compression. Note that, with the via conductors B1 to B4, b1, and b2, the through holes do not necessarily have to be completely embedded with the conductor, the through holes may be formed by forming the conductor along the inner circumferential surfaces of the through holes, for example.

Finally, the protection layer 14 is formed on the dielectric sheet 18a by applying a resin (resist) paste thereto.

According to the high-frequency signal transmission line 10 thus configured, occurrence of low-frequency noise is significantly reduced and prevented. More specifically, with the signal line 500 disclosed in PCT Publication No. 2011/018934, the property impedance of the signal line 532 at the end portions 540a and 540b differs from the property impedance of the signal line 532 at the line portion 542. Therefore, reflection of a high-frequency signal occurs at the end portions 540a and 540b occurs. Thus, standing waves, which have a low frequency with distance of ½ wavelength between the end portions 540a and 540b, are generated. As a result thereof, low-frequency noise is radiated from the signal line 500.

On the other hand, with the high-frequency signal transmission line 10, the signal line S1 preferably includes the line portion 20 and line portion 21 being alternatively connected. The line portion 20 is provided within the opening portions Op1 of the ground conductor 22, and accordingly, does not face the ground conductor 22. On the other hand, the line portion 21 faces the ground conductor 22. Therefore, capacitance generated between the line portion 20 and ground conductor 22 is smaller than capacitance generated between the line portion 21 and the ground conductor 22. Thus, the property impedance Z1 of the line portion 20 differs from the property impedance Z2 of the line portion 21. Specifically, the property impedance Z1 is higher than the property impedance Z2. Consequently, the property impedance of the signal line S1 cyclically varies between the property impedance Z1 and the property impedance Z2. As a result thereof, with the signal line S1, standing waves having short wavelengths (i.e., high-frequency) occur at the line portions 20 and 21. On the other hand, less standing waves having long wavelengths (i.e., low frequency) occur between the external terminals 16a and 16b. Thus, with the high-frequency signal transmission line 10, occurrence of low-frequency noise is significantly reduced and prevented.

Note that, with the high-frequency signal transmission line 10, high-frequency noise occurs due to standing waves occurring at the line portions 20 and 21. The length L1 of the line portion 20 and the length L2 of the line portion 21 are designed to be sufficiently shorter such that the frequency of noise may be set to be other than the band of a high-frequency signal to be transmitted within the signal line S1. To that end, the length L1 of the line portion 20 and the length L2 of the line portion 21 are preferably set shorter than a half of the wavelength of a high-frequency signal to be transmitted within the signal line S1.

As the signal line S1 is planar-viewed from the positive direction side in the z axis direction, the strip-shaped line portion is viewed. It is when the electric length of the strip-shaped line portion 20 is about one half of the wavelength of a high-frequency signal to be transmitted within the signal line S1 that the line portion 20 irradiates electromagnetic waves. Accordingly, it is desirable that the electric length of the line portion 20 is shorter than about one half of the wavelength of a high-frequency signal to be transmitted within the signal line S1, and leakage of a high-frequency signal may effectively be significantly reduced and prevented by lowering the electric length of the line portion 20 to about ⅛ or shorter, for example.

Also, with the high-frequency signal transmission line 10, according to a reason that will be described below as well, the property impedance Z1 of the line portion 20 and the property impedance Z2 of the line portion 21 differ. More specifically, the line portion 20 is provided to a position farther away from the ground conductor 24 than the line portion 21. Therefore, capacitance generated between the line portion 20 and the ground conductor 24 is smaller than capacitance generated between the line portion 21 and the ground conductor 24. Thus, the property impedance Z1 of the line portion 20 and the property impedance Z2 of the line portion 21 differ. Specifically, the property impedance Z1 becomes higher than the property impedance Z2.

Also, with the high-frequency signal transmission line 10, the property impedance of both ends of the signal line S1 has magnitude between the property impedance Z1 of the line portion 20 and the property impedance Z2 of the line portion 21. Thus, with the signal line S1, standing waves having short wavelengths readily occur at the line portions 20 and 21, and less standing waves having long wavelengths occur between both ends of the signal line S1. As a result thereof, with the high-frequency signal transmission line 10, occurrence of low-frequency noise is more effectively reduced and prevented.

Also, with the high-frequency signal transmission line 10, a width G of a gap between the line portion 20 and the ground conductor 22 (see FIGS. 2 and 4) is adjusted such that the magnitude of capacitance to be generated between the line portion 20 and the ground conductor 22 may be adjusted. Specifically, as the width G of the gap between the line portion 20 and the ground conductor 22 decreases, a capacitance to be generated between the line portion 20 and the ground conductor 22 increases. On the other hand, as the width G of the gap between the line portion 20 and the ground conductor 22 increases, a capacitance to be generated between the line portion 20 and the ground conductor 22 decreases.

Also, with the high-frequency signal transmission line 10, the line of electric force to be output from the line portion 20 is readily absorbed by the ground conductor 22, by reducing the width G of the gap between the line portion 20 and the ground conductor 22. As a result thereof, noise is prevented from being radiated from the line portion 20.

Also, with the high-frequency signal transmission line 10, a reduction of high-frequency resistance of the signal line S1 may be realized without decreasing the property impedance Z1 of the line portion 20. More specifically, in order to reduce the high-frequency resistance of the signal line S1, it is conceived to increase the line width of the signal line S1. Therefore, in the event of increasing the line width W2 of the line portion 21, capacitance to be generated between the line portion 21 and the ground conductors 22 and 24 consequently increases. Therefore, the property impedance Z2 of the line portion 21 becomes too small.

Therefore, with the high-frequency signal transmission line 10, the line width W1 of the line portion 20 is preferably set to be greater than the line width W2 of the line portion 21. The line portion 20 is provided to a position further away from the ground conductor 24 than the line portion 21, and also does not face the ground conductor 22. Accordingly, capacitance to be generated between the line portion 20 and the ground conductors 22 and 24 is small. Therefore, even when the line width W1 of the line portion 20 increases, the increasing amount of capacitance generated between the line portion 20 and the ground conductors 22 and 24 is very minor. As a result thereof, with the high-frequency signal transmission line 10, reduction of the high-frequency resistance of the signal line S1 is realized without decreasing the property impedance Z1 of the line portion 20.

Also, with the high-frequency signal transmission line 10, as will be described below, reduction in the thickness of the high-frequency signal transmission line 10 may be realized. More specifically, with the ground conductor 22, the opening portions Op1 overlaid with the line portion 20, when viewed in planar fashion from the Z axis direction, are provided. Thus, the line portion 20 does not face the ground conductor 22. Therefore, only small capacitance is generated between the line portion 20 and the ground conductor 22. Accordingly, in a state in which the property impedance Z1 of the line portion 20 is maintained at predetermined property impedance (e.g., about 70Ω), a distance between the line portion 20 and the ground conductor 22 may be reduced. With the present preferred embodiment, the line portion 20 and ground conductor 22 are provided to the same dielectric sheet 18a. As a result thereof, a reduction in the thickness of the high-frequency signal transmission line 10 is realized. When such a reduction in the thickness of the high-frequency signal transmission line 10 is realized, the high-frequency signal transmission line 10 may readily be bent.

Also, with the high-frequency signal transmission line 10, line widths W21 in the x axis direction of the bridge portions Br1 are narrowed, reduction of the high-frequency resistance of the signal line S1 may be realized without decreasing the property impedance Z2 of the line portion 21. More specifically, in the event of increasing the line width W2 of the line portion 21, the high-frequency resistance of the signal line S1 decreases. However, the property impedance Z2 of the line portion 21 significantly depends on the size of a facing area between the signal line S1 and the bridge portions Br1. Specifically, in the event that the facing area between the signal line S1 and the bridge portions Br1 increases, capacitance to be generated between the signal line S1 and the bridge portions Br1 increases, and accordingly, the property impedance Z2 becomes too small. Therefore, it is desirable to increase the line width W2 of the line portion 21 while decreasing the line widths W21 of the bridge portions Br1. Thus, reduction of the high-frequency resistance of the signal line S1 may be realized without changing the capacitance to be generated between the signal line S1 and the bridge portions Br1.

Also, according to the high-frequency signal transmission line 10, magnetic flux is prevented from leaking from the high-frequency signal transmission line 10. More specifically, in the event that current i1 (see FIG. 4) flows into the line portion 20, magnetic flux which goes around the line portion 20 occurs with the line portion 20 as the center axis. In the event that such magnetic flux leaks out of the high-frequency signal transmission line 10, there is a possibility that a signal line of another circuit and the line portion 20 may be coupled in the magnetic field. As a result thereof, with the high-frequency signal transmission line 10, it becomes difficult to obtain a desired property.

Therefore, with the high-frequency signal transmission line 10, the line portion 20 is provided within the opening portions Op1 of the ground conductor 22. Thus, the line portion 20 comes closer to the ground conductor 22. In the event that the current i1 flows into the line portion 20, feedback current i2 in the opposite direction of this current i1 flows into the ground conductor 22. Accordingly, the loop direction of magnetic flux around the line portion 20, and the loop direction of magnetic flux around the ground conductor 22 become the reverse direction. In this case, while magnetic flux is mutually intensified between the line portion 20 and the ground conductor 22, magnetic flux is mutually cancelled out at areas on the positive direction side and the negative direction side in the y axis direction from the ground conductor 22 (i.e., an area outside of the high-frequency signal transmission line 10). As a result thereof, magnetic flux is prevented from leaking out of the high-frequency signal transmission line 10.

Also, with the high-frequency signal transmission line 10, according to a reason that will be described below as well, reduction of high-frequency resistance may be realized. More specifically, with the ground conductor 22, feedback current flows into a portion on the positive direction side in the y axis direction from the opening portions Op1, and a portion on the negative direction side in the y axis direction from the opening portions Op1. Therefore, it is desirable from a viewpoint of reduction of high-frequency resistance that, with the ground conductor 22, the resistance value of a portion on the positive direction side in the y axis direction from the opening portions Op1, and the resistance value of a portion on the negative direction side in the y axis direction from the opening portions Op1 are low.

Therefore, with the high-frequency signal transmission line 10, width W11 of the opening portions Op1 is smaller than length L11 of the opening portions Op1. Thus, with the ground conductor 22, the width of a portion on the positive direction side in the y axis direction from the opening portions Op1, and the width of a portion on the negative direction side in the y axis direction from the opening portions Op1 increase. As a result thereof, with the ground conductor 22, the resistance value of a portion on the positive direction side in the y axis direction from the opening portions Op1, and the resistance value of a portion on the negative direction side in the y axis direction from the opening portions Op1 become low.

Figure 8:
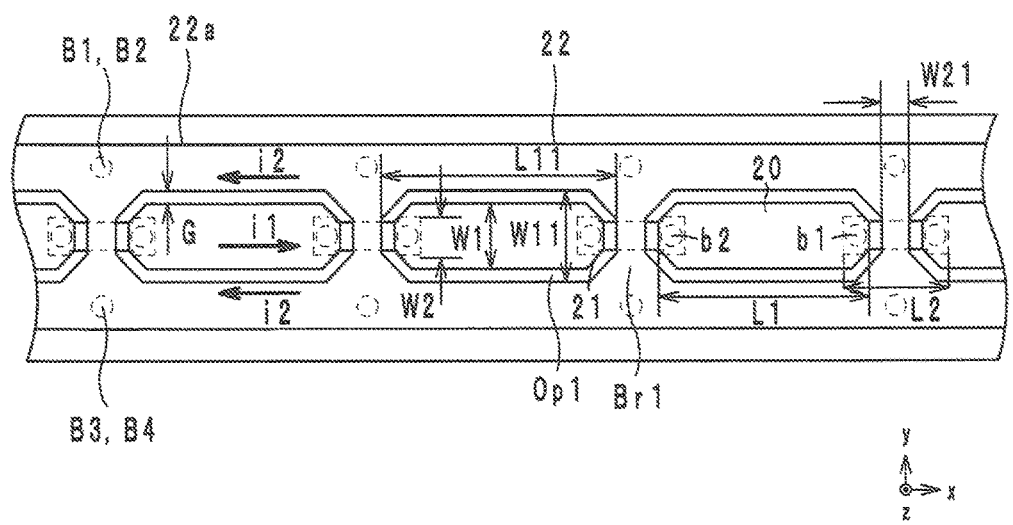
FIG. 8 is a planar view of a high-frequency signal transmission line according to a first modification of the first preferred embodiment of the present invention.

Hereinafter, a high-frequency signal transmission line 10a according to a first modification of the first preferred embodiment of the present invention will be described with reference to a drawing. FIG. 8 is a planar view of the high-frequency signal transmission line 10a according to the first modification.

Differences between the high-frequency signal transmission line 10a and the high-frequency signal transmission line 10 are the shape of the line portion 20 and the shapes of the opening portions Op1. More specifically, with the high-frequency signal transmission line 10a, a taper is provided near both ends in the x axis direction of the line portion 20 so that the line width gradually decreases. Thus, the line width of the line portion 20 at a portion where the line portion 20 and line portion 21 are connected is narrower than the line width at the center portion in the x axis direction of the line portion 20.

Also, a taper is provided near both ends in the x axis direction of the opening portions Op1 so that the width in the y axis direction gradually decreases. Thus, the opening portions Op1 have a shape which imitates the shape of the line portion 20.

With the high-frequency signal transmission line 10a thus configured, occurrence of reflection of a high-frequency signal is significantly reduced and prevented between the line portion 20 and line portion 21. More specifically, a taper is provided near both ends in the x axis direction of the line portion 20 so that the line width gradually decreases. Thus, while electrostatic capacitance occurs between the center portion in the x axis direction of the line portion 20 and the ground conductor 22, both ends in the x axis direction of the line portion 20 are connected to the line portion 21 through via hole conductors b1 and b2. The line portion 21 faces the ground conductor 22, and accordingly has a strong capacitive property. Thus, the inductive property is strengthened at the center portion in the x axis direction of the line portion 20, and the capacitive property is strengthened at an area near both ends in the x axis direction of the line portion 20. As a result thereof, property impedance near both ends in the x axis direction of the line portion is lower than property impedance at the center in the x axis direction of the line portion 20, and also higher than the property impedance Z2 at the line portion 21. Thus, property impedance is prevented from significantly fluctuating at the connection portion between the line portions 20 and 21. Accordingly, the occurrence of reflection of a high-frequency signal is prevented between the line portions 20 and 21.

The inventor of the present application created a model of the high-frequency signal transmission line 10a, and studied the passage property and reflection property of the high-frequency signal transmission line 10a by computer simulation. Hereinafter, conditions for the model used for simulation will be described.

Figure 9:
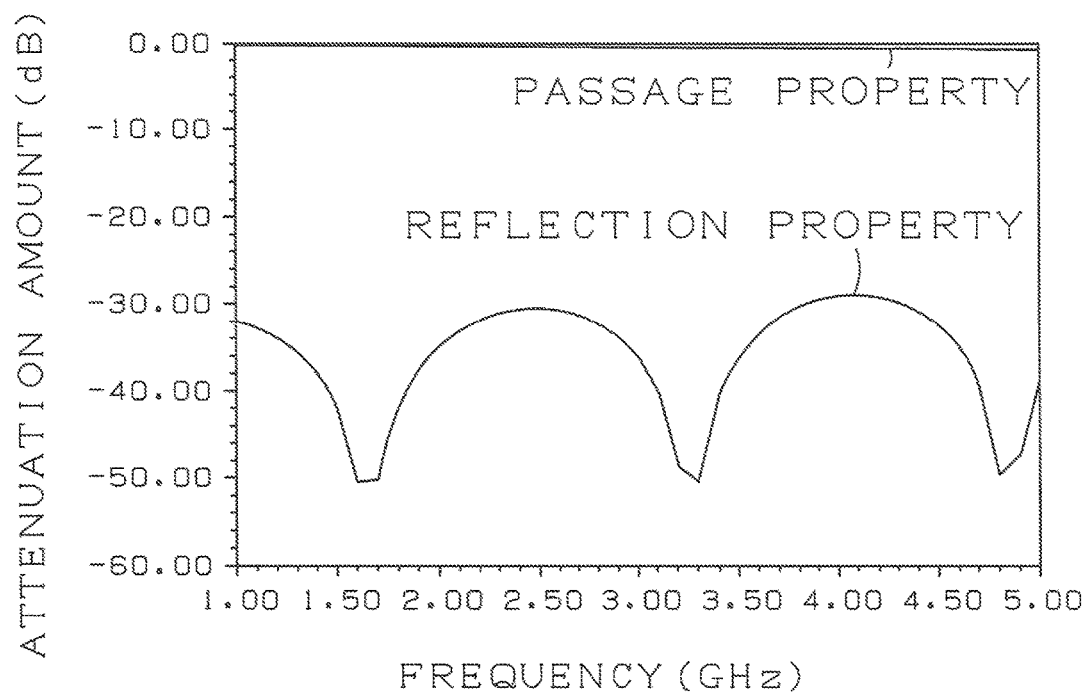
FIG. 9 is a graph illustrating simulation results.

Gap Width G: 200 μm
Line Widths W21 of Bridge Portions Br1: 100 μm
Lengths L11 of Opening Portions Op1: 3 mm
Width W11 of Opening Portions Op1: 850 μm
Line Width W1 of Line Portion 20: 450 μm
Line Width W2 of Line Portion 21: 200 μm
Interval between Line Portion 21 and Ground Conductor 22: 50 μm
Interval between Line Portion 21 and Ground Conductor 24: 150 μm
Total Length of High-frequency Signal Line 10a: 60 mm FIG. 9 is a graph illustrating simulation results. The vertical axis indicates attenuation amount, and the horizontal axis indicates frequencies. According to FIG. 9, it can be seen that, with the high-frequency signal transmission line 10a, the passage property of a high-frequency signal of 2 GHz is around −0.3 dB. Accordingly, the passage property of the high-frequency signal transmission line 10a becomes around ⅓ of the passage property of a common tri-plate type high-frequency signal transmission line having the same size.

Further, according to FIG. 9, with the high-frequency signal transmission line 10a, the reflection property of a high-frequency signal of 1 GHz to 5 GHz is equal to or smaller than about −30 dB, for example. Thus, with the high-frequency signal transmission line 10a, it can be seen that fluctuation of property impedance is effectively reduced with a wide band. Specifically, the property impedance of the high-frequency signal transmission line 10a is around 50Ω±2.5Ω, for a high-frequency signal of 1 GHz to 5 GHz, for example.

Figure 10:
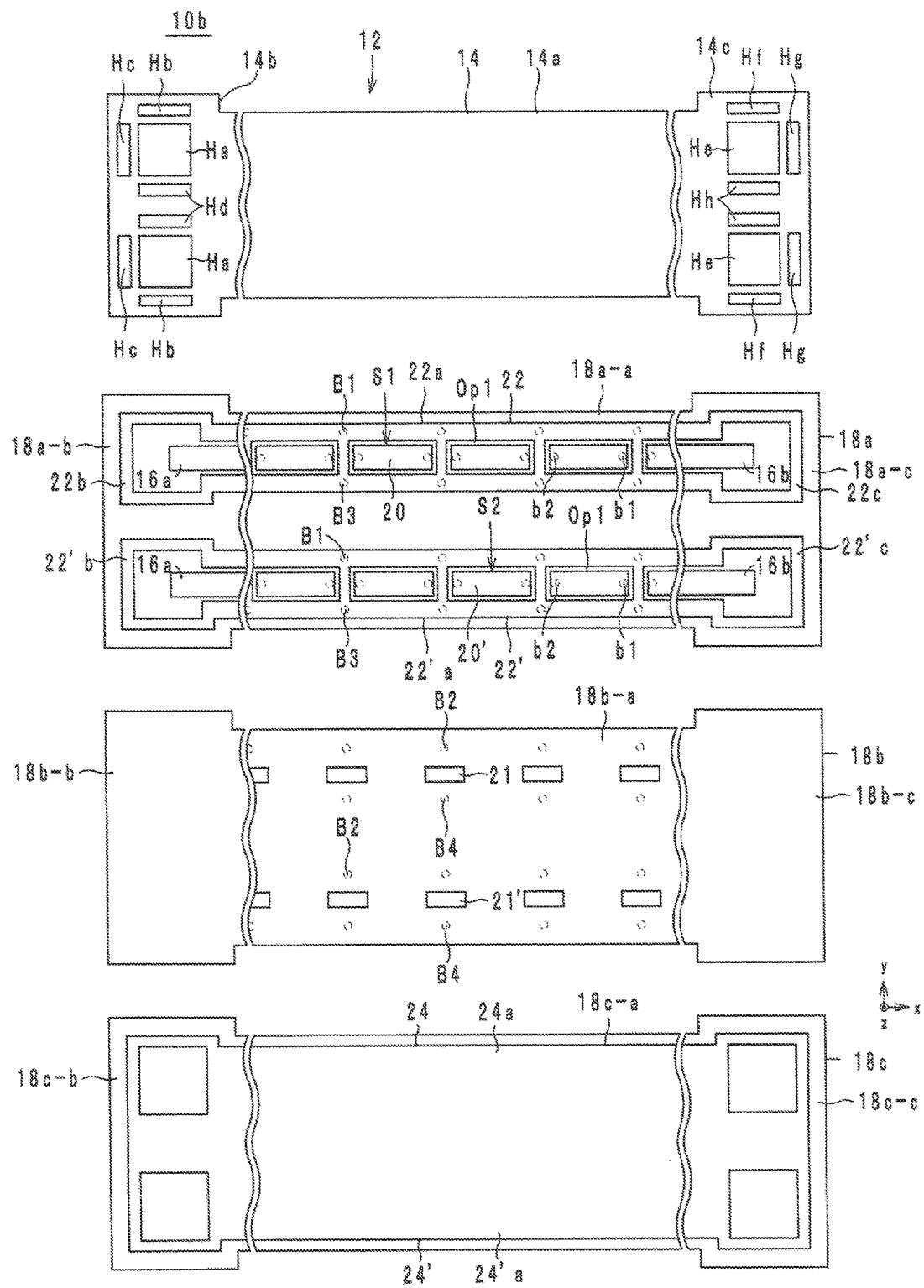
FIG. 10 is an exploded view of a high-frequency signal transmission line according to a second modification of the first preferred embodiment of the present invention.

Hereinafter, a high-frequency signal transmission line 10b according to a second modification of the first preferred embodiment of the present invention will be described with reference to a drawing. FIG. 10 is an exploded view of the high-frequency signal transmission line 10b according to the second modification.

As illustrated with the high-frequency signal transmission line 10b, multiple signal lines S1 and S2 may be provided. With the high-frequency signal transmission line 10b, the ground conductor 24 which faces the signal line S1 and a ground conductor 24' which faces a signal line S2 may preferably include one conductor layer as illustrated in FIG. 10.

On the other hand, it is desirable that the ground conductor 22 which faces the signal line S1 and the ground conductor 22' which faces the signal line S2 are mutually not connected. Thus, an isolation property between the signal line S1 and the signal line S2 is improved.

Figure 11:
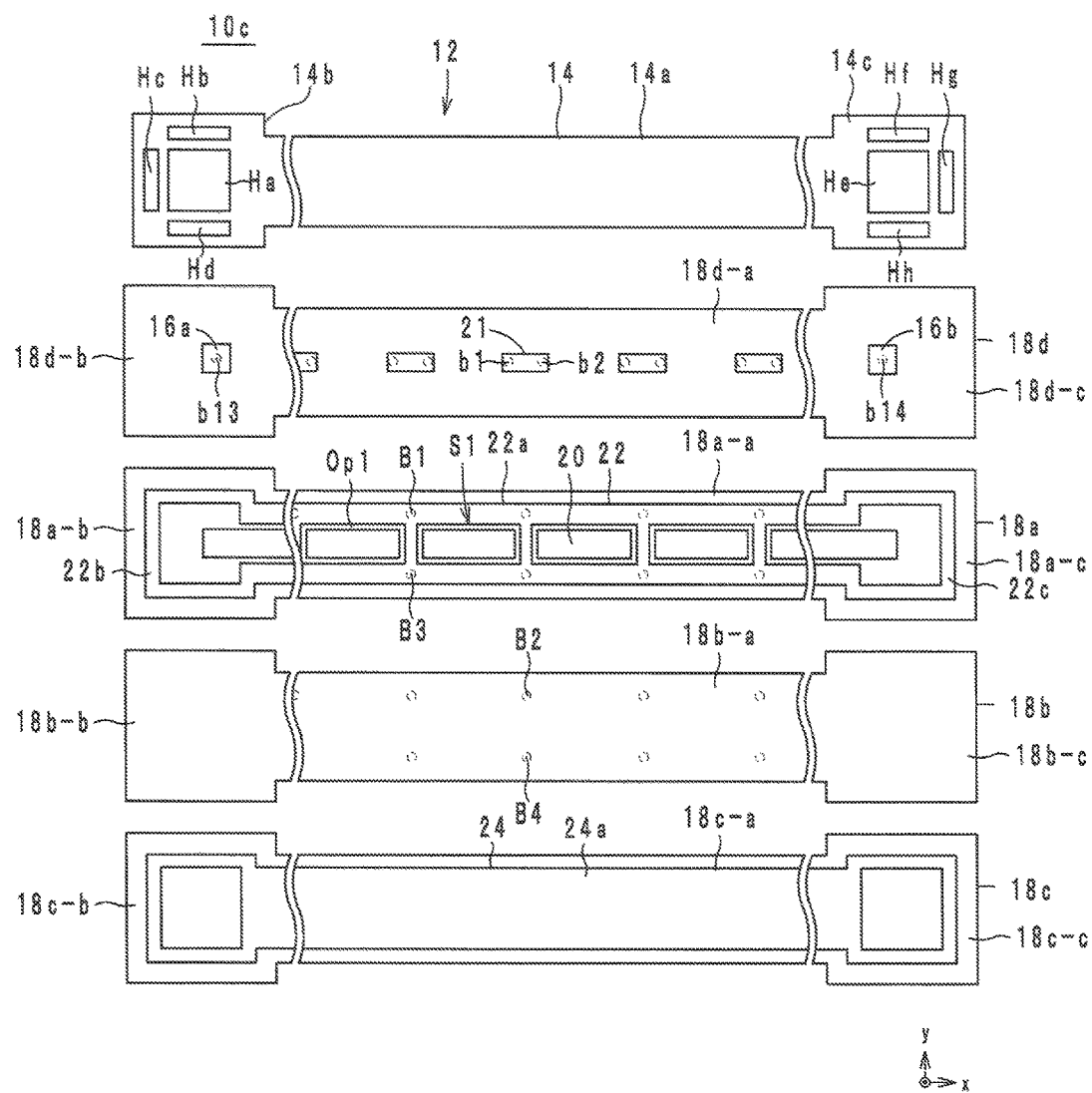
FIG. 11 is an exploded view of a high-frequency signal transmission line according to a third modification of the first preferred embodiment of the present invention.

Hereinafter, a high-frequency signal transmission line 10c according to a third modification of the first preferred embodiment of the present invention will be described with reference to a drawing. FIG. 11 is an exploded view of the high-frequency signal transmission line 10c according to the third modification.

A difference between the high-frequency signal transmission line 10c and the high-frequency signal transmission line 10 is the position of the line portion 21. While, with the high-frequency signal transmission line 10, the line portion 21 is provided on the negative direction side in the z axis direction from the line portion 20, with the high-frequency signal transmission line 10c, the line portion 21 is provided on the positive direction side in the z axis direction from the line portion 20. Hereinafter, the configuration of the high-frequency signal transmission line 10c will be described primarily with regard to such a difference.

With the high-frequency signal transmission line 10c, the dielectric element body 12 preferably includes the dielectric sheets 18d, 18a, 18b, and 18c that are laminated so as to be arrayed from the positive direction side to the negative direction side in the z axis direction in this order.

The line portions 20 and 21 are provided to different layers in the different dielectric element body 12. Specifically, the line portion 20 is provided to the surface (first layer) of the dielectric sheet 18a, and the line portion 21 is provided to the surface (second layer) of the dielectric sheet 18d.

Also, each of the via hole conductors b1 and b2 passes through the dielectric sheet 18d in the z axis direction. The via hole conductor b1 connects the end portion on the positive direction side in the x axis direction of the line portion 20 and the end portion on the negative direction side in the x axis direction of the line portion 21. The via hole conductor b2 connects the end portion on the negative direction side in the x axis direction of the line portion 20 and the end portion on the positive direction side in the x axis direction of the line portion 21.

Also, the external terminal 16a is provided to the terminal portion 18d-b of the dielectric sheet 18d. The external terminal 16a is connected to the line portion 20 positioned the farthest in the negative direction side in the x axis direction via the via hole conductor b13.

Also, the external terminal 16b is provided to the terminal portion 18d-c of the dielectric sheet 18d. The external terminal 16b is connected to the line portion 20 positioned the farthest in the positive direction side in the x axis direction via the via hole conductor b14.

The ground conductor 22 is provided to the surface of the dielectric sheet 18a, and is overlaid with the line portion 21 in planar view from the z axis direction.

The ground conductor 24 is provided to the surface of the dielectric sheet 18c, and is overlaid with the line portions 20 and 21 in planar view from the z axis direction.

With the high-frequency signal transmission line 10c thus configured as well, similar to the high-frequency signal transmission line 10, the property impedance Z1 of the line portion 20 and the property impedance Z2 of the line portion 21 may differ. Note that, with the high-frequency signal transmission line 10c, the property impedance Z1 may be greater than the property impedance Z2, or the property impedance Z2 may be greater than the property impedance Z1.

Second Preferred Embodiment

Figure 12:
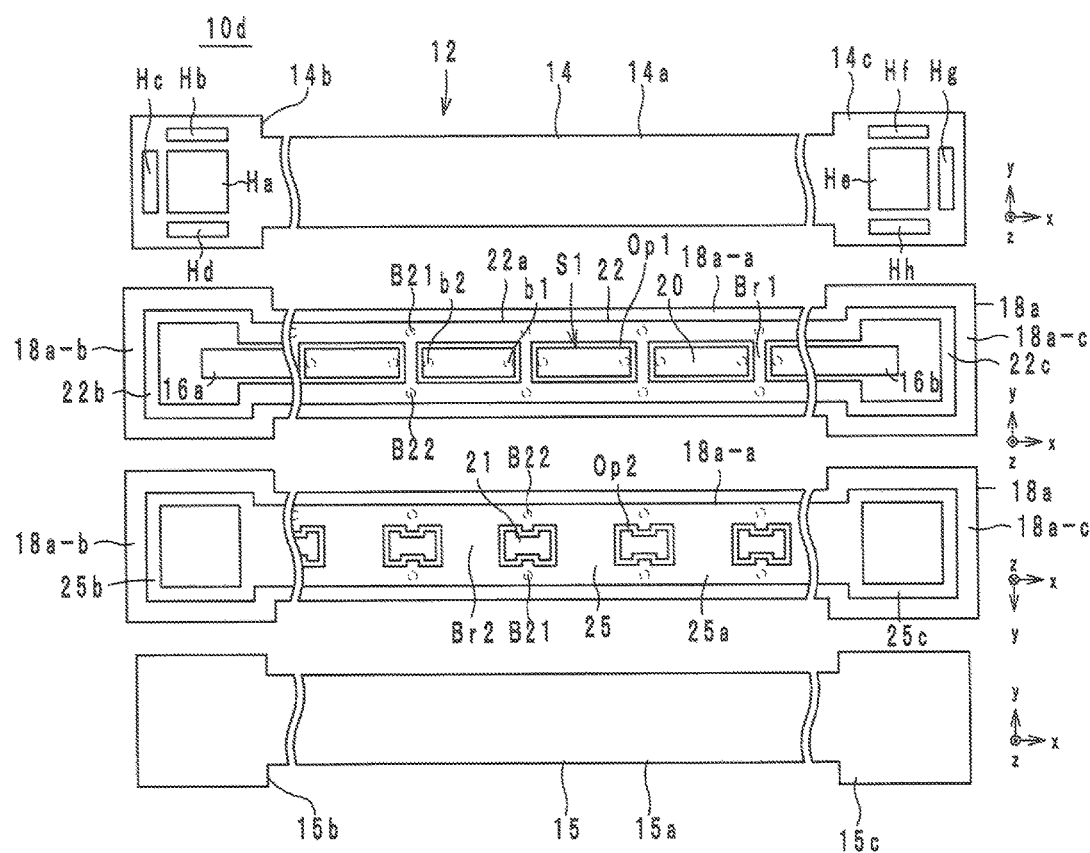
FIG. 12 is an exploded view of a high-frequency signal transmission line according to a second preferred embodiment of the present invention.
Figure 13:
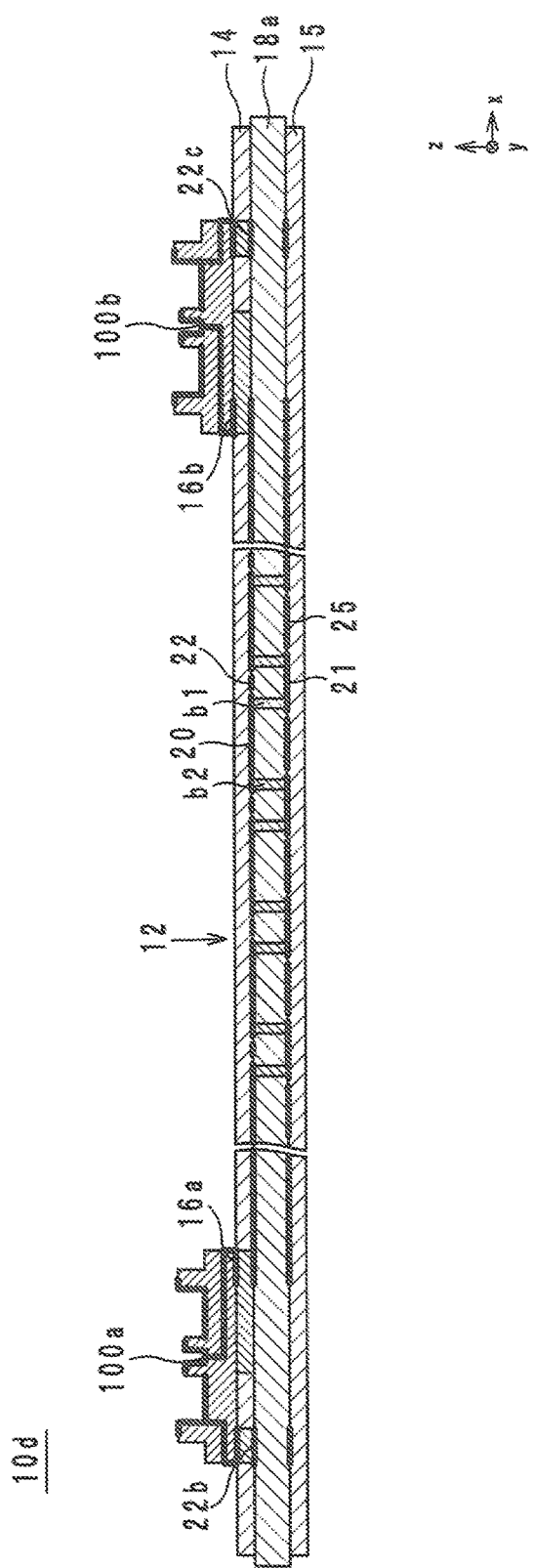
FIG. 13 is a cross-sectional configuration diagram of the high-frequency signal transmission line according to the second preferred embodiment of the present invention.
Figure 14:
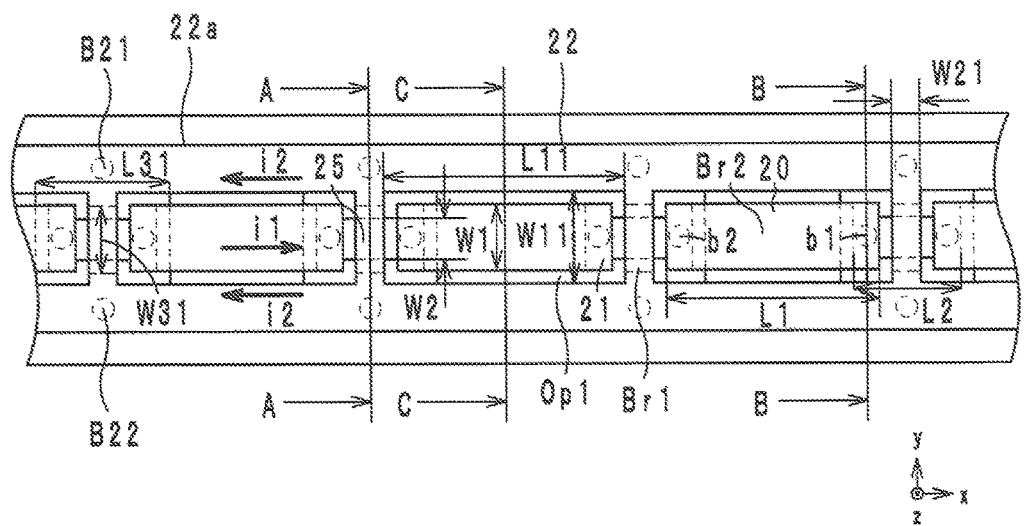
FIG. 14 is a planar view of the high-frequency signal transmission line according to the second preferred embodiment of the present invention.
Figure 15A:
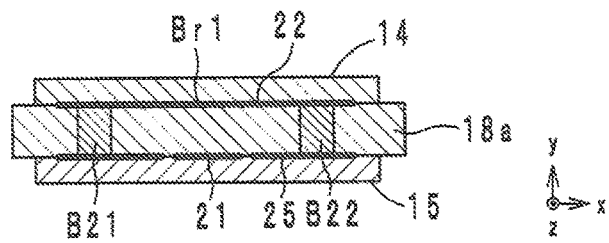
FIGS. 15A to 15C are cross-sectional configuration diagrams of the high-frequency signal transmission line according to the second preferred embodiment of the present invention.
Figure 15B:
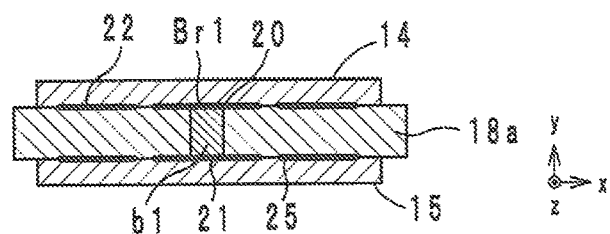
Figure 15C:
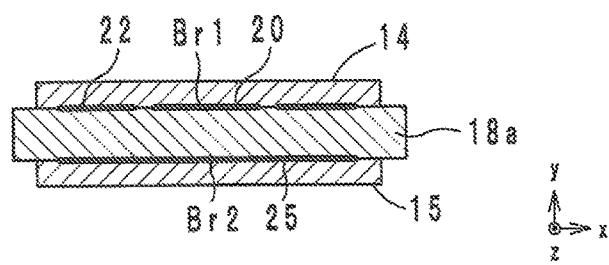

Hereinafter, the configuration of a high-frequency signal transmission line according to a second preferred embodiment of the present invention will be described with reference to drawings. FIG. 12 is an exploded view of a high-frequency signal transmission line 10d according to the second preferred embodiment. In FIG. 12, the surface and rear surface of the dielectric sheet 18a are illustrated. FIG. 13 is a cross-sectional configuration diagram of the high-frequency signal transmission line 10d according to the second preferred embodiment. FIG. 14 is a planar view of the high-frequency signal transmission line 10d according to the second preferred embodiment. FIGS. 15A to 15C are cross-sectional configuration diagrams of the high-frequency signal transmission line 10d according to the second preferred embodiment. FIG. 15A is a cross-sectional view taken along A-A in FIG. 14. FIG. 15B is a cross-sectional view taken along B-B in FIG. 14. FIG. 15C is a cross-sectional view taken along C-C in FIG. 14. In FIGS. 12 to 15C, the laminating direction of the high-frequency signal transmission line 10d is defined as the z axis direction. Also, the longitudinal direction of the high-frequency signal transmission line 10d is defined as the x axis direction, and a direction orthogonal to the x axis direction and z axis direction is defined as the y axis direction. As for an external perspective view of the high-frequency signal transmission line 10d, FIG. 1 will be referenced.

The high-frequency signal transmission line 10d preferably includes, as illustrated in FIGS. 12 to 15C, the dielectric element body (body) 12, signal line S1, ground conductors 22 and 25, connectors 100a and 100b, and via hole conductors B21 and B22.

The dielectric element body 12 extends in the x axis direction in planar view from the z axis direction, and includes the line portion 12a, and connection portions 12b and 12c. With the dielectric element body 12 preferably includes, as illustrated in FIG. 12, a flexible laminate including the protection layer 14, dielectric sheet (insulating layer) 18a, and protection layer 15 being laminated from the positive direction side to the negative direction side in the z axis direction in this order. Hereinafter, the principal surface on the positive direction side in the z axis direction of the dielectric element body 12 will be referred to as a surface, and the principal surface on the negative direction side in the z axis direction of the dielectric element body 12 will be referred to as a rear surface.

The line portion 12a extends in the x axis direction. The connection portion 12b is connected to the end portion on the negative direction side in the x axis direction of the line portion 12a, and preferably has a rectangular or substantially rectangular shape. The connection portion 12c is connected to the end portion on the positive direction side in the x axis direction of the line portion 12a, and preferably has a rectangular or substantially rectangular shape. The widths of the connection portions 12b and 12c in the y axis direction are greater than the width of the line portion 12a in the y axis direction.

In planar view from the z axis direction, the dielectric sheet 18a extends in the x axis direction, and preferably has the same or substantially the same shape as the dielectric element body 12. The dielectric sheet 18a is preferably made of a thermoplastic resin having flexibility such as polyimide, liquid crystal polymer, or other suitable material, for example. The thickness of the dielectric sheet 18a after laminating preferably is, for example, about 50 μm to about 500 μm, and 150 μm in the present preferred embodiment. Hereinafter, the principal surface of the dielectric sheet 18a on the positive direction side in the z axis direction will be referred to as a surface, and the principal surface of the dielectric sheet 18a on the negative direction side in the z axis direction will be referred to as a rear surface.

Also, the dielectric sheet 18a preferably includes a line portion 18a-a and connection portions 18a-b and 18a-c. The line portion 18a-a defines the line portion 12a. The connection portion 18a-b defines the connection portion 12b. The connection portion 18a-c defines the connection portion 12c.

The signal line S1 is, as illustrated in FIG. 12, a linear conductor provided within the dielectric element body 12, and extends in the x axis direction. The signal line S1 preferably includes line portions 20 and 21 and via hole conductors (inter-layer connection conductors) b1 and b2.

The line portions 20 and 21 are provided to different layers of the dielectric element body 12. Specifically, the line portion 20 is provided to the surface (first layer) of the dielectric sheet 18a, and the line portion 21 is provided to the rear surface (second layer) of the dielectric sheet 18a.

The line portion 20 is, as illustrated in FIGS. 12 to 14, provided to the surface of the line portion 18a-a of the dielectric sheet 18a, and preferably is a rectangular or substantially rectangular conductor aligned in the x axis direction with an equal interval. The line portion 21 is provided to the rear surface of the line portion 18a-a of the dielectric sheet 18a, and preferably is a rectangular or substantially rectangular conductor aligned in the x axis direction with an equal interval. The line portions 20 and 21 are disposed in a manner shifted in the x axis direction. The end portion on the positive direction side in the x axis direction of the line portion 20 is, in planar view from the z axis direction, overlaid with the end portion on the negative direction side in the x axis direction of the line portion 21. The end portion on the negative direction side in the x axis direction of the line portion 20 is, in planar view from the z axis direction, overlaid with the end portion on the positive direction side in the x axis direction of the line portion 21.

Also, the end portion on the negative direction side in the x axis direction of the line portion 20 positioned the farthest on the negative direction side in the x axis direction is positioned in the center of the surface of the connection portion 18a-b. Similarly, the end portion on the positive direction side in the x axis direction of the line portion 20 positioned the farthest on the positive direction side in the x axis direction is positioned in the center of the surface of the connection portion 18a-c. Each of the end portion on the negative direction side in the x axis direction of the line portion 20 positioned the farthest on the negative direction side in the x axis direction, and the end portion on the positive direction side in the x axis direction of the line portion 20 positioned the farthest on the positive direction side in the x axis direction is preferably used as an external terminal. Hereinafter, the end portion on the negative direction side in the x axis direction of the line portion 20 positioned the farthest on the negative direction side in the x axis direction, and the end portion on the positive direction side in the x axis direction of the line portion 20 positioned the farthest on the positive direction side in the x axis direction will be referred to as external terminals 16a and 16b, respectively. The surfaces of the external terminals 16a and 16b preferably have been subjected to gold plating.

Also, width (line width) W1 in the y axis direction of the line portion 20 is, as illustrated in FIG. 14, wider than width (line width) W2 in the y axis direction of the line portion 21. Also, length L1 in the x axis direction of the line portion 20 is longer than length L2 in the x axis direction of the line portion 21. Further, the length L1 of the line portion 20 and the length L2 of the line portion 21 are preferably shorter than about ½ wavelength of a high-frequency signal to be transmitted within the signal line S1. The line portions 20 and 21 as described above are preferably manufactured of a metal material having small specific resistance with silver or copper as a principal component, for example.

The via hole conductor b1 connects the surface of the dielectric sheet 18a and the rear surface of the dielectric sheet 18a by passing through the dielectric sheet 18a in the z axis direction. The end portion on the positive direction side in the z axis direction of the via hole conductor b1 is connected to the end portion on the positive direction side in the x axis direction of the line portion 20. The end portion on the negative direction side in the z axis direction of the via hole conductor b1 is connected to the end portion on the negative direction side in the x axis direction of the line portion 21.

The via hole conductor b2 connects the surface of the dielectric sheet 18a and the rear surface of the dielectric sheet 18a by passing through the dielectric sheet 18a in the z axis direction. The end portion on the positive direction side in the z axis direction of the via hole conductor b2 is connected to the end portion on the negative direction side in the x axis direction of the line portion 20. The end portion on the negative direction side in the z axis direction of the via hole conductor b2 is connected to the end portion on the positive direction side in the x axis direction of the line portion 21. The via hole conductors b1 and b2 preferably are manufactured of a metal material having small specific resistance with silver or copper as a principal component, for example. Note that through holes where a conductor layer such as plating or the like is provided in the inner surfaces thereof may be used instead of the via hole conductors b1 and b2, for example.

As described above, with the signal line S1, the line portions 20 and 21 are alternately connected by the via hole conductors b1 and b2. Thus, the signal line S1 preferably has, as illustrated in FIG. 13, a zigzag shape which advances in the x axis direction while vibrating in the z axis direction in planar view from the y axis direction.

The ground conductor 22 (first ground conductor) is, as illustrated in FIGS. 12 and 13, provided to the surface of the dielectric sheet 18a where the line portion 20 is provided, and in planar view from the z axis direction (the normal direction of the dielectric element body 12), is overlaid with the multiple line portions 21, and also not overlaid with the multiple line portions 20. The ground conductor 22 is preferably manufactured of a metal material having small specific resistance with silver or copper as a principal component, for example. Hereinafter, the ground conductor 22 will be described in more detail.

The ground conductor 22 preferably includes, as illustrated in FIG. 12, a line portion 22a and terminal portions 22b and 22c. The line portion 22a is provided to the surface of the line portion 18a-a, and extends in the x axis direction. Multiple opening portions Op1 aligned in the x axis direction are provided to the line portion 22a. No ground conductor 22 is provided within the opening portions Op1. However, the line portion 20 is provided within the opening portions Op1. Thus, the line portion 20 is surrounded by the ground conductor 22 in a state being insulated from the ground conductor 22. Accordingly, the ground conductor 22 is not overlaid with the line portion 20 in planar view from the z axis direction. Also, lengths L11 in the x axis direction (direction along the line portion 20) of the opening portions Op1 are, as illustrated in FIG. 14, longer than the widths W11 in the y axis direction of the opening portions Op1.

A bridge portion Br1 which extends in the y axis direction is provided between the opening portions Op1 adjacent to the x axis direction. Thus, with the line portion 22a, the opening portions Op1 and bridge portions Br1 are alternately arrayed in the x axis direction. The bridge portions Br1 are, as illustrated in FIG. 15A, overlaid with the line portion 21 in planar view from the z axis direction. The line portion 22a as described above has a ladder shape as illustrated in FIGS. 12 and 14.

The terminal portion 22b is, as illustrated in FIG. 12, provided to the surface of the connection portion 18a-b, and defines a rectangular or substantially rectangular frame which surrounds an external terminal 16a. The terminal portion 22b is connected to the end portion on the negative direction side in the x axis direction of the line portion 22a. The terminal portion 22c is provided to the surface of the connection portion 18a-c, and defines a rectangular or substantially rectangular frame which surrounds an external terminal 16b. The terminal portion 22c is connected to the end portion on the positive direction side in the x axis direction of the line portion 22a.

The ground conductor 25 (second ground conductor) is, as illustrated in FIGS. 12 and 13, provided to the rear surface of the dielectric sheet 18a provided to the line portion 20, and in planar view from the z axis direction (normal direction of the dielectric element body 12), is overlaid with the multiple line portions 21 and also not overlaid with the multiple lines 20 as illustrated. The ground conductor 25 is preferably manufactured of a metal material having small specific resistance with silver or copper as a principal component, for example. Hereinafter, the ground conductor 25 will be described in more detail.

The ground conductor 25 preferably includes, as illustrated in FIG. 12, a line portion 25a and terminal portions 25b and 25c. The line portion 25a is provided to the rear surface of the line portion 18a-a, and extends in the x axis direction. Multiple opening portions Op2 arrayed in the x axis direction are provided to the line portion 25a. No ground conductor 25 is provided within the opening portions Op2. However, the line portion 21 is provided within the opening portions Op2. Thus, the line portion 21 is surrounded by the ground conductor 25 in a state being insulated from the ground conductor 25. Accordingly, the ground conductor 25 is not overlaid with the line portion 21 in planar view from the z axis direction. Also, lengths L31 in the x axis direction of the opening portions Op2 (direction along the line portion 21) are longer than widths 31 in the y axis direction of the opening portions Op2 as illustrated in FIG. 14.

A bridge portion Br2 which extends in the y axis direction is provided between the opening portions Op2 adjacent to the x axis direction. Thus, with the line portion 25a, the opening portions Op2 and bridge portions Br2 are alternately arrayed in the x axis direction. The bridge portions Br2 are, as illustrated in FIG. 15C, overlaid with the line portion 20 in planar view from the z axis direction. The line portion 25a as described above preferably has a ladder shape as illustrated in FIGS. 12 and 14.

The terminal portion 25b is provided to the rear surface of the connection portion 18a-b, and defines a rectangular or substantially rectangular ring which surrounds the center of the connection portion 18a-b. The terminal portion 25b is connected to the end portion on the negative direction side in the x axis direction of the line portion 25a.

The terminal portion 25c is provided to the surface of the connection portion 18a-c, and defines a rectangular or substantially rectangular ring which surrounds the center of the connection portion 18a-c. The terminal portion 25c is connected to the end portion on the positive direction side in the x axis direction of the line portion 25a.

Via hole conductors B21 pass through the line portion 18a-a of the dielectric sheet 18a in the z axis direction, and the multiple via hole conductors B21 are aligned in the x axis direction on the positive direction side in the y axis direction from the signal line S1. The end portions on the positive direction side in the z axis direction of the via hole conductors B21 are connected to a portion on the positive direction side in the y axis direction from the bridge portions Br1 at the line portion 22a. The end portions on the negative direction side in the z axis direction of the via hole conductors B21 are connected to the line portion 25a.

Via hole conductors B22 pass through the line portion 18a-a of the dielectric sheet 18a in the z axis direction, and the multiple via hole conductors B22 are aligned in the x axis direction on a the negative direction side in the y axis direction from the signal line S1. The end portions on the positive direction side in the z axis direction of the via hole conductors B22 are connected to a portion on the negative direction side in the y axis direction from the bridge portions Br1 at the line portion 22a. The end portions on the negative direction side in the z axis direction of the via hole conductors B22 are connected to the line portion 25a.

The protection layer 14 covers generally the entire surface of the dielectric sheet 18a. Thus, the protection layer 14 covers the ground conductor 22. The protection layer 14 is preferably made up of a flexible resin such as a resist material or other suitable material, for example.

Also, the protection layer 14 preferably includes, as illustrated in FIG. 12, a line portion 14a and connection portions 14b and 14c. The line portion 14a covers the entire surface of the line portion 18a-a so as to cover the line portion 22a.

The connection portion 14b is connected to the end portion on the negative direction side in the x axis direction of the line portion 14a, and covers the surface of the connection portion 18a-b. However, openings Ha to Hd are provided to the connection portion 14b. The opening Ha preferably is a rectangular or substantially rectangular opening provided to generally the center of the connection portion 14b. The external terminal 16a is externally exposed via the opening Ha. Also, the opening Hb preferably is a rectangular or substantially rectangular opening provided to the positive direction side in the y axis direction of the opening Ha. The opening Hc preferably is a rectangular or substantially rectangular opening provided to the negative direction side in the x axis direction of the opening Ha. The opening Hd preferably is a rectangular or substantially rectangular opening provided to the negative direction side in the y axis direction of the opening Ha. The terminal portion 22b is externally exposed via the openings Hb to Hd so as to define and function as an external terminal.

The connection portion 14c is connected to the end portion on the positive direction side in the x axis direction of the line portion 14a, and covers the surface of the connection portion 18a-c. However, openings He to Hh are provided to the connection portion 14c. The opening He preferably is a rectangular or substantially rectangular opening provided to generally the center of the connection portion 14c. The external terminal 16b is externally exposed via the opening He. Also, the opening Hf preferably is a rectangular or substantially rectangular opening provided to the positive direction side in the y axis direction of the opening He. The opening Hg preferably is a rectangular or substantially rectangular opening provided to the positive direction side in the x axis direction of the opening He. The opening Hh preferably is a rectangular or substantially rectangular opening provided to the negative direction side in the y axis direction of the opening He. The terminal portion 22c is externally exposed via the openings Hf to Hh so as to define and function as an external terminal.

The protection layer 15 covers generally the entire rear surface of the dielectric sheet 18a. Thus, the protection layer 15 covers the ground conductor 25. The protection layer 15 is preferably made up of a flexible resin such as a resist material or other suitable material, for example.

Also, the protection layer 15 preferably includes, as illustrated in FIG. 12, a line portion 15a and connection portions 15b and 15c. The line portion 15a covers the entire rear surface of the line portion 18a-a so as to cover the line portion 25a. The connection portion 15b is connected to the end portion on the negative direction side in the x axis direction of the line portion 15a, and covers the rear surface of the connection portion 18a-b. The connection portion 15c is connected to the end portion on the positive direction side in the x axis direction of the line portion 15a, and covers the rear surface of the connection portion 18a-c.

The configurations of the connectors 100a and 100b of the high-frequency signal transmission line 10d preferably are the same or substantially the same as the configurations of the connectors 100a and 100b of the high-frequency signal transmission line 10, and accordingly, description will be omitted.

With the high-frequency signal transmission line 10d thus configured, property impedance Z1 of the line portion 20 and property impedance Z2 of the line portion 21 differ. More specifically, the line width W1 of the line portion 20 is wider than the line width W2 of the line portion 21. Accordingly, an area where the line portion 20 faces the ground conductor 25 is greater than an area where the line portion 21 faces the ground conductor 22. Thus, capacitance generated between the line portion 20 and the ground conductor 25 is greater than capacitance generated between the line portion 21 and the ground conductor 22. Accordingly, the line portion 20 is stronger in the capacitive property than the line portion 21.

Further, in the event that the line width W2 of the line portion 21 is narrower than the line width W1 of the line portion 20, an inductance value of the line portion 21 becomes greater than an inductance value of the line portion 20. Accordingly, the line portion 21 is stronger in the inductive property than the line portion 20.

According to the above, the property impedance Z1 of the line portion 20 becomes lower than the property impedance Z2 of the line portion 21. The property Z2 preferably is, for example, about 70Ω, and the property impedance Z1 preferably is, for example, about 30Ω. Also, the entire impedance of the signal line S1 preferably is, for example, about 50Ω.

Also, with the high-frequency signal transmission line 10$d$, the property impedance Z3 of both ends of the signal line S1 (i.e., external terminals 16$a$ and 16$b$) has a magnitude between the property impedance Z1 of the line portion 20 and the property impedance Z2 of the line portion 21.

According to the high-frequency signal transmission line 10$d$ thus configured, similar to the high-frequency signal transmission line 10, occurrence of low-frequency noise is significantly reduced and prevented.

Note that, with the high-frequency signal transmission line 10$d$, high-frequency noise occurs due to standing waves occurring at the line portions 20 and 21. The length L1 of the line portion 20 and the length L2 of the line portion 21 have been designed to be sufficiently shorter such that the frequency of noise may be set to be other than the band of a high-frequency signal to be transmitted within the signal line S1. To that end, the length L1 of the line portion 20 and the length L2 of the line portion 21 are preferably set shorter than about one half of the wavelength of a high-frequency signal to be transmitted within the signal line S1.

As the signal line S1 is planar-viewed from the positive direction side in the z axis direction, the strip-shaped line portion is viewed. It is when the electric length of the strip-shaped line portion 20 is about one half of the wavelength of a high-frequency signal to be transmitted within the signal line S1 that the line portion 20 irradiates electromagnetic waves. Accordingly, it is desirable that the electric length of the line portion 20 is shorter than a half of the wavelength of a high-frequency signal to be transmitted within the signal line S1, and leakage of a high-frequency signal may effectively be prevented by lowering the electric length of the line portion 20 to about ⅛ or shorter, for example.

Also, with the high-frequency signal transmission line 10$d$, as will be described below, reduction in the thickness of the high-frequency signal transmission line 10$d$ may be realized. More specifically, with the ground conductor 22, in planar view from the z axis direction, the opening portions Op1 overlaid with the line portion 20 are provided. Thus, the line portion 20 does not face the ground conductor 22. Therefore, only small capacitance is generated between the line portion 20 and the ground conductor 22. Accordingly, even when distance in the z axis direction between the line portion 20 and the ground conductor 22 fluctuates, capacitance between the line portion 20 and the ground conductor 22 hardly fluctuates. Accordingly, in a state in which the property impedance Z1 of the line portion 20 is maintained at predetermined property impedance (e.g., about 30Ω), a distance between the line portion 20 and the ground conductor 22 is effectively reduced.

Further, with the ground conductor 25, in planar view from the z axis direction, the opening portions Op2 overlaid with the line portion 21 are provided. Thus, the line portion 21 does not face the ground conductor 25. Therefore, only small capacitance is generated between the line portion 21 and the ground conductor 25. Accordingly, even when distance in the z axis direction between the line portion 21 and the ground conductor 25 fluctuates, capacitance between the line portion 21 and the ground conductor 25 hardly fluctuates. Accordingly, in a state in which the property impedance Z2 of the line portion 21 is maintained at predetermined property impedance (e.g., about 70Ω), a distance between the line portion 21 and the ground conductor 25 may be reduced. According to the above, when a reduction in the thickness of the high-frequency signal transmission line 10$d$ is thus realized, the high-frequency signal transmission line 10$d$ may readily be bent.

Also, with the high-frequency signal transmission line 10$d$, the number of dielectric sheets 18$a$ to be included in the dielectric element body 12 preferably is only one layer. Accordingly, with the high-frequency signal transmission line 10$d$, further reduction in thickness is realized as compared to the high-frequency signal transmission line 10.

Also, with the high-frequency signal transmission line 10$d$, the line portion 20 is provided within the opening portions Op1 of the ground conductor 22. Thus, the line portion 20 comes closer to the ground conductor 22. In the event that the current i1 flows into the line portion 20, feedback current i2 in the opposite direction of this current i1 flows into the ground conductor 22. Accordingly, the loop direction of magnetic flux around the line portion 20, and the loop direction of magnetic flux around the ground conductor 22 becomes the reverse direction. In this case, while magnetic flux is mutually intensified between the line portion 20 and the ground conductor 22, magnetic flux is mutually cancelled out at areas on the positive direction side and the negative direction side in the y axis direction from the ground conductor 22 (i.e., area out of the high-frequency signal transmission line 10). As a result thereof, magnetic flux is prevented from leaking out of the high-frequency signal transmission line 10$d$.

Figure 16:
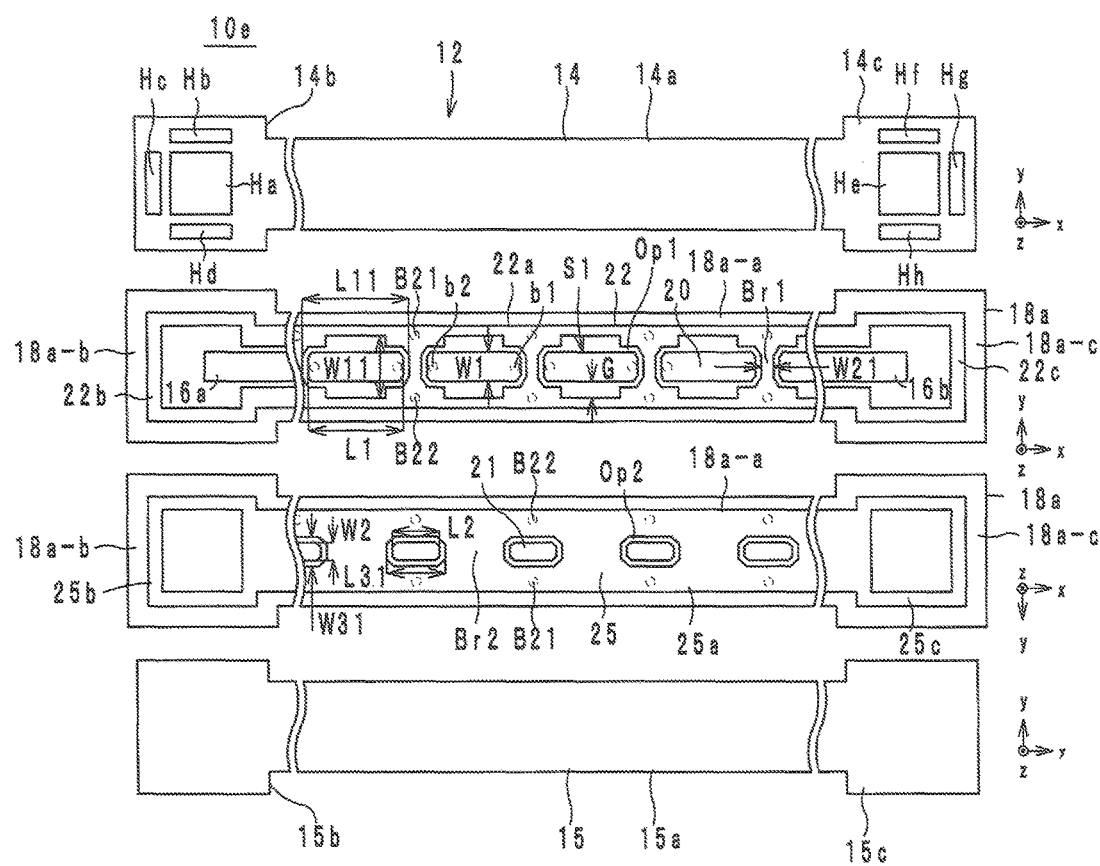
FIG. 16 is an exploded view of a high-frequency signal transmission line according to a first modification of the second preferred embodiment of the present invention.

Next, a high-frequency signal transmission line 10$e$ according to a first modification of the second preferred embodiment of the present invention will be described with reference to a drawing. FIG. 16 is an exploded view of the high-frequency signal transmission line 10$e$ according to the first modification. In FIG. 16, the surface and rear surface of the dielectric sheet 18$a$ are illustrated in array.

Differences between the high-frequency signal transmission line 10$e$ and the high-frequency signal transmission line 10$d$ are the shapes of the line portions 20 and 21 and the shapes of the opening portions Op1 and Op2. More specifically, with the high-frequency signal transmission line 10$e$, a taper is provided near both ends in the x axis direction of the line portion 20 so that the line width gradually decreases. Thus, the line width of the line portion 20 at a portion where the line portion 20 and line portion 21 are connected is narrower than the line width at the center portion in the x axis direction of the line portion 20.

Also, a taper is provided near both ends in the x axis direction of the opening portions Op1 so that the width in the y axis direction gradually decreases. Further, the widths in the y axis direction of the center portion of the opening portions Op1 are wider than the width in the y axis direction a portion other than the center portion of the opening portions Op1.

Also, a taper is provided near both ends in the x axis direction of the line portion 21 so that the line width in the y axis direction gradually decreases. Thus, the line width of the line portion 21 at a portion where the line portion 20 is connected to the line portion 21 is narrower than the line width at the center portion in the x axis direction of the line portion 21.

Also, a taper is provided near both ends in the x axis direction of the opening portions Op2 so that the width in the y axis direction gradually decreases. Thus, the opening portions Op2 have a shape which imitates the line portion 21.

With the high-frequency signal transmission line 10$e$ thus configured, similar to the high-frequency signal transmission line 10a, occurrence of reflection of a high-frequency signal is significantly reduced and prevented between the line portions 20 and 21.

The inventor of the present application created a model of the high-frequency signal transmission line 10e, and studied the passage property and reflection property of the high-frequency signal transmission line 10e, and the directivity of the leakage electromagnetic field of the high-frequency signal transmission line 10e by computer simulation. Hereinafter, conditions for the model used for simulation will be described.

Figure 17:
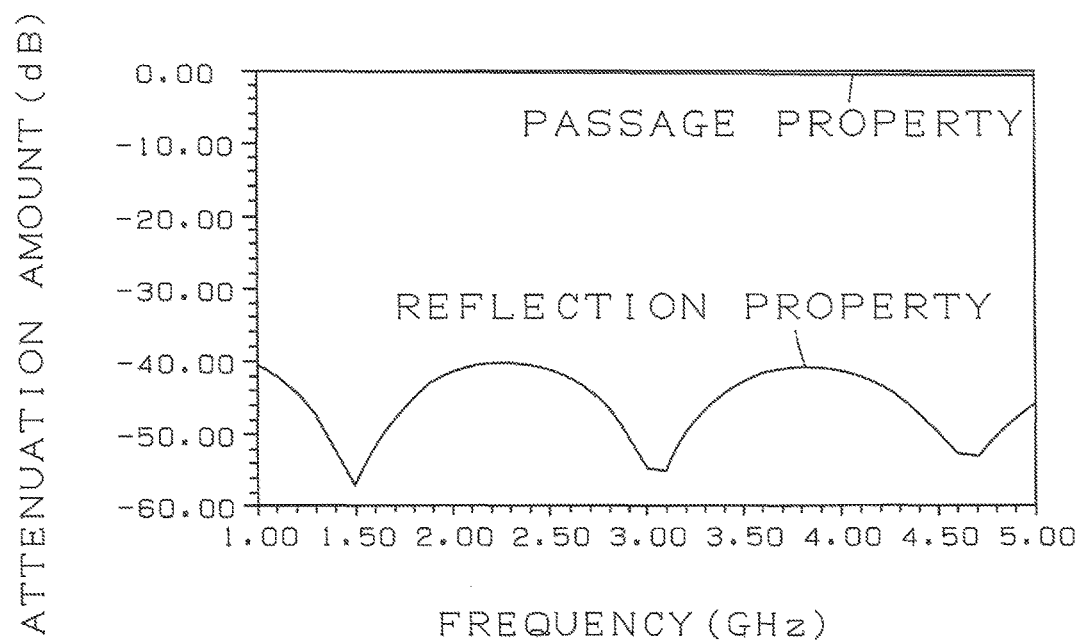
FIG. 17 is a graph illustrating simulation results.

Gap Width G: 200 μm
Line Widths W21 of Bridge Portions Br1: 100 μm
Lengths L11 of Opening Portions Op1: 3 mm
Width W11 of Opening Portions Op1: 100 μm
Lengths L31 of Opening Portions Op2: 0.4 mm
Width W31 of Opening Portions Op2: 400 μm
Line Width W1 of Line Portion 20: 500 μm
Line Width W2 of Line Portion 21: 200 μm
Interval between Line Portion 21 and Ground Conductor 22: 200 μm
Total Length of High-frequency Signal Line 10e: 60 mm FIG. 17 is a graph illustrating simulation results. The vertical axis indicates attenuation amount, and the horizontal axis indicates frequencies. According to FIG. 17, it can be seen that, with the high-frequency signal transmission line 10e, the passage property of a high-frequency signal of 5 GHz is effectively reduced to about −0.2 dB, for example.

Further, according to FIG. 17, with the high-frequency signal transmission line 10e, the reflection property of a high-frequency signal of 1 GHz to 5 GHz is equal to or smaller than about −40 dB, for example. Thus, with the high-frequency signal transmission line 10e, it can be seen that fluctuation of property impedance is effectively reduced with a wide band.

Figure 18A:
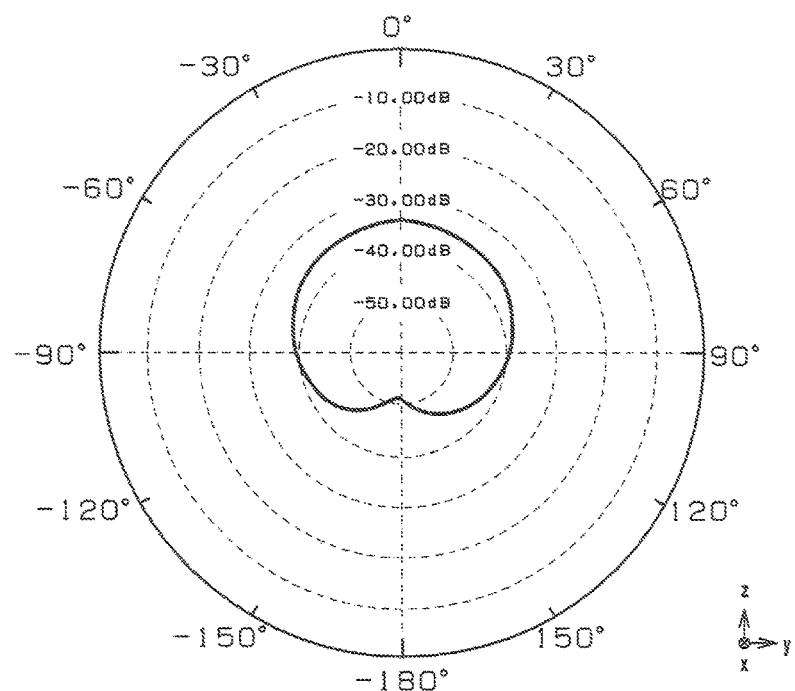
FIGS. 18A and 18B are graphs illustrating simulation results.
Figure 18B:
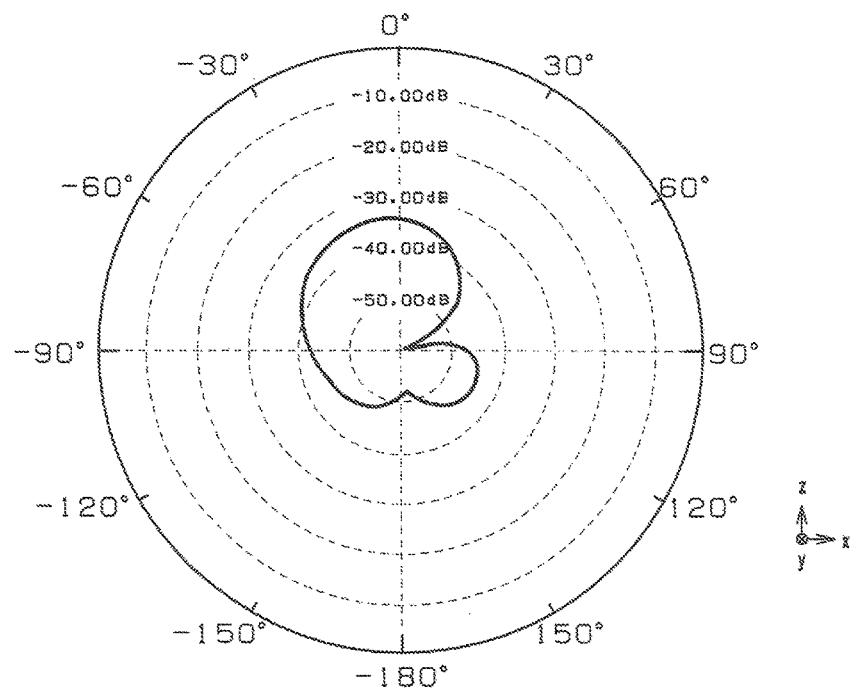

FIGS. 18A and 18B are graphs illustrating simulation results. FIG. 18A is a graph illustrating intensity of an electromagnetic field which the signal line S1 radiates at a cross-section parallel to the z-y plane, and FIG. 18B is a graph illustrating intensity of an electromagnetic field to be radiated from the signal line S1 to out of the high-frequency signal transmission line 10e at a cross-section parallel to the z-x plane.

With the high-frequency signal transmission line 10e, the area of the opening portion Op1 is greater than the area of the opening portion Op2. Therefore, as illustrated in FIGS. 18A and 18B, the intensity of an electromagnetic field to be radiated from the high-frequency signal transmission line 10e to the positive direction side in the z axis direction becomes stronger than the intensity of an electromagnetic field to be radiated from the high-frequency signal transmission line 10e to the negative direction side in the z axis direction. In this way, a distribution of an electromagnetic field to be radiated out of the high-frequency signal transmission line 10e may be adjusted by adjusting the areas of the opening portions Op1 and Op2.

With the high-frequency signal transmission line 10e, the intensity of an electromagnetic field to be radiated from the high-frequency signal transmission line 10e to the negative direction side in the z axis direction is weaker than the intensity of an electromagnetic field to be radiated from the high-frequency signal transmission line 10e to the positive direction side in the z axis direction, and accordingly, it is desirable that articles such as a metal case of a battery pack, a casing, and so forth are disposed on the negative direction side in the z axis direction of the high-frequency signal transmission line 10e. Thus, electromagnetic field coupling of an article and signal line is prevented, and the property impedance of the signal line S1 is prevented from deviating from desired property impedance.

Figure 19:
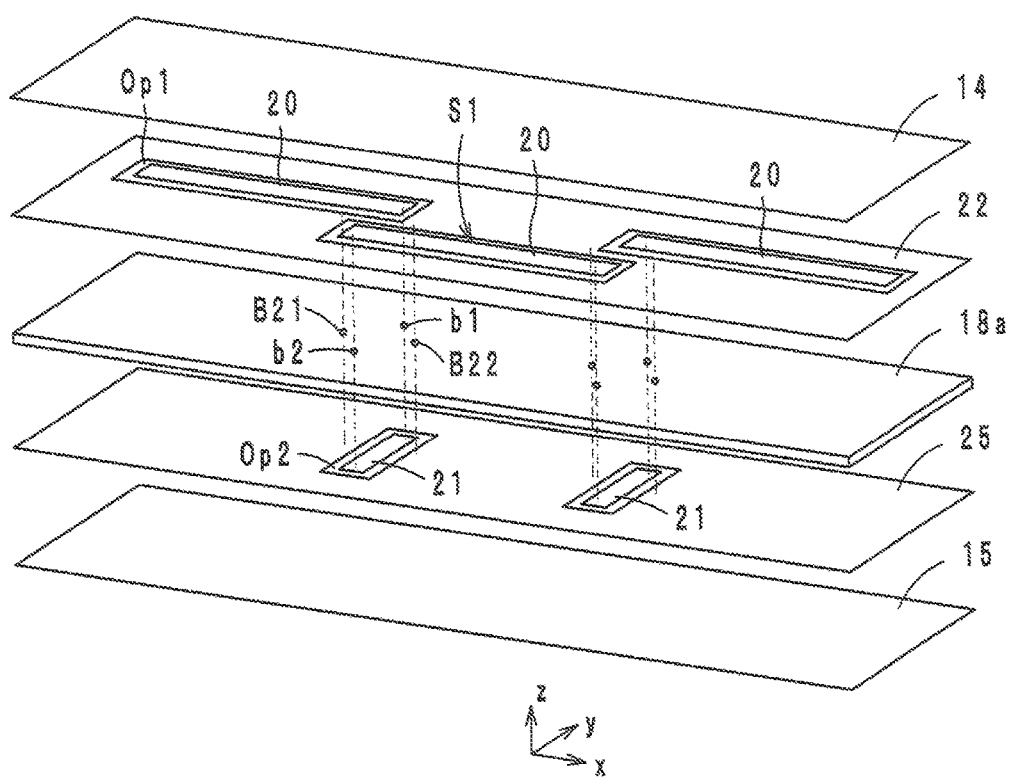
FIG. 19 is an exploded perspective view of a high-frequency signal transmission line according to a second modification of the second preferred embodiment of the present invention.

Next, a high-frequency signal transmission line 10f according to a second modification of the second preferred embodiment of the present invention will be described with reference to a drawing. FIG. 19 is an exploded perspective view of the high-frequency signal transmission line 10f according to the second modification.

Differences between the high-frequency signal transmission line 10f and the high-frequency signal transmission line 10d are the shape of the line portion 21 and the shapes of the opening portions Op2. More specifically, with the high-frequency signal transmission line 10f, the line portion 21 and opening portions Op2 extend in the y axis direction. Thus, the signal line S1 is meandering in planar view from the z axis direction.

Figure 20:
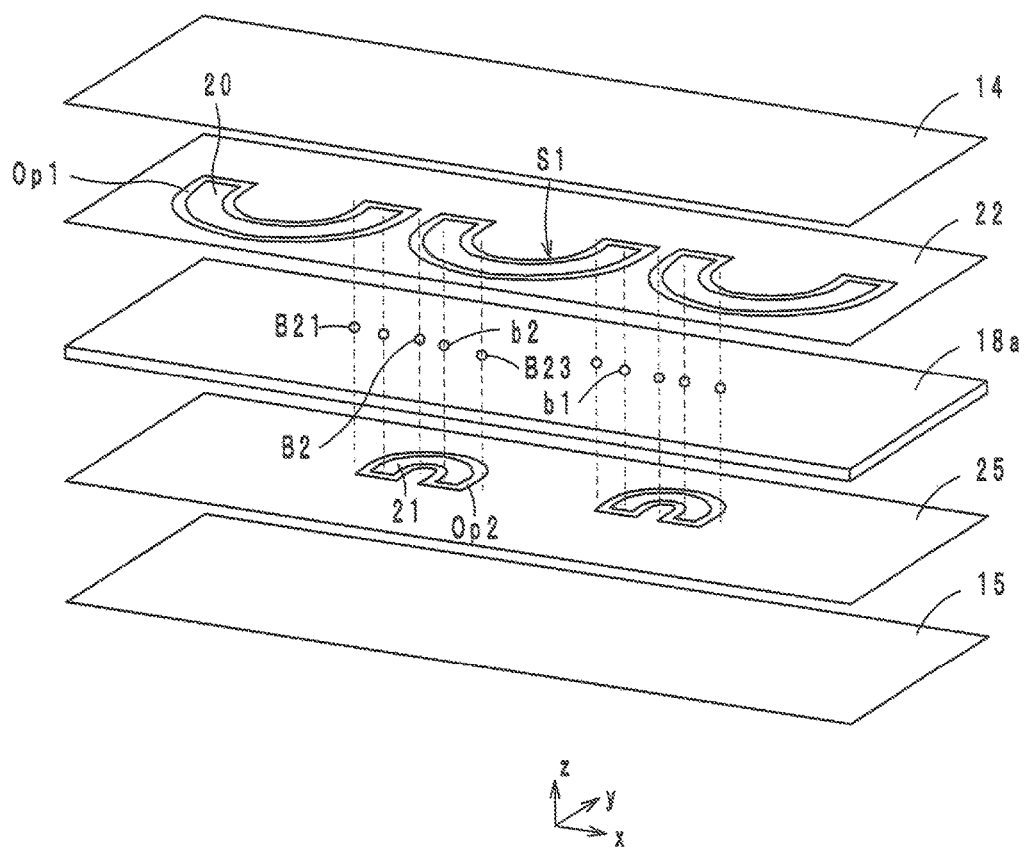
FIG. 20 is an exploded perspective view of a high-frequency signal transmission line according to a third modification of the second preferred embodiment of the present invention.

Next, a high-frequency signal transmission line 10g according to a third modification of the second preferred embodiment of the present invention will be described with reference to a drawing. FIG. 20 is an exploded perspective view of the high-frequency signal transmission line 10g according to the third modification.

Differences between the high-frequency signal transmission line 10g and the high-frequency signal transmission line 10d are the shapes of the line portions 20 and 21 and the shapes of the opening portions Op1 and Op2. More specifically, with the high-frequency signal transmission line 10g, the line portion 20 and opening portions Op1 have an arc shape which protrudes toward the negative direction side in the y axis direction. Also, the line portion 21 and opening portions Op2 have an arc shape which protrudes toward the positive direction side in the y axis direction. Thus, the signal line S1 is meandering in planar view from the z axis direction.

Figure 21:
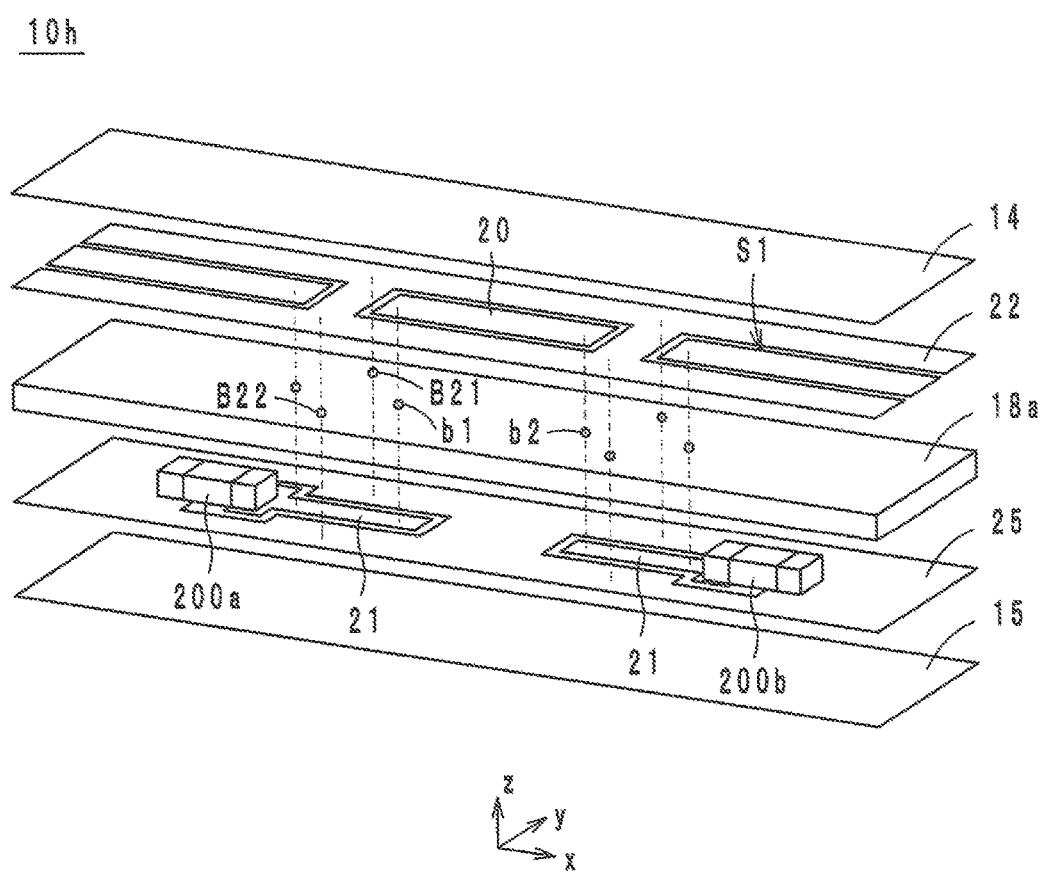
FIG. 21 is an exploded perspective view of a high-frequency signal transmission line according to a fourth modification of the second preferred embodiment of the present invention.

Next, a high-frequency signal transmission line 10h according to a fourth modification of the second preferred embodiment of the present invention will be described with reference to a drawing. FIG. 21 is an exploded perspective view of the high-frequency signal transmission line 10h according to the fourth modification.

A difference between the high-frequency signal transmission line 10h and the high-frequency signal transmission line 10d is in that electronic components 200a and 200b such as a coil, a capacitor, or the like are provided. More specifically, with the high-frequency signal transmission line 10h, the electronic components 200a and 200b have been embedded in the rear surface of the dielectric sheet 18a. The line portion 21 and ground conductor 25 are provided onto the rear surface of the dielectric sheet 18a in which the electronic components 200a and 200b have been embedded. Thus, each of one external electrodes of the electronic components 200a and 200b is connected to the line portion 21, and each of the other external electrodes of the electronic components 200a and 200b is connected to the ground conductor 25.

With the high-frequency signal transmission line 10h thus configured, the electronic components 200a and 200b are mounted onto the ground conductor 25 provided in a transfer sheet shape. The ground conductor 25 and electronic components 200a and 200b are transferred from the transfer sheet to the rear surface of the dielectric sheet 18a.

With the high-frequency signal transmission line 10h, a filter circuit, a phase adjustment circuit, and so forth may be provided within the high-frequency signal transmission line 10h by providing the electronic components 200a and 200b.

Figure 22:
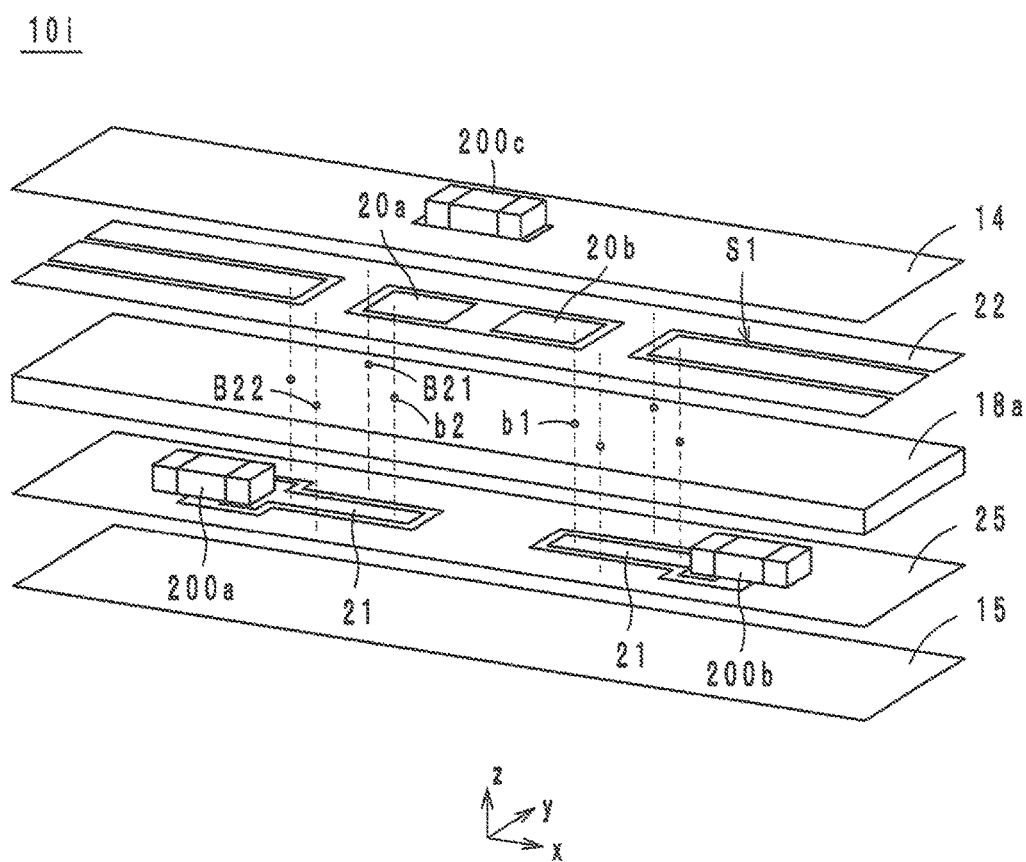
FIG. 22 is an exploded perspective view of a high-frequency signal transmission line according to a fifth modification of the second preferred embodiment of the present invention.

Next, a high-frequency signal transmission line 10*i* according to a fifth modification of the second preferred embodiment of the present invention will be described with reference to a drawing. FIG. 22 is an exploded perspective view of the high-frequency signal transmission line 10*i* according to the fifth modification.

Differences between the high-frequency signal transmission line 10*i* and the high-frequency signal transmission line 10*h* are in that the line portion 20 has been divided into line portions 20*a* and 20*b*, and in that an electronic component 200*c* has been provided in addition to the electronic components 200*a* and 200*b*.

More specifically, with the high-frequency signal transmission line 10*i*, one line portion 20 of the multiple line portions 20 has been divided into the line portions 20*a* and 20*b*. The electronic component 200*c* has been connected to the line portions 20*a* and 20*b*.

Figure 23:
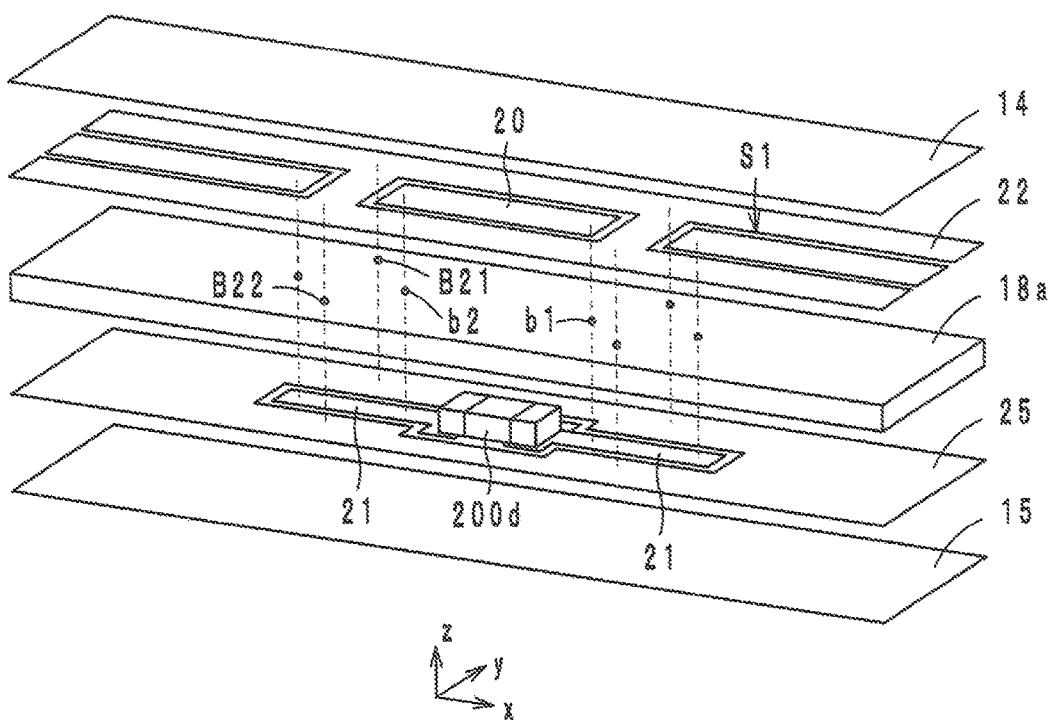
FIG. 23 is an exploded perspective view of a high-frequency signal transmission line according to a sixth modification of the second preferred embodiment of the present invention.
Figure 24:
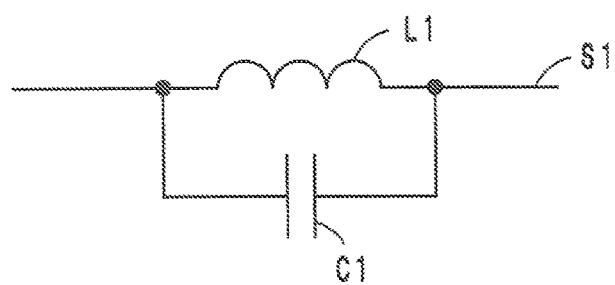
FIG. 24 is an equivalent circuit diagram of the high-frequency signal transmission line in FIG. 23.

Next, a high-frequency signal transmission line 10*j* according to a sixth modification of the second preferred embodiment of the present invention will be described with reference to drawings. FIG. 23 is an exploded perspective view of the high-frequency signal transmission line 10*j* according to the sixth modification. FIG. 24 is an equivalent circuit diagram of the high-frequency signal transmission line 10*j* in FIG. 23.

With the high-frequency signal transmission line 10*j*, as illustrated in FIG. 23, an electronic component 200*d* is further provided. The electronic component 200*d* is a capacitor C1 illustrated in FIG. 24, and provided onto the rear surface of the dielectric sheet 18*a*. The electronic component 200*d* is connected between the adjacent line portions 21. Specifically, one external electrode of the electronic component 200*d* is connected to the end portion on the positive direction side in the x axis direction of the line portion 21 provided on the negative direction side in the x axis direction, and the other external electrode of the electronic component 200*d* is connected to the end portion on the negative direction side in the x axis direction of the line portion 21 provided on the positive direction side in the x axis direction. Thus, the electronic component 200*d* is connected to the line portion 20 in parallel. The line portion 20 may be regarded as being a coil L1 including an inductor component (see FIG. 24). Therefore, the electronic component 200*d* and line portion 20 of the high-frequency signal transmission line 10*j* make up, as illustrated in FIG. 24, a band-pass filter where a capacitor C1 and a coil L1 are connected in parallel.

Note that, as illustrated in FIG. 23, it is desirable that the electronic component 200*d* is disposed so that the longitudinal direction of the electronic component 200*d* agrees with the x axis direction. In the event that the longitudinal direction of the electronic component 200*d* agrees with the x axis direction, the width in the y axis direction of the high-frequency signal transmission line 10*j* may be reduced as compared to a case where the longitudinal direction of the electronic component 200*d* agrees with the y axis direction.

Figure 25:
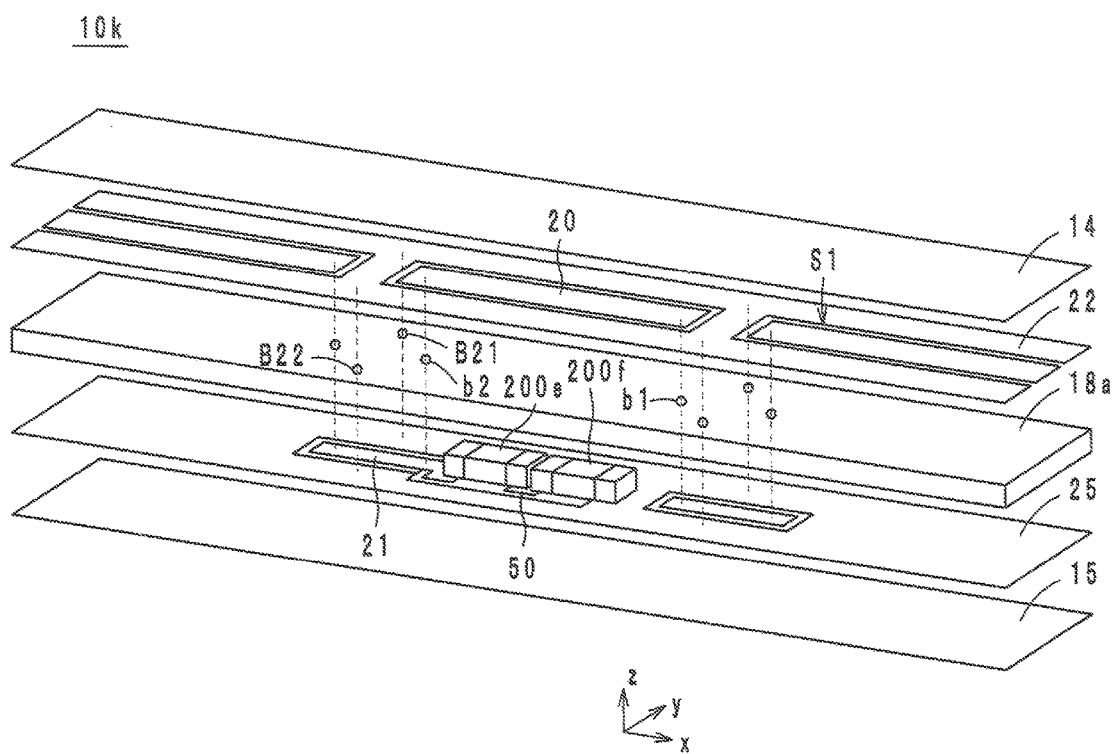
FIG. 25 is an exploded perspective view of a high-frequency signal transmission line according to a seventh modification of the second preferred embodiment of the present invention.
Figure 26:
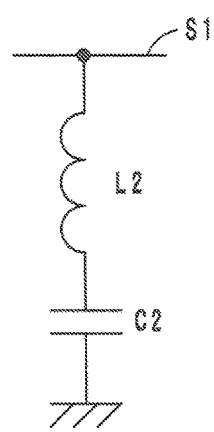
FIG. 26 is an equivalent circuit diagram of the high-frequency signal transmission line in FIG. 25.

Next, a high-frequency signal transmission line 10*k* according to a seventh modification of the second preferred embodiment of the present invention will be described with reference to drawings. FIG. 25 is an exploded perspective view of the high-frequency signal transmission line 10*k* according to the seventh modification. FIG. 26 is an equivalent circuit diagram of the high-frequency signal transmission line 10*k* in FIG. 25.

With the high-frequency signal transmission line 10*k*, as illustrated in FIG. 25, electronic components 200*e* and 200*f* and a connection conductor 50 are further provided. The connection conductor 50 is provided onto the rear surface of the dielectric sheet 18*a*, and is not connected to the signal line 21 and ground conductor 25. The connection conductor 50 serves as a floating potential and is referred to as a floating electrode.

The electronic component 200*e* is a coil L2 illustrated in FIG. 26, and is provided onto the rear surface of the dielectric sheet 18*a*. The electronic component 200*e* is connected between the line portion 21 and connection conductor 50. Specifically, one external electrode of the electronic component 200*e* is connected to the end portion on the positive direction side in the x axis direction of the line portion 21, and the other external electrode of the electronic component 200*e* is connected to the connection conductor 50.

Also, the electronic component 200*f* is a capacitor C2 illustrated in FIG. 26, and is provided onto the rear surface of the dielectric sheet 18*a*. The electronic component 200*f* is connected between the connection conductor 50 and ground conductor 25. Specifically, one external electrode of the electronic component 200*f* is connected to the connection conductor 50, and the other external electrode of the electronic component 200*f* is connected to the ground conductor 25.

With the high-frequency signal transmission line 10*k* thus configured, the electronic components 200*e* and 200*f* provide, as illustrated in FIG. 26, a band rejection filter in which the coil L2 and capacitor C2 are serially connected between the signal line S1 and the ground.

Figure 27:
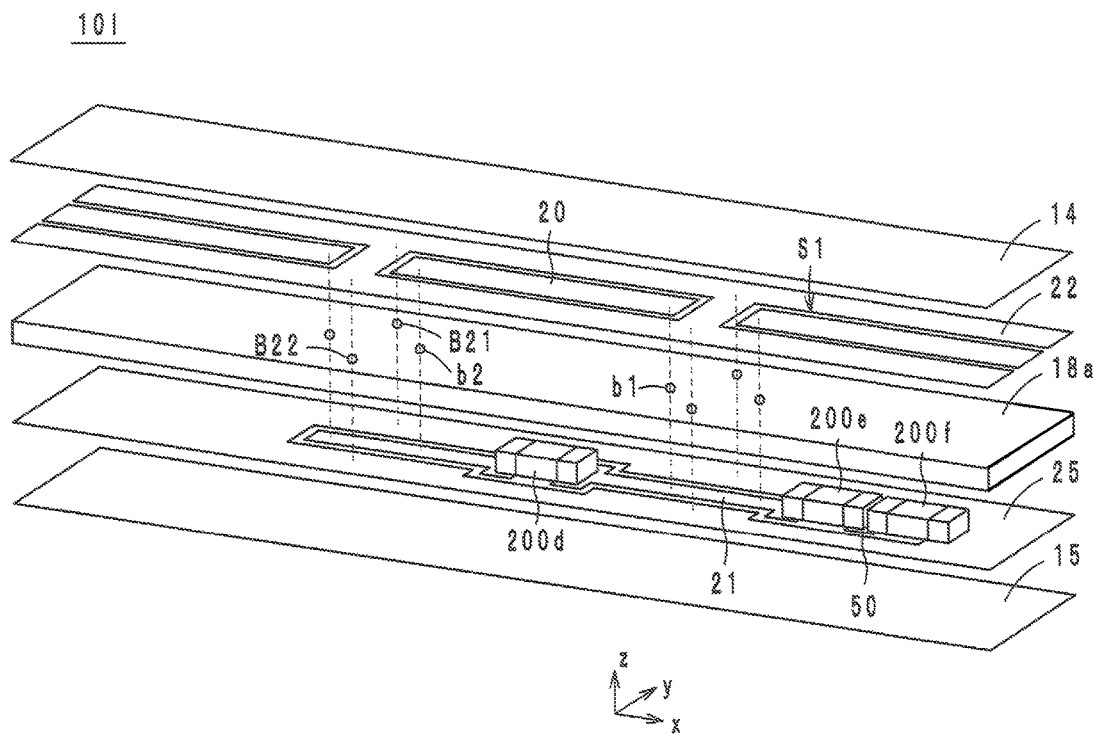
FIG. 27 is an exploded perspective view of a high-frequency signal transmission line according to an eighth modification of the second preferred embodiment of the present invention.
Figure 28:
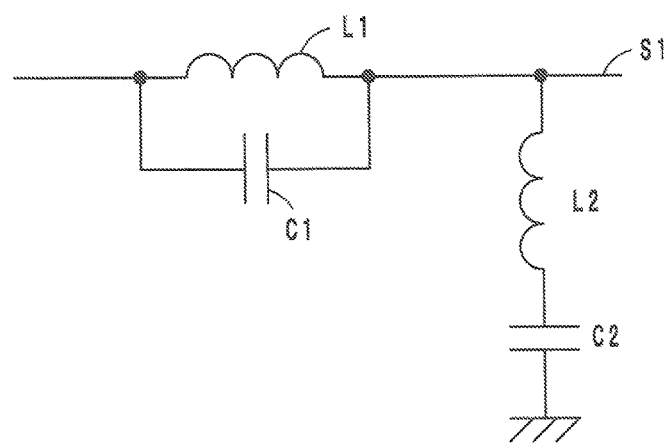
FIG. 28 is an equivalent circuit diagram of the high-frequency signal transmission line in FIG. 27.

Next, a high-frequency signal transmission line 10*l* according to an eighth modification of the second preferred embodiment of the present invention will be described with reference to drawings. FIG. 27 is an exploded perspective view of the high-frequency signal transmission line 10*l* according to the eighth modification. FIG. 28 is an equivalent circuit diagram of the high-frequency signal transmission line 10*l* in FIG. 27.

With the high-frequency signal transmission line 10*l*, as illustrated in FIG. 27, electronic components 200*d*, 200*e*, and 200*f* and a connection conductor 50 are further provided. The electronic components 200*d*, 200*e*, and 200*f* and connection conductor 50 in the high-frequency signal transmission line 10*l* are preferably the same or substantially the same as the electronic components 200*d*, 200*e*, and 200*f* and connection conductor 50 in the high-frequency signal transmission lines 10*j* and 10*k*, and accordingly, description will be omitted. Thus, as illustrated in FIG. 28, the electronic component 200*d* and line portion 20 define a band rejection filter in which the capacitor C1 and coil L1 are connected in parallel, and the electronic components 200*e* and 200*f* define a band rejection filter where the coil L2 and capacitor C2 are serially connected between the signal line S1 and the ground.

Figure 29:
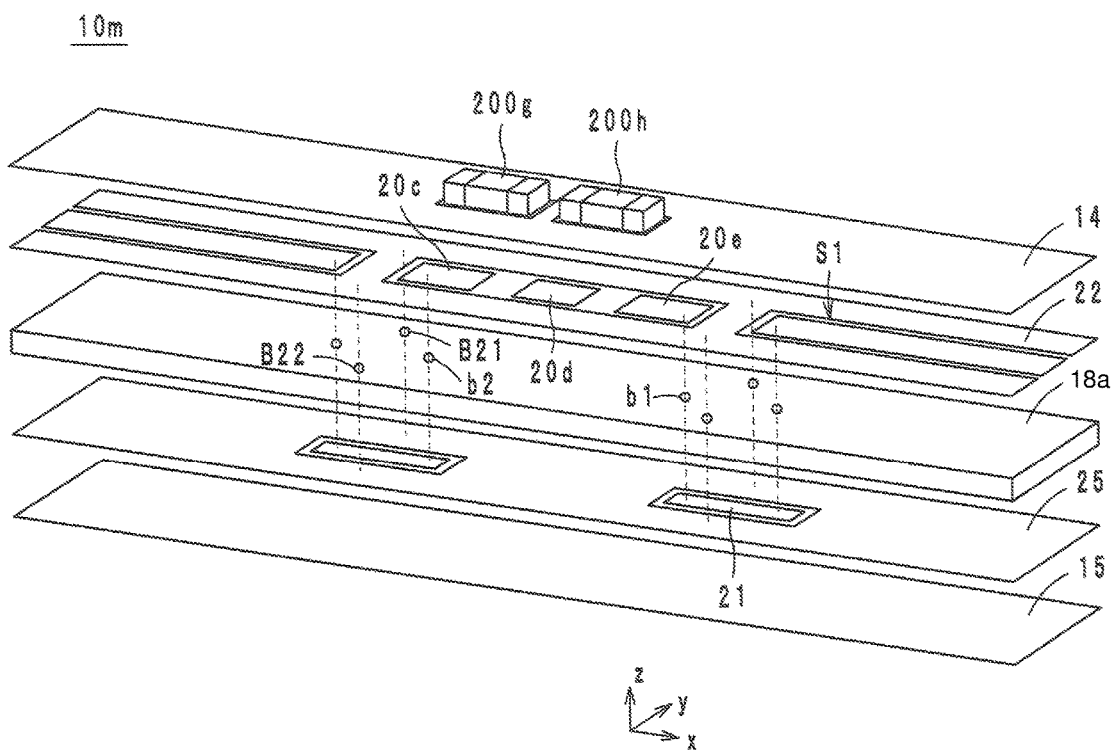
FIG. 29 is an exploded perspective view of a high-frequency signal transmission line according to a ninth modification of the second preferred embodiment of the present invention.
Figure 30:
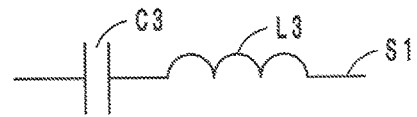
FIG. 30 is an equivalent circuit diagram of the high-frequency signal transmission line in FIG. 29.

Next, a high-frequency signal transmission line 10*m* according to a ninth modification of the second preferred embodiment of the present invention will be described with reference to drawings. FIG. 29 is an exploded perspective view of the high-frequency signal transmission line 10*m* according to the ninth modification. FIG. 30 is an equivalent circuit diagram of the high-frequency signal transmission line 10*m* in FIG. 29.

The high-frequency signal transmission line 10*m* further includes electronic components 200*g* and 200*h*. With the high-frequency signal transmission line 10*m*, one line portion 20 of the multiple line portions 20 has been divided into line portions 20*c*, 20*d*, and 20*e*.

The electronic component 200g is, as illustrated in FIG. 30, a capacitor C3, and is provided onto the surface of the dielectric sheet 18a. Note that an opening is provided to the protection layer 14, and accordingly, the electronic component 200g is externally exposed. The electronic component 200g is connected between the line portions 20c and 20d. Specifically, one external electrode of the electronic component 200g is connected to the end portion on the positive direction side in the x axis direction of the line portion 20c, and the other external electrode of the electronic component 200g is connected to the end portion on the negative direction side in the x axis direction of the line portion 20d.

The electronic component 200h is, as illustrated in FIG. 30, a capacitor L3, and is provided onto the surface of the dielectric sheet 18a. Note that an opening is provided to the protection layer 14, and accordingly, the electronic component 200h is externally exposed. The electronic component 200h is connected between the line portions 20d and 20e. Specifically, one external electrode of the electronic component 200h is connected to the end portion on the positive direction side in the x axis direction of the line portion 20d, and the other external electrode of the electronic component 200h is connected to the end portion on the negative direction side in the x axis direction of the line portion 20e.

Thus, the electronic components 200g and 200h are serially connected to the line portion 20. Therefore, the electronic components 200g and 200h of the high-frequency signal transmission line 10m define, as illustrated in FIG. 30, a band-pass filter in which the capacitor C3 and coil L3 are serially connected on the signal line S1.

Figure 31:
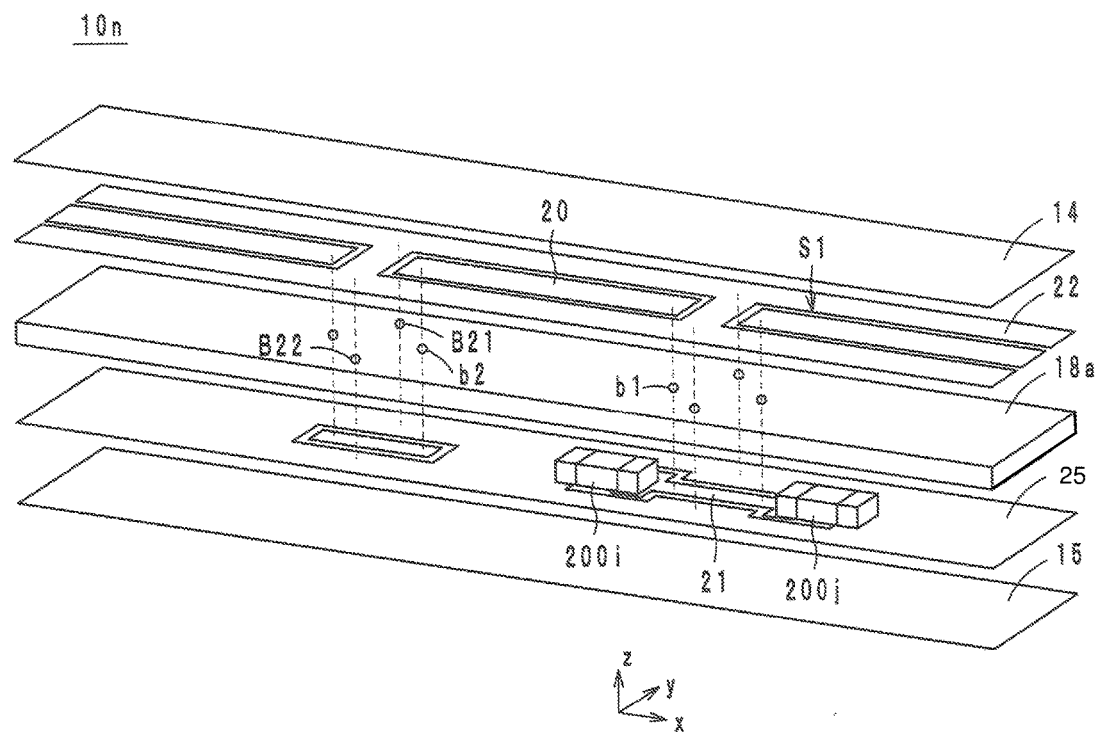
FIG. 31 is an exploded perspective view of a high-frequency signal transmission line according to a tenth modification of the second preferred embodiment of the present invention.
Figure 32:
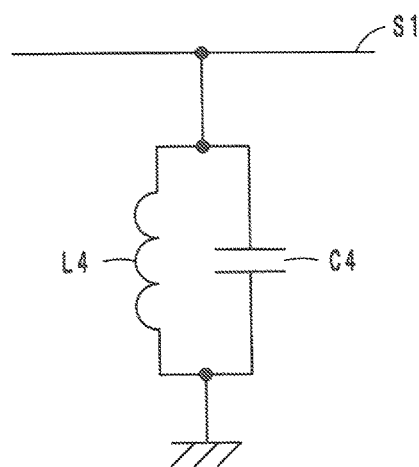
FIG. 32 is an equivalent circuit diagram of the high-frequency signal transmission line in FIG. 31.

Next, a high-frequency signal transmission line 10n according to a tenth modification of the second preferred embodiment of the present invention will be described with reference to drawings. FIG. 31 is an exploded perspective view of the high-frequency signal transmission line 10n according to the tenth modification. FIG. 32 is an equivalent circuit diagram of the high-frequency signal transmission line 10n in FIG. 31.

The high-frequency signal transmission line 10n further includes, as illustrated in FIG. 31, electronic components 200i and 200j. The electronic component 200i is a coil L4 illustrated in FIG. 32, and is provided onto the rear surface of the dielectric sheet 18a. The electronic component 200i is connected between the line portion 21 and the ground conductor 25. Specifically, one external electrode of the electronic component 200i is connected to the end portion on the negative direction side in the x axis direction of the line portion 21, and the other external electrode of the electronic component 200i is connected to the ground conductor 25. Thus, the electronic component 200i is connected between the signal line S1 and the ground.

Also, the electronic component 200j is a capacitor C4 illustrated in FIG. 32, and is provided onto the rear surface of the dielectric sheet 18a. The electronic component 200j is connected between the line portion 21 and the ground conductor 25. Specifically, one external electrode of the electronic component 200j is connected to the end portion on the positive direction side in the x axis direction of the line portion 21, and the other external electrode of the electronic component 200j is connected to the ground conductor 25. Thus, the electronic component 200j is connected to the electronic component 200i in parallel, and also connected between the signal line S1 and the ground.

With the high-frequency signal transmission line 10n as described above, the electronic components 200i and 200j define, as illustrated in FIG. 32, a band-pass filter in which the capacitor C4 and coil L4 are connected in parallel.

Figure 33:
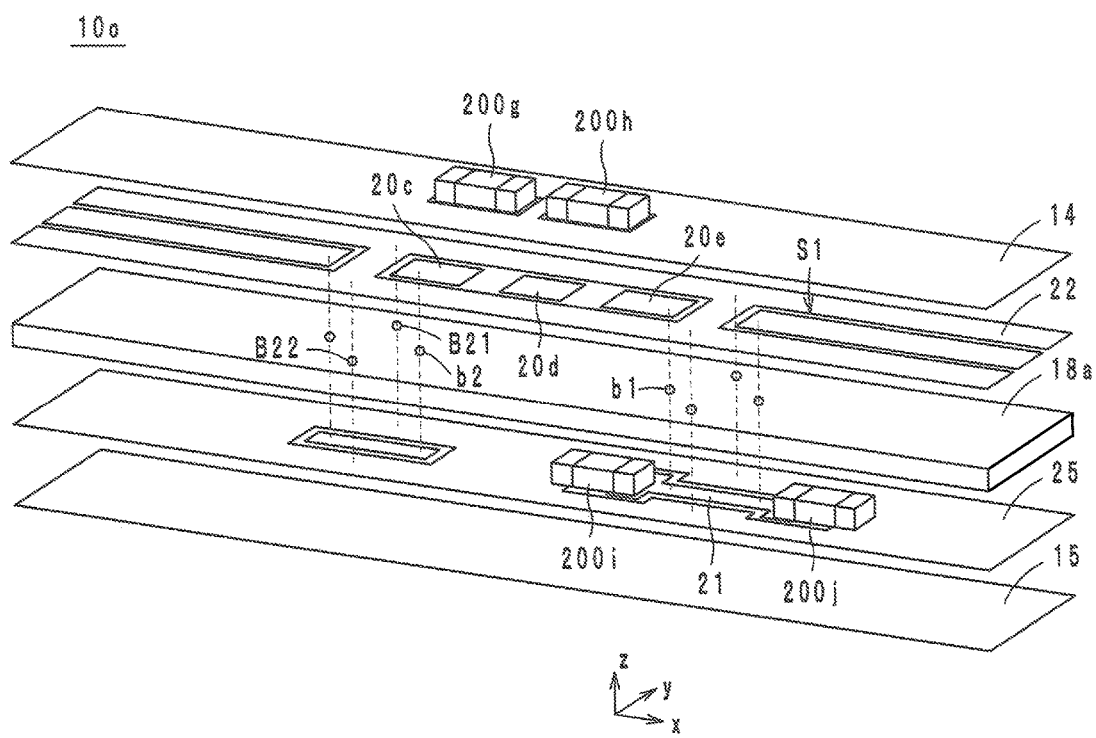
FIG. 33 is an exploded perspective view of a high-frequency signal transmission line according to an eleventh modification of the second preferred embodiment of the present invention.
Figure 34:
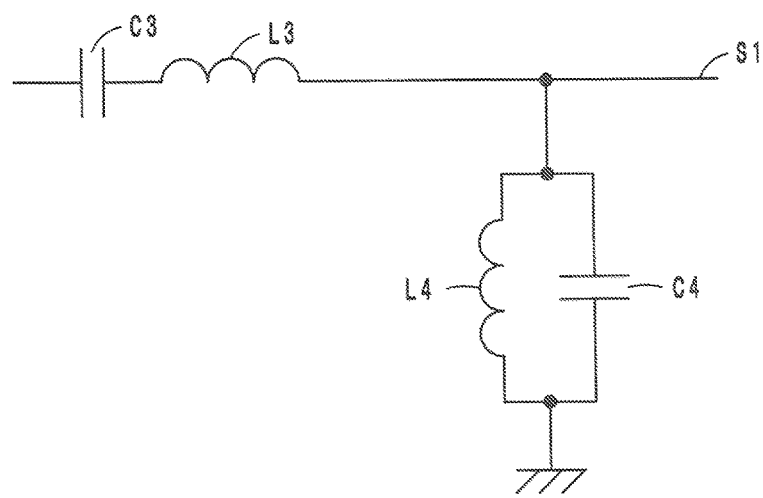
FIG. 34 is an equivalent circuit diagram of the high-frequency signal transmission line in FIG. 33.

Next, a high-frequency signal transmission line 10o according to an eleventh modification of the second preferred embodiment of the present invention will be described with reference to drawings. FIG. 33 is an exploded perspective view of the high-frequency signal transmission line 10o according to the eleventh modification. FIG. 34 is an equivalent circuit diagram of the high-frequency signal transmission line 10o in FIG. 33.

With the high-frequency signal transmission line 10o, as illustrated in FIG. 33, electronic components 200g, 200h, 200i, and 200j are further provided. The electronic components 200g, 200h, 200i, and 200j in the high-frequency signal transmission line 10o preferably are the same or substantially the same as the electronic components 200g, 200h, 200i, and 200j in the high-frequency signal transmission lines 10m and 10n, and accordingly, description will be omitted. Thus, as illustrated in FIG. 34, the electronic components 200g and 200h define a band-pass filter in which the capacitor C3 and coil L3 are serially connected, and the electronic components 200i and 200j define a band-pass filter where the coil L4 and capacitor C4 are connected between the signal line S1 and the ground in parallel.

Figure 35:
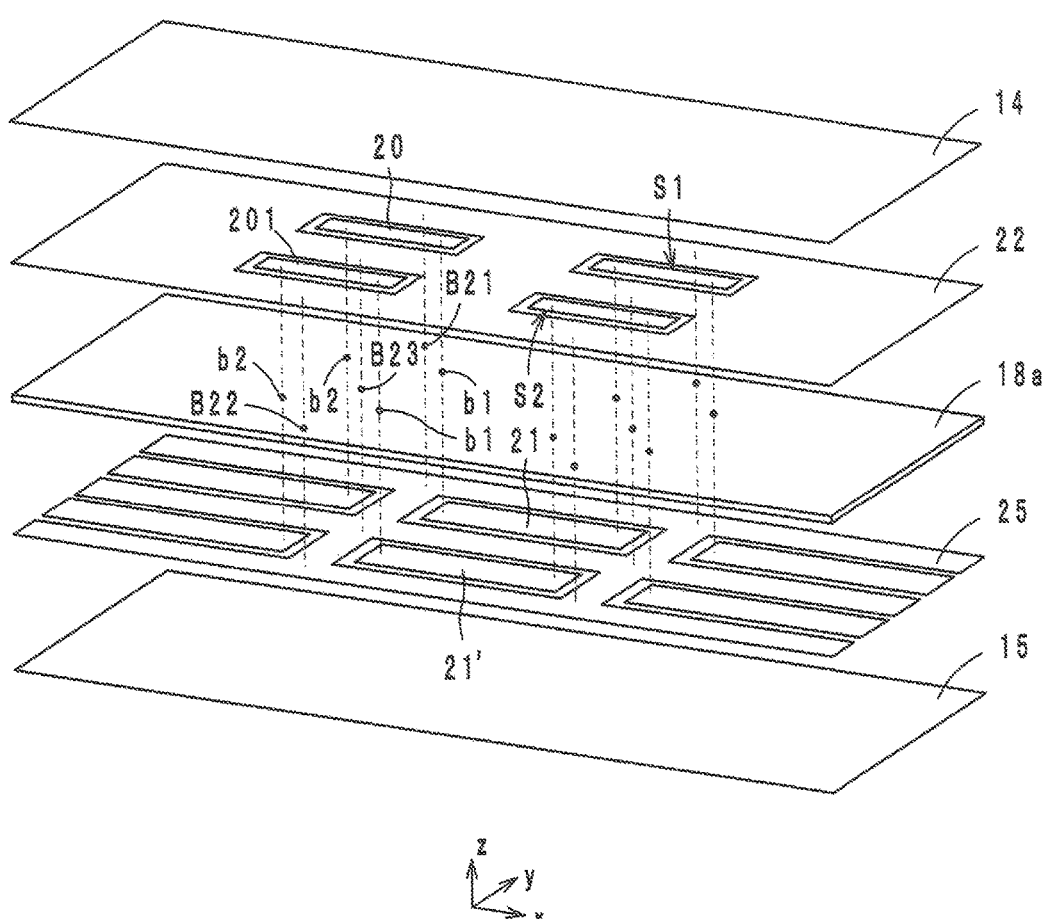
FIG. 35 is an exploded perspective view of a high-frequency signal transmission line according to a twelfth modification of the second preferred embodiment of the present invention.

Next, a high-frequency signal transmission line 10p according to a twelfth modification of the second preferred embodiment of the present invention will be described with reference to a drawing. FIG. 35 is an exploded perspective view of the high-frequency signal transmission line 10p according to the twelfth modification.

As illustrated in the high-frequency signal transmission line 10p, multiple signal lines S1 and S2 may be provided. Thus, balance transmission, and parallel transmission of high-speed digital signals may be performed using the high-frequency signal transmission line 10p.

Figure 36A:
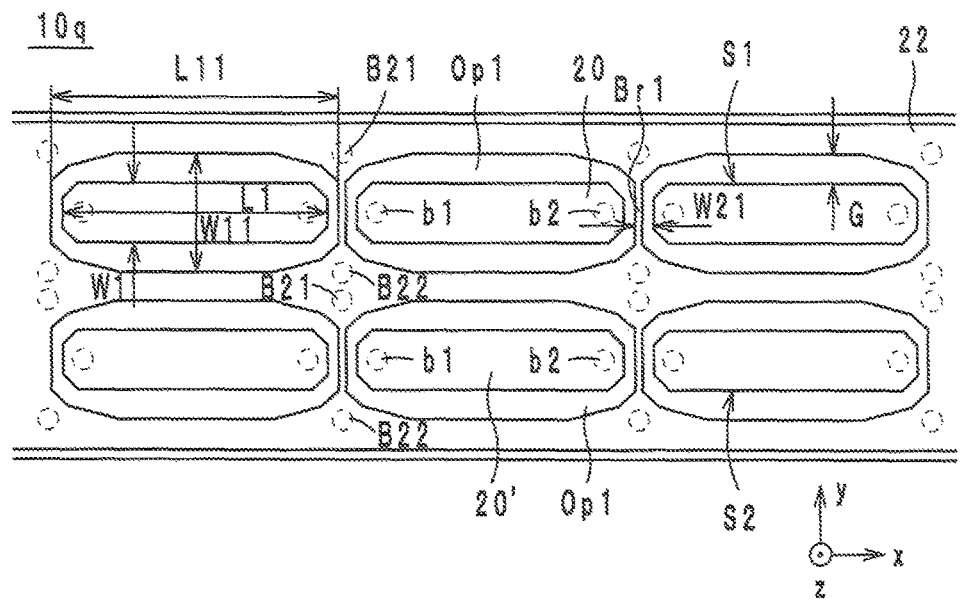
FIGS. 36A and 36B are planar views of a high-frequency signal transmission line according to a thirteenth modification of the second preferred embodiment of the present invention.
Figure 36B:
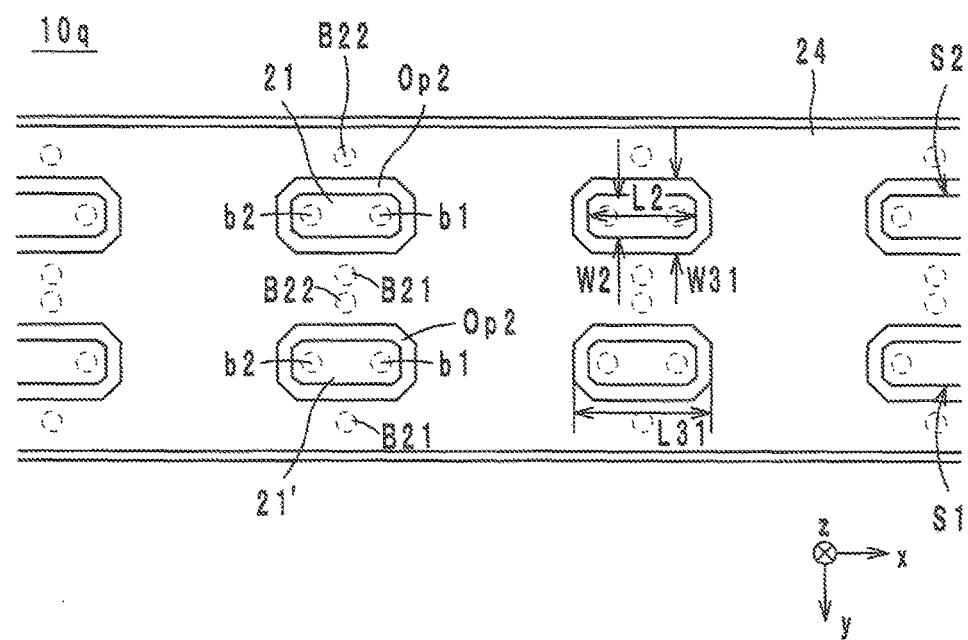

Next, a high-frequency signal transmission line 10q according to a thirteenth modification of the second preferred embodiment of the present invention will be described with reference to drawings. FIGS. 36A and 36B are planar views of the high-frequency signal transmission line 10q according to the thirteenth modification.

Differences between the high-frequency signal transmission lines 10q and 10p are the shapes of the line portions 20, 20', 21, and 21' and the shapes of the opening portions Op1 and Op2. More specifically, with the high-frequency signal transmission line 10q, a taper is provided near both ends in the x axis direction of the line portions 20, 20', 21, and 21' so that the line width gradually decreases.

Thus, the line widths of the line portions 20 and 20' in a portion where the line portions 20 and 20' are connected to the line portions 21 and 21' is narrower than the line widths at the center portion in the x axis direction of the line portions 21 and 21'. Similarly, the line widths of the line portions 21 and 21' in a portion where the line portions 20 and 20' are connected to the line portions 21 and 21' is narrower than the line widths at the center portion in the x axis direction of the line portions 21 and 21'.

Also, a taper is provided near both ends in the x axis direction of the opening portions Op1 and Op2 so that the line widths in the y axis direction gradually decrease. Thus, the opening portions Op1 and Op2 have shapes which imitate the line portions 20 and 20', and 21 and 21', respectively.

With the high-frequency signal transmission line thus configured, similar to the high-frequency signal transmission line 10a, occurrence of reflection of a high-frequency signal is significantly reduced and prevented between the line portions 20 and 21 and between the line portions 20' and 21'.

The inventor of the present application created a model of the high-frequency signal transmission line 10*q*, and studied the passage property, reflection property, and isolation property of the high-frequency signal transmission line 10*q* by computer simulation. Hereinafter, conditions for the model used for simulation will be described.

Figure 37A:
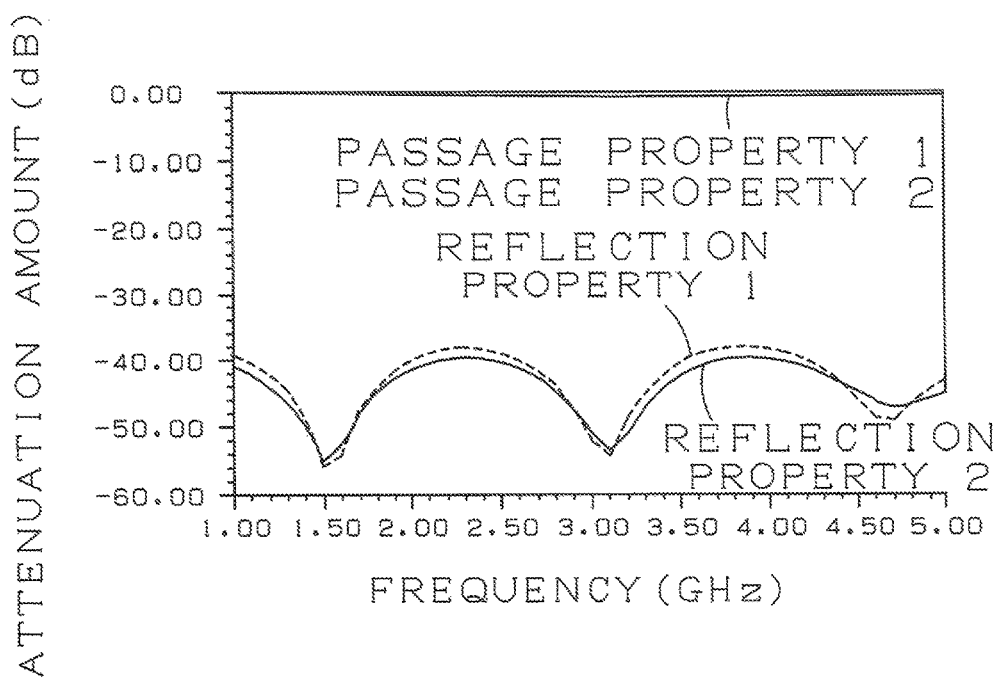
FIGS. 37A and 37B are graphs illustrating simulation results.
Figure 37B:
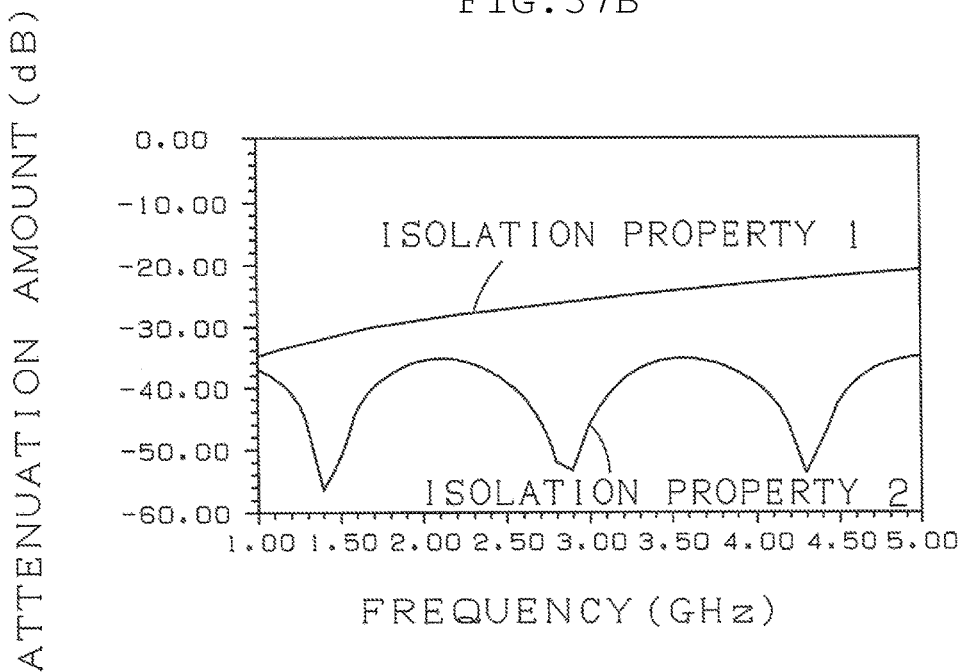

Gap Width G: 200 μm
Line Widths W21 of Bridge Portions Br1: 100 μm
Lengths L11 of Opening Portions Op1: 3 mm
Width W11 of Opening Portions Op1: 900 μm
Lengths L31 of Opening Portions Op2: 0.4 mm
Width W31 of Opening Portions Op2: 400 μm
Line Width W1 of Line Portion 20: 500 μm
Line Width W2 of Line Portion 21: 200 μm
Interval between Line Portion 21 and Ground Conductor 22: 200 μm
Interval between Line Portion 21 and Ground Conductor 24: 100 μm
Total Length of High-frequency Signal Line 10*q*: 60 mm FIGS. 37A and 37B are graphs illustrating simulation results. FIG. 37A illustrates passage property 1, passage property 2, reflection property 1, and reflection property 2. FIG. 37B illustrates isolation property 1 and isolation property 2. The vertical axis indicates attenuation amount, and the horizontal axis indicates frequencies.

Passage property 1 indicates an intensity ratio of a signal output from the end portion on the positive direction side in the x axis direction of the signal line S1 against a signal input from the end portion on the negative direction side in the x axis direction of the signal line S1. Passage property 2 indicates an intensity ratio of a signal output from the end portion on the positive direction side in the x axis direction of the signal line S2 against a signal input from the end portion on the negative direction side in the x axis direction of the signal line S2. Reflection property 1 indicates an intensity ratio of a signal output from the end portion on the negative direction side in the x axis direction of the signal line S1 against a signal input from the end portion on the negative direction side in the x axis direction of the signal line S1. Reflection property 2 indicates an intensity ratio of a signal output from the end portion on the negative direction side in the x axis direction of the signal line S2 against a signal input from the end portion on the negative direction side in the x axis direction of the signal line S2.

Isolation property 1 indicates an intensity ratio of a signal output from the end portion on the positive direction side in the x axis direction of the signal line S2 against a signal input from the end portion on the negative direction side in the x axis direction of the signal line S1. Isolation property 2 indicates an intensity ratio of a signal output from the end portion on the negative direction side in the x axis direction of the signal line S2 against a signal input from the end portion on the negative direction side in the x axis direction of the signal line S1.

According to FIG. 37A, it can be seen that the passage property and reflection property of the high-frequency signal transmission line 10*q* including the two signal lines S1 and S2 are similar to the passage property and reflection property of the high-frequency signal transmission line 10*e* including the one signal lines S1.

Also, according to FIG. 37B, it can be seen that the high-frequency signal transmission line 10*q* has an excellent isolation property. Thus, it can be seen that confining a high-frequency signal in the y axis direction has excellently been performed at the high-frequency signal transmission line 10*q*.

Note that, with the high-frequency signal transmission line 10*q*, the two signal lines S1 and S2 are preferably provided, for example, but three or more signal lines may be provided.

Figure 38:
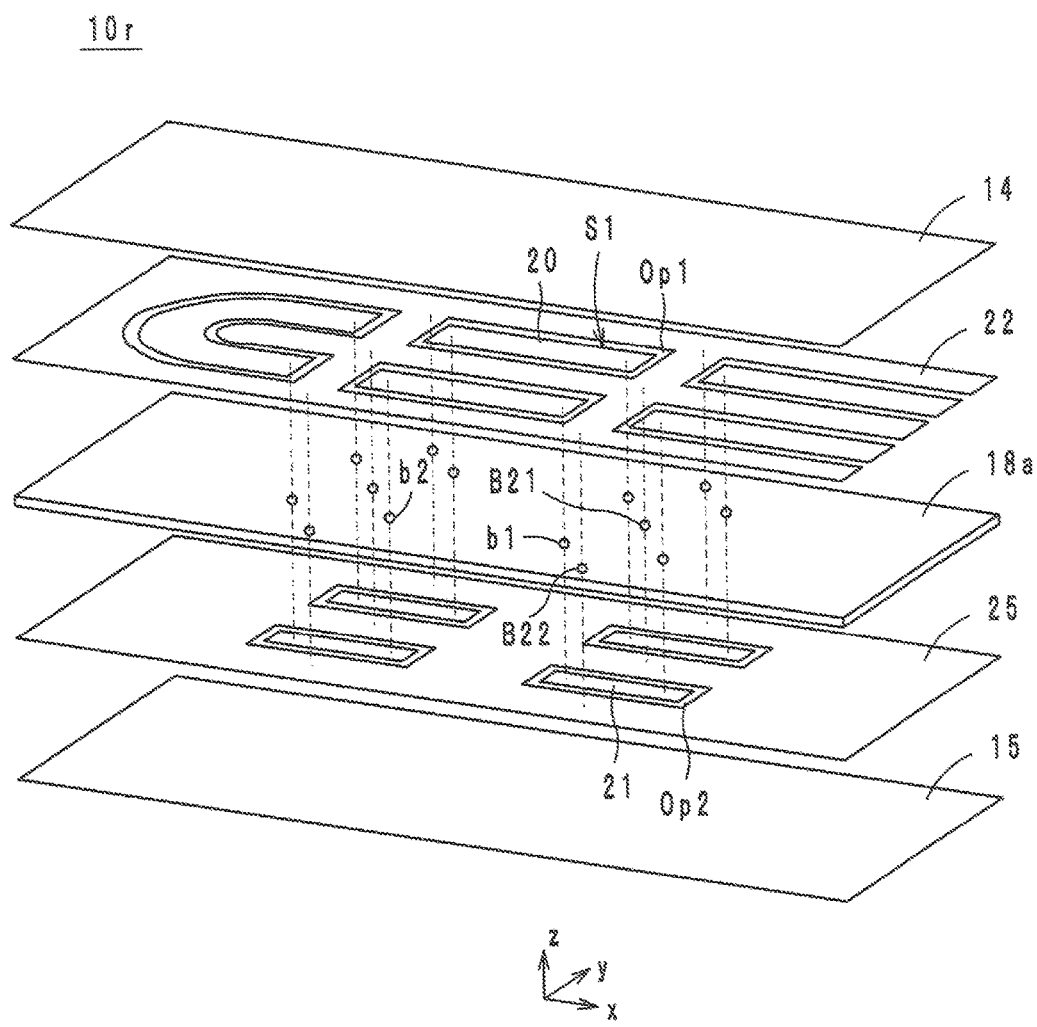
FIG. 38 is an exploded perspective view of a high-frequency signal transmission line according to a fourteenth modification of the second preferred embodiment of the present invention.

Next, a high-frequency signal transmission line 10*r* according to a fourteenth modification of the second preferred embodiment of the present invention will be described with reference to a drawing. FIG. 38 is an exploded perspective view of the high-frequency signal transmission line 10*r* according to the fourteenth modification.

As with the high-frequency signal transmission line 10*r* in FIG. 38, the signal line S1 may be bent in a U-letter shape in planar view from the z axis direction.

Thus, the signal line S1 may be bent without bending the high-frequency signal transmission line 10*r*. Accordingly, the necessity to use the high-frequency signal transmission line 10*r* by bending this may be reduced. As a result thereof, the electric properties of the signal line S1 are prevented from fluctuating by the high-frequency signal transmission line 10*r* being bent. However, this does not hinder the high-frequency signal transmission line 10*r* from being used after bending thereof.

Figure 39:
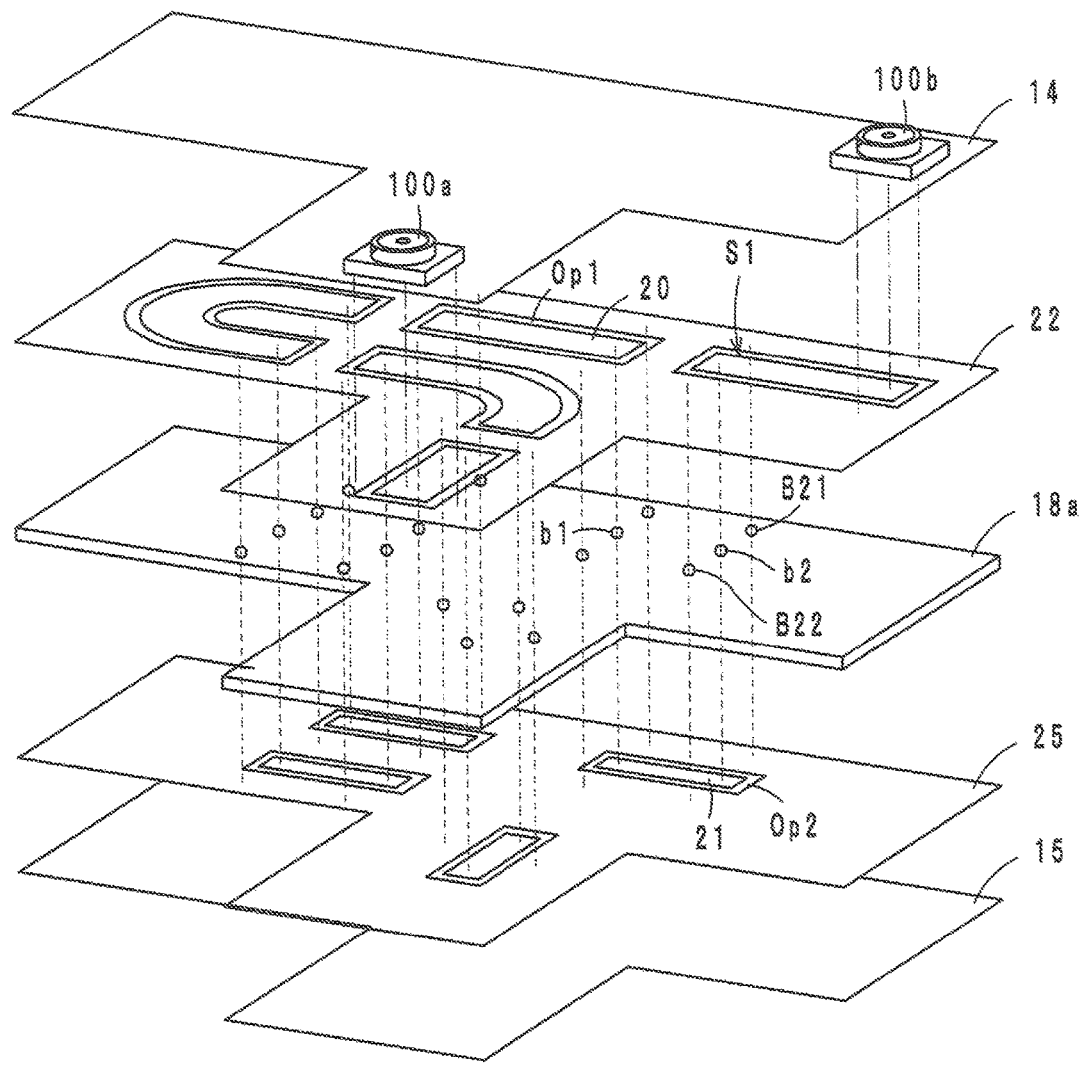
FIG. 39 is an exploded perspective view of a high-frequency signal transmission line according to a fifteenth modification of the second preferred embodiment of the present invention.

Next, a high-frequency signal transmission line 10*s* according to a fifteenth modification of the second preferred embodiment of the present invention will be described with reference to a drawing. FIG. 39 is an exploded perspective view of the high-frequency signal transmission line 10*s* according to the fifteenth modification.

As with the high-frequency signal transmission line 10*s* in FIG. 39, the signal line S1 may have a T-letter shape in planar view from the z axis direction.

Thus, the signal line S1 may be bent without bending the high-frequency signal transmission line 10*s*. Accordingly, the necessity to use the high-frequency signal transmission line 10*s* by bending thereof may be reduced. As a result thereof, the electric properties of the signal line S1 are prevented from fluctuating by the high-frequency signal transmission line 10*s* being bent. However, this does not hinder the high-frequency signal transmission line 10*s* from being used after bending thereof.

Figure 40:
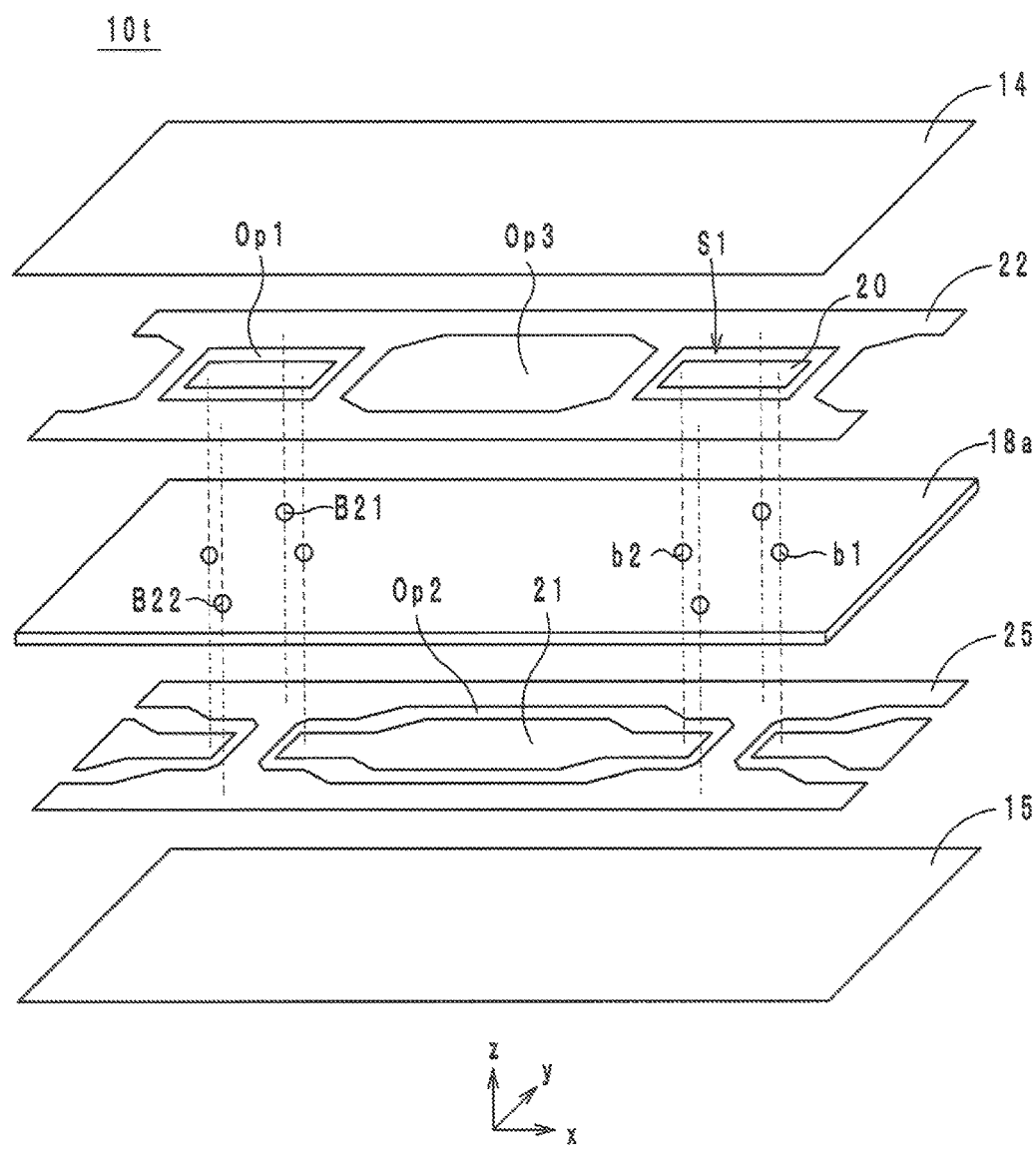
FIG. 40 is an exploded perspective view of a high-frequency signal transmission line according to a sixteenth modification of the second preferred embodiment of the present invention.
Figure 41:
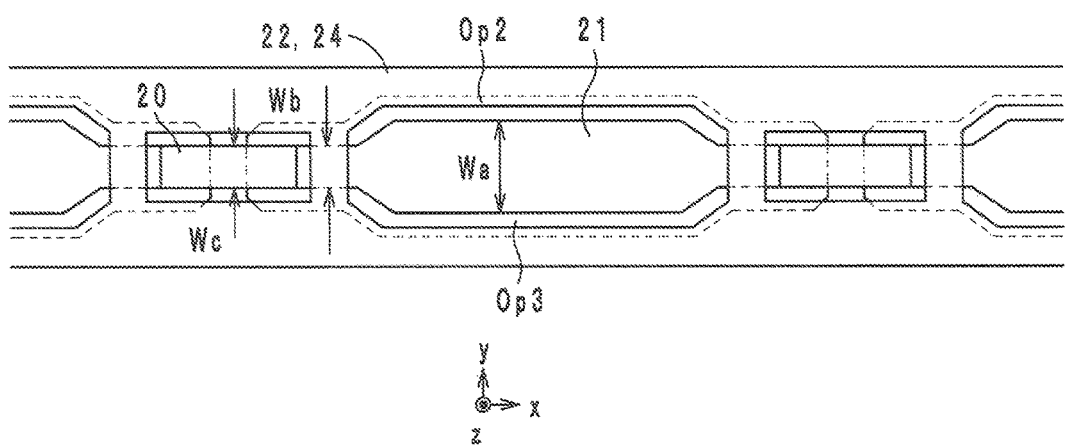
FIG. 41 is a diagram of a signal line and a ground conductor of the high-frequency signal transmission line in FIG. 40 in planar view from the z axis direction.

Next, a high-frequency signal transmission line 10*t* according to a sixteenth modification of the second preferred embodiment of the present invention will be described with reference to drawings. FIG. 40 is an exploded perspective view of the high-frequency signal transmission line 10*t* according to the sixteenth modification. FIG. 41 is a diagram of the signal line S1 and ground conductors 22 and 24 of the high-frequency signal transmission line 10*t* in FIG. 40 in planar view from the z axis direction.

The high-frequency signal transmission line 10*t* differs from the high-frequency signal transmission line 10*d* in that opening portions Op3 which are overlaid with the line portion 21 in planar view from the normal direction (z axis direction) of the principal surface of the body 12 are provided to the ground conductor 22. More specifically, with the ground conductor 22, the opening portions Op3 including no conductor are provided between the adjacent opening portions Op1 in the x axis direction. A taper is provided near both ends in the x axis direction of the opening portions Op3 so that the widths in the y axis direction gradually decrease.

Also, the line portion 21 is overlaid with the opening portions Op3 in planar view from the z axis direction. Line width Wa of a portion where the line portion 21 is overlaid with the opening portions Op3 is wider than line width Wb of a portion where the line portion 21 is overlaid with the ground conductor 22 (i.e., a portion not overlaid with the opening portions Op3) and line width We of the line portion 20. Further, a taper is provided near both ends in the x axis direction of the portion where the line portion 21 is overlaid with the opening portions Op3 so that the line width gradually decreases. Thus, the opening portions Op3 has a shape which imitates the line portion 20.

With the high-frequency signal transmission line 10t thus configured, a reduction in the thickness of the body 12 is realized. More specifically, the opening portions Op3 overlaid with the line portion 21 in planar view from the z axis direction are provided to the ground conductor 22. Thus, less capacitance is generated between the line portion 21 and the ground conductor 22. Therefore, even when reducing an interval in the z axis direction between the line portion 21 and the ground conductor 22, the property impedance of the line portion 21 is prevented from excessively decreasing. As a result thereof, reduction in the thickness of the body 12 may be realized while maintaining the property impedance of the signal line S1 at a predetermined property impedance.

Further, with the high-frequency signal transmission line 10t, less capacitance is generated between the line portion 21 and the ground conductor 22, and accordingly, the line width Wa of the portion where the line portion 21 is overlaid with the opening portions Op3 may be increased. Thus, reduction in the high-frequency resistance of the signal line S1 is realized.

Also, as illustrated in FIG. 41, the opening portions Op2 and Op3 are overlaid. The size of the opening portion Op3 is greater than the size of the opening portion Op2. More specifically, the width in the y axis direction of the opening portion Op3 is greater than the width in the y axis direction of the opening portion Op2. Thus, the opening portion Op3 is embraced in the opening portion Op2. Therefore, even when deviation occurs on positional relationship between the opening portions Op2 and Op3 at the time of manufacturing the high-frequency signal transmission line 10t, the opening portion Op3 is prevented from deviating from the opening portion Op2. As a result thereof, the value of capacitance to be generated between the ground conductors 22 and 24 is prevented from significantly fluctuating, and the property impedance of the signal line S1 is prevented from deviating from the desired property impedance.

Also, when current flows into the line portions 20 and 21, feedback current flows into the ground conductors 22 and 25. Though the feedback current which flows into the ground conductors 22 and 25 flows around the circumference of the opening portions Op1, Op2, and Op3 due to skin effects, insertion loss deteriorates when the current flows into a position where the ground conductors 22 and 25 are overlaid in z axis direction. With the high-frequency signal transmission line 10t, the size of the opening portion Op3 is greater than the size of the opening portion Op2, and accordingly, a position where feedback current flows is hardly overlaid in the thickness direction. Thus, deterioration in insertion loss is effectively reduced and prevented.

Figure 42:
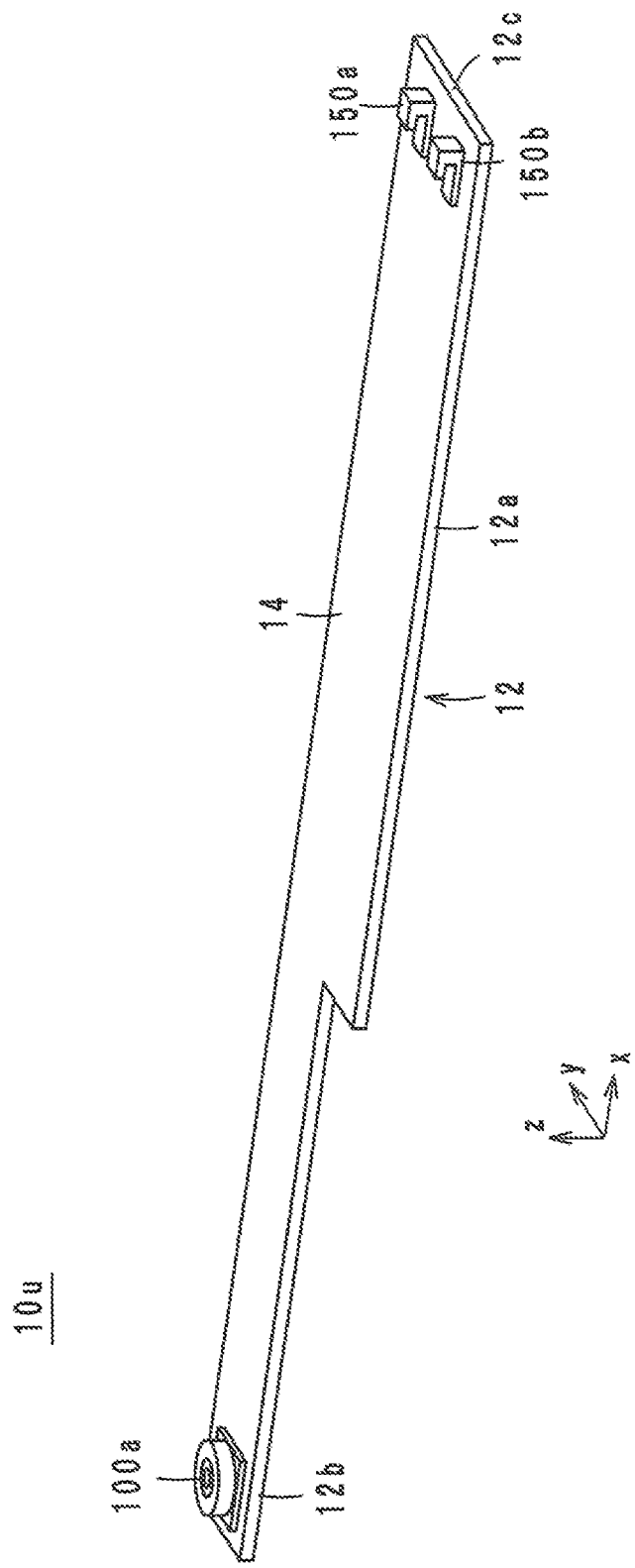
FIG. 42 is an external perspective view of a high-frequency signal transmission line according to a seventeenth modification of the second preferred embodiment of the present invention.
Figure 43:
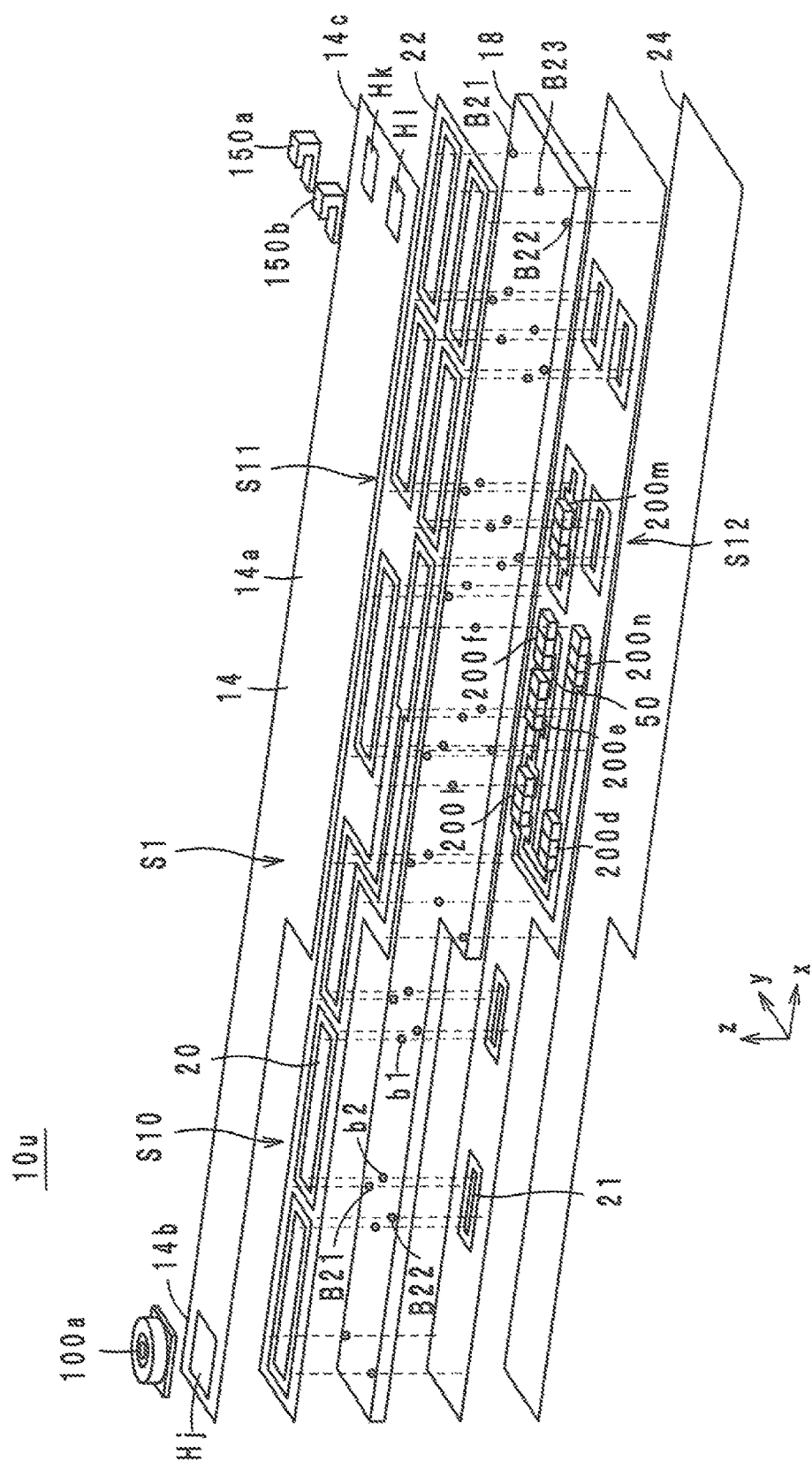
FIG. 43 is an exploded perspective view of the high-frequency signal transmission line according to the seventeenth modification of the second preferred embodiment of the present invention.
Figure 44:
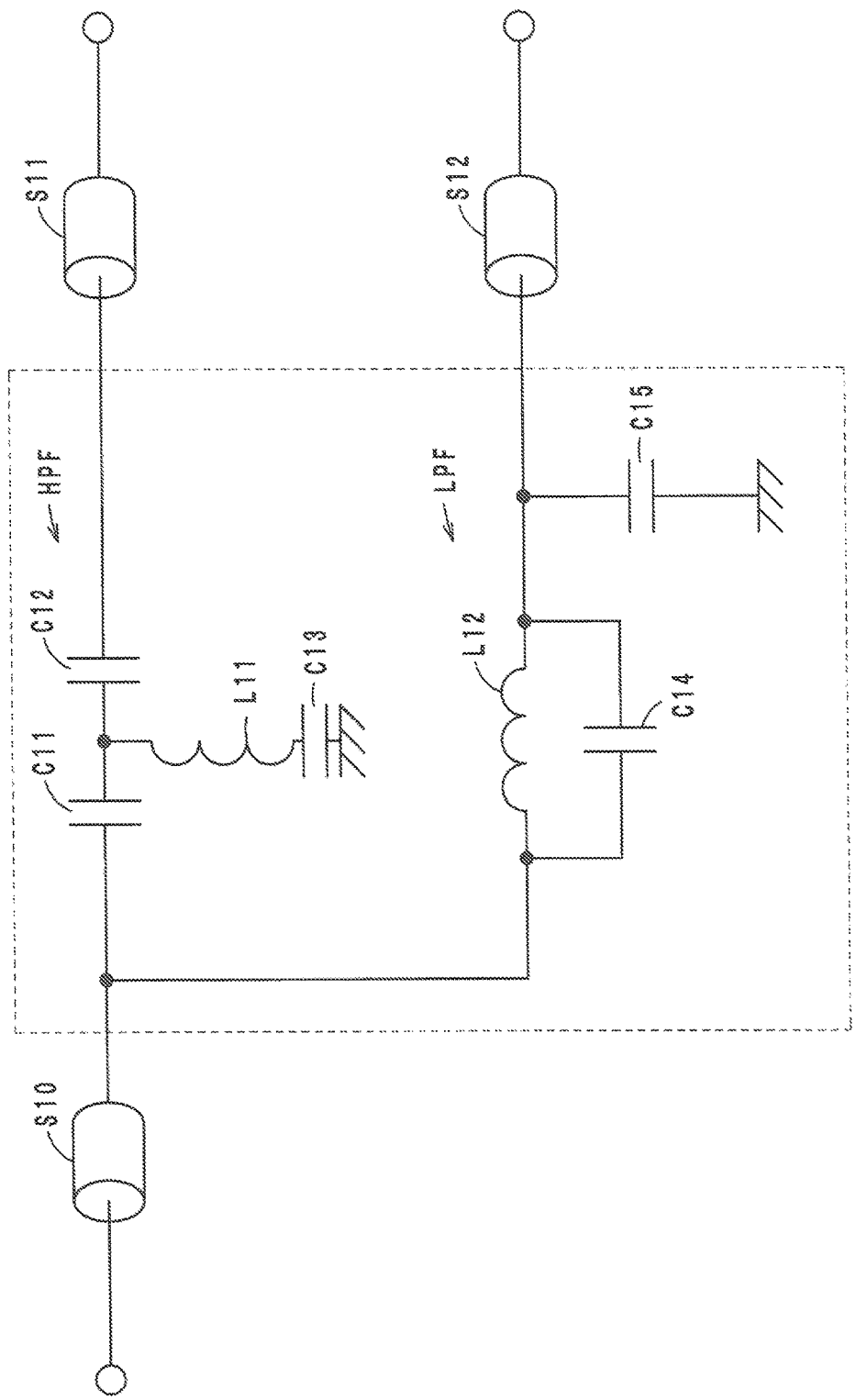
FIG. 44 is an equivalent circuit diagram of the high-frequency signal transmission line according to the seventeenth modification of the second preferred embodiment of the present invention.

Hereinafter, a high-frequency signal transmission line 10u according to a seventeenth modification of the second preferred embodiment of the present invention will be described with reference to drawings. FIG. 42 is an external perspective view of the high-frequency signal transmission line 10u according to the seventeenth modification. FIG. 43 is an exploded perspective view of the high-frequency signal transmission line 10u according to the seventeenth modification. FIG. 44 is an equivalent circuit diagram of the high-frequency signal transmission line 10u according to the seventeenth modification.

The high-frequency signal transmission line 10u extends in the x axis direction as illustrated in FIG. 42. The signal line S1 of the high-frequency signal transmission line 10u includes, as illustrated in FIG. 43, signal lines S10, S11, and S12.

The signal lines S10, S11, and S12 extend in the x axis direction. Note that the signal lines S10, S11, and S12 preferably include, in the same way as with the signal line S1 of the high-frequency signal transmission line 10, the line portions 20 and 21 and via hole conductors b1 and b2.

The end portion on the positive direction side in the x axis direction of the signal line S10, the end portion on the negative direction side in the x axis direction of the signal line S11, and the end portion on the negative direction side in the x axis direction of the signal line S12 are connected. The signal lines S11 and S12 mutually extend in parallel.

A connector 100a is connected to the end portion on the negative direction side in the x axis direction of the signal line S10. Note that connection between the connector 100a of the high-frequency signal transmission line 10u and the signal line S10 is the same as connection between the connector 100a of the high-frequency signal transmission line 10 and the signal line S1, and accordingly, description will be omitted.

An antenna terminal 150a is connected to the end portion on the positive direction side in the x axis direction of the signal line S11. Specifically, the antenna terminal 150a is mounted on the end portion on the positive direction side in the x axis direction of the line portion 20 provided the farthest on the positive direction side in the x axis direction in the signal line S11. An opening Hk is provided to the protection layer 14, and accordingly, the antenna terminal 150a is externally exposed. The antenna terminal 150a preferably is a terminal to be connected to an antenna of a wireless communication terminal in which the high-frequency signal transmission line 10u is included.

An antenna terminal 150b is connected to the end portion on the positive direction side in the x axis direction of the signal line S12. Specifically, the antenna terminal 150b is mounted on the end portion on the positive direction side in the x axis direction of the line portion 20 provided the farthest on the positive direction side in the x axis direction in the signal line S12. An opening Hl is provided to the protection layer 14, and accordingly, the antenna terminal 150b is externally exposed. The antenna terminal 150b preferably is a terminal to be connected to an antenna of a wireless communication terminal in which the high-frequency signal transmission line 10u is included. The antenna to be connected to the antenna terminal 150a and the antenna to be connected to the antenna terminal 150b are different antennas. The antenna to be connected to the antenna terminal 150a receives a relatively high-frequency signal, and the antenna to be connected to the antenna terminal 150b receives a relatively low-frequency signal.

Also, the high-frequency signal transmission line 10u includes electronic components 200d, 200e, 200f, 200l, 200m, and 200n and a connection conductor 50. The electronic components 200e, 200f, 200l, and 200m, and connection conductor 50 define a high-pass filter HPF in FIG. 44 at the signal line S11. The electronic components 200d and 200n define a low-pass filter LPF having a lower frequency pass band than the high-pass filter HPF in FIG. 44 at the signal line S12. The low-pass filter LPF and high-pass filter HPF define a diplexer. The diplexer prevents a signal of the signal line S11 from entering the signal line S12, and also prevents a signal of the signal line S12 from entering the signal line S11.

The electronic component 200d is a capacitor C14 in FIG. 44, and is provided onto the rear surface of the dielectric sheet 18a. The electronic component 200e is a coil L11 in FIG. 44, and is provided onto the rear surface of the dielectric sheet 18a. The electronic component 200f is a capacitor C13 in FIG. 43, and is provided onto the rear surface of the dielectric sheet 18a. The electronic components 200d, 200e, and 200f in the high-frequency signal transmission line 10u preferably are the same or substantially the same as the electronic components 200d, 200e, and 200f in the high-frequency signal transmission lines 10j and 10k, and accordingly, description will be omitted.

Also, the electronic component 200l is a capacitor C11 in FIG. 44, and is provided onto the rear surface of the dielectric sheet 18a. The electronic component 200l is serially connected in the middle of the line portion 21 at the signal line S11. The electronic component 200m is a capacitor C12 in FIG. 44, and is provided onto the rear surface of the dielectric sheet 18a. The electronic component 200m is serially connected in the middle of the line portion 21 at the signal line S11. Thus, as illustrated in FIG. 44, with the signal line S11, the capacitors C11 and C12 are serially connected. Also, with signal line S11, the coil L11 and capacitor C13 are serially connected between the ground and connection between the capacitors C11 and C12.

Also, the electronic component 200n is a capacitor C15 in FIG. 44, and is provided onto the rear surface of the dielectric sheet 18a. The electronic component 200n is connected between the line portion 21 and the ground conductor 25 at the signal line S12. More specifically, one external electrode of the electronic component 200n is connected to the end portion on the positive direction side in the x axis direction of the line portion 21, and the other external electrode of the electronic component 200n is connected to the ground conductor 25. Thus, the capacitor C15 is serially connected between the signal line S12 and the ground.

The high-frequency signal transmission line 10u thus configured is preferably used for connection between the two antennas of the wireless communication terminal and a transmission/reception circuit board. Thus, the high-frequency signal transmission line 10u may transmit two types of different frequency bands.

Also, the high-frequency signal transmission line 10u houses the diplexer. Therefore, according to the high-frequency signal transmission line 10u, a space in which the diplexer is provided does not have to be provided near the transmission/reception circuit and antennas. As a result thereof, reduction in the size of the wireless communication terminal is realized.

Note that, the high-pass filter HPF preferably includes the electronic components 200e, 200f, 200l, and 200m provided onto the rear surface of the dielectric sheet 18a, but may preferably include the electronic components provided onto the surface of the dielectric sheet 18a, or may be made up of the electronic components provided onto the surface of the dielectric sheet 18a and the electronic components provided onto the rear surface of the dielectric sheet 18a.

Also, the low-pass filter LPF preferably includes the electronic components 200d and 200n provided onto the rear surface of the dielectric sheet 18a, but may preferably include the electronic components provided onto the surface of the dielectric sheet 18a, or may preferably include the electronic components provided onto the surface of the dielectric sheet 18a and the electronic components provided onto the rear surface of the dielectric sheet 18a.

Figure 45:
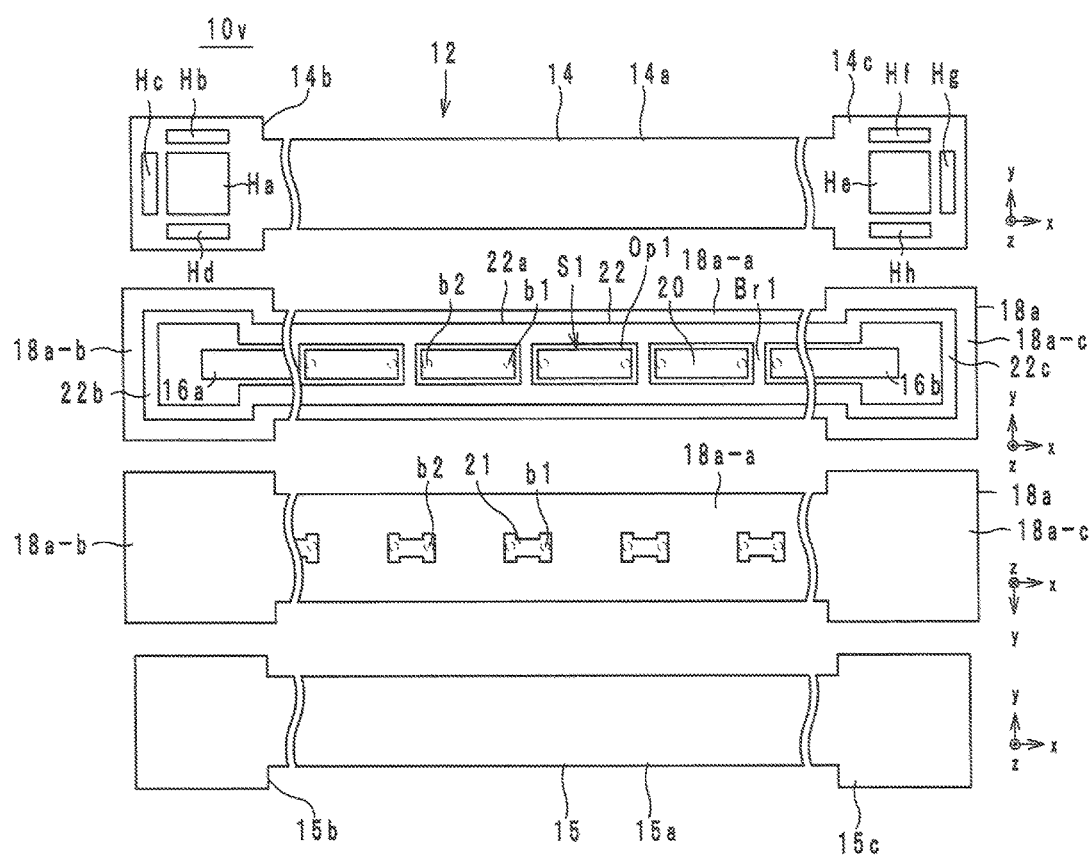
FIG. 45 is an exploded view of a high-frequency signal transmission line according to an eighteenth modification of the second preferred embodiment of the present invention.

Hereinafter, a high-frequency signal transmission line 10v according to an eighteenth modification of the second preferred embodiment of the present invention will be described with reference to a drawing. FIG. 45 is an exploded view of the high-frequency signal transmission line 10v according to the eighteenth modification.

The high-frequency signal transmission line 10v differs from the high-frequency signal transmission line 10d in that neither the ground conductor 25 nor via hole conductors B21 and B22 are provided.

According to the high-frequency signal transmission line 10v, the line portion 21 is overlaid with the ground conductor 22 in planar view from the z axis direction, and accordingly, capacitance is generated between the ground conductor 22. On the other hand, no ground conductor 25 is provided, and accordingly, the line portion 20 does not face a ground conductor. Thus, the property impedance of the line portion 21 becomes lower than the property impedance of the line portion 20. Thus, the property impedance Z1 of the line portion 20 differs from the property impedance Z2 of the line portion 21. Specifically, the property impedance Z1 becomes higher than the property impedance Z2. Accordingly, the property impedance of the signal line S1 periodically fluctuates between the property impedance Z1 and the property impedance Z2. As a result thereof, with the signal line S1, standing waves having short wavelengths (i.e., high-frequency) occur at the line portions 20 and 21. On the other hand, less standing waves having long wavelengths (i.e., low-frequency) occur between the external electrodes 16a and 16b. According to the above, with the high-frequency signal transmission line 10v, occurrence of low-frequency noise is significantly reduced and prevented.

Also, with the high-frequency signal transmission line 10v, occurrence of low-frequency noise is significantly reduced and prevented, and accordingly, an increase in the radiation amount of noise is prevented even when the ground conductor 25 is not provided. Further, the ground conductor 25 is not provided, and accordingly, the high-frequency signal transmission line 10v may readily be bent.

OTHER PREFERRED EMBODIMENTS

The high-frequency signal transmission line according to the present invention is not restricted to the high-frequency signal transmission lines 10, and 10a to 10v according to the above-mentioned preferred embodiments, and modifications thereof, and may be changed in a range without departing from the essence thereof.

Note that the configurations of the high-frequency signal transmission lines 10, and 10a to 10v may be combined.

Also, as for connection between the high-frequency signal transmission lines 10, and 10a to 10v and the circuit board or the like, configurations other than the connectors 100a and 100b may be used. Examples of configurations other than the connectors 100a and 100b include a connector for a flat cable and anisotropic electroconductive adhesives.

Also, the ground conductor 22 is not restricted to having a ladder shape in planar view from the z axis direction. Preferably the ground conductor 22 is overlaid with the line portion 21 in planar view from the z axis direction, and includes at least the bridge portions Br1.

Also, the ground conductor 25 is not restricted to having a ladder shape in planar view from the z axis direction. The ground conductor 25 preferably is overlaid with the line portion 20 in planar view from the z axis direction, and includes at least the bridge portions Br2.

Also, with the high-frequency signal transmission line 10, the ground conductor 22 does not have to be provided onto the surface of the dielectric sheet 18a to which the line portion 20 is provided. As for a dielectric sheet 18 provided to the line portion 20, the ground conductor 22 may be provided to the dielectric sheet positioned on the opposite side of a dielectric sheet 18 where the line portion 21 is provided. Specifically, an arrangement may be made wherein, with the high-frequency signal transmission line 10, a dielectric sheet 18 of another layer is provided on the positive direction side in the z axis direction of the dielectric sheet 18a, and the ground conductor 22 is provided onto the surface of this direction sheet 18.

Also, the protection layers 14 and 15 do not have to be provided.

Also, with the high-frequency signal transmission line 10, the ground conductor 24 does not have to be provided onto the surface of the dielectric sheet 18c. The ground conductor 24 may be provided to a surface positioned on the opposite side of the surface of a dielectric sheet 18 to which the line portion 20 is provided relative to the surface of a dielectric sheet 18 to which the line portion 21 is provided. Accordingly, with the high-frequency signal transmission line 10, the ground conductor 24 may be provided to the rear surface of the dielectric sheet 18b.

Note that the high-frequency signal transmission lines 10 and 10a to 10v may be used as a high-frequency signal transmission line in an RF circuit board such as an antenna front-end module or other suitable module or device, for example.

Preferred embodiments of the present invention are advantageous regarding a high-frequency signal transmission line and an electronic apparatus including the same, and are particularly advantageous in that occurrence of low frequency noise is significantly reduced and prevented.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high-frequency signal transmission line comprising:
a body including insulating layers stacked on one another;
a signal line provided over at least two layers; and
a ground conductor; wherein
the signal line includes a first line portion on a first layer of the at least two layers, a second line portion, and a third line portion on a second layer of the at least two layers;
a first end of the first line portion, a first end of the second line portion, and a first end of the third line portion are connected to one another;
the ground conductor is provided on the second layer;
a connector is connected to a second end of the first line portion;
the connector connects a circuit located outside of the high-frequency signal transmission line to the first line portion;
a first antenna is electrically connected to a second end of the second line portion;
a second antenna is electrically connected to a second end of the third line portion;
a first filter is provided at the second line portion;
a second filter having a pass band lower than a pass band of the first filter is provided at the third line portion;
the body has flexibility;
the body is bent;
at least a portion of the first filter or at least a portion of the second filter includes an electronic component; and
the electronic component is a capacitor that is disposed on the second layer and is connected between the second line portion and the ground conductor or between the third line portion and the ground conductor.

2. The high-frequency signal transmission line according to claim 1 wherein the first filter is a high-pass filter, and the second filter is a low-pass filter.

3. The high-frequency signal transmission line according to claim 1, wherein at least a portion of the first filter and at least a portion of the second filter each include an electronic component.

4. The high-frequency signal transmission line according to claim 1, wherein
at least a portion of the first filter and at least a portion of the second filter each include the electronic component; and
the electronic component is provided in the body.

5. An electronic apparatus comprising:
a casing; and
a high-frequency signal transmission line provided within the casing, the high-frequency signal transmission line including:
a body including insulating layers stacked on one another;
a signal line provided over at least two layers; and
a ground conductor; wherein
the signal line includes a first line portion on a first layer of the at least two layers, a second line portion, and a third line portion on a second layer of the at least two layers;
a first end of the first line portion, a first end of the second line portion, and a first end of the third line portion are connected to one another;
the ground conductor is provided on the second layer;
a connector is connected to a second end of the first line portion;
the connector connects a circuit located outside of the high-frequency signal transmission line to the first line portion;
a first antenna is electrically connected to a second end of the second line portion;
a second antenna is electrically connected to a second end of the third line portion;
a first filter is provided at the second line portion;
a second filter having a pass band lower than a pass band of the first filter is provided at the third line portion;
the body has flexibility;
the body is bent;
at least a portion of the first filter or at least a portion of the second filter includes an electronic component; and
the electronic component is a capacitor that is disposed on the second layer and is connected between the second line portion and the ground conductor or between the third line portion and the ground conductor.

6. A high-frequency signal transmission line comprising:
a signal line provided over at least two layers; and
a ground conductor; wherein
the signal line includes a first line portion on a first layer of the at least two layers, a second line portion on the first layer, and a third line portion on a second layer of the at least two layers;

a first end of the first line portion, a first end of the second line portion, and a first end of the third line portion are electrically connected to one another;

the ground conductor is provided on the first layer or the second layer;

a connector, to be connected to a circuit located outside of the high-frequency signal transmission line, is connected to a second end of the first line portion;

a first antenna terminal is electrically connected to a second end of the second line portion;

a second antenna terminal is electrically connected to a second end of the third line portion;

a first filter is provided at the second line portion;

a second filter is provided at the third line portion;

at least a portion of the first filter or at least a portion of the second filter includes an electronic component; and the electronic component is a capacitor that is disposed on the first layer or the second layer and is connected between the second line portion and the ground conductor or between the third line portion and the ground conductor.

* * * * *